United States Patent
Yang et al.

(10) Patent No.: US 12,046,701 B2
(45) Date of Patent: Jul. 23, 2024

(54) DISPLAY DEVICE

(71) Applicant: Samsung Display Co., Ltd., Yongin-si (KR)

(72) Inventors: Eun A Yang, Yongin-si (KR); Han Su Kim, Seoul (KR); Jong Hyuk Kang, Suwon-si (KR); Hee Keun Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 498 days.

(21) Appl. No.: 17/347,286

(22) Filed: Jun. 14, 2021

(65) Prior Publication Data

US 2022/0005975 A1    Jan. 6, 2022

(30) Foreign Application Priority Data

Jul. 1, 2020  (KR) .................. 10-2020-0080972

(51) Int. Cl.
*H01L 33/38* (2010.01)
*H01L 27/15* (2006.01)
*H01L 33/44* (2010.01)

(52) U.S. Cl.
CPC ............ *H01L 33/38* (2013.01); *H01L 27/156* (2013.01); *H01L 33/44* (2013.01)

(58) Field of Classification Search
None
See application file for complete search history.

(56) References Cited

U.S. PATENT DOCUMENTS

| | | | |
|---|---|---|---|
| 2011/0089850 A1 | 4/2011 | Shibata et al. | |
| 2011/0254043 A1 | 10/2011 | Negishi et al. | |
| 2014/0145237 A1 | 5/2014 | Do et al. | |
| 2018/0138157 A1* | 5/2018 | Im .................. | H01L 25/0753 |

FOREIGN PATENT DOCUMENTS

| | | |
|---|---|---|
| KR | 10-2012-0122159 A | 11/2012 |
| KR | 10-2015-0006798 A | 1/2015 |
| KR | 10-2020-0016424 A | 2/2020 |
| WO | WO 2020/013386 A1 | 1/2020 |
| WO | WO 2020/213822 A1 | 10/2020 |

* cited by examiner

*Primary Examiner* — Evren Seven
*Assistant Examiner* — Cole Leon Lindsey
(74) *Attorney, Agent, or Firm* — Lewis Roca Rothgerber Christie LLP

(57) ABSTRACT

A display device includes a substrate and a pixel on the substrate. The pixel has an alignment area, and the alignment area has a first alignment area, a second alignment area spaced apart from the first alignment area in a first direction, and a non-alignment area extending around a periphery of the alignment area. The pixel includes: a first electrode and a second electrode extending in the first direction across the alignment area and being spaced apart from each other; a first bank in the non-alignment area and extending along a boundary of the pixel; an alignment control layer including a first alignment control pattern, the first alignment control pattern being spaced apart from the first bank in the non-alignment area between the first alignment area and the second alignment area; and a first light emitting element between the first electrode and the second electrode in the first alignment area.

20 Claims, 28 Drawing Sheets

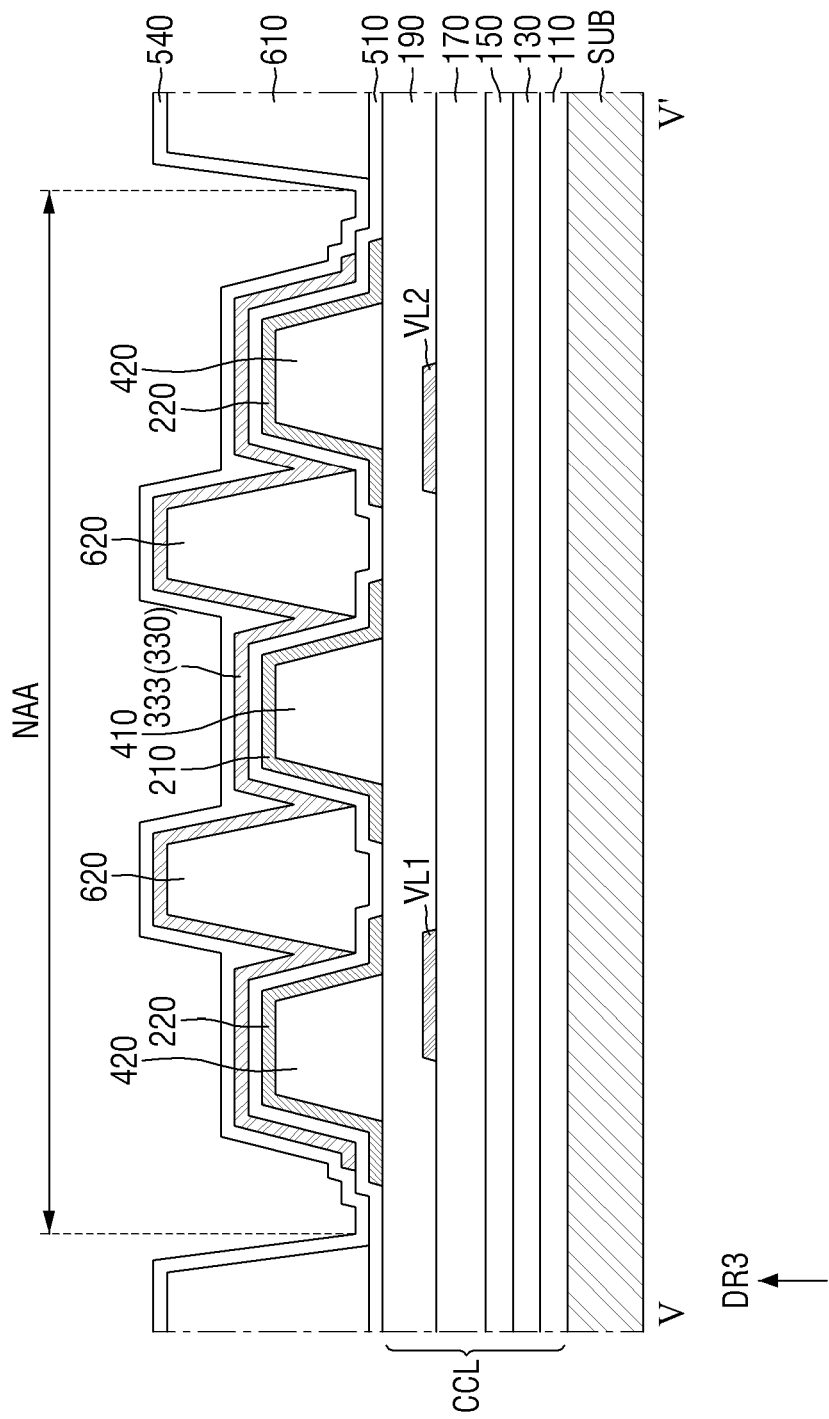

DISPLAY DEVICE

CROSS-REFERENCE TO RELATED APPLICATION

This application claims priority to and the benefit of Korean Patent Application No. 10-2020-0080972, filed on Jul. 1, 2020, in the Korean Intellectual Property Office, the entire disclosure of which is incorporated herein by reference.

BACKGROUND

1. Field

Aspects of embodiments of the present disclosure relate to a display device.

2. Description of the Related Art

Display devices are becoming increasingly important with the development of multimedia. Accordingly, various types (or kinds) of display devices, such as organic light emitting displays and liquid crystal displays, are being used.

A display device is a device for displaying (or configured to display) an image and generally includes a display panel, such as an organic light emitting display panel or a liquid crystal display panel. When the display panel is a light emitting display panel (e.g., a self-emissive display panel), it includes light emitting elements, such as light emitting diodes (LEDs), for example, organic light emitting diodes (OLEDs) using (or including) an organic material as a fluorescent material or inorganic LEDs using (or including) an inorganic material as the fluorescent material.

SUMMARY

Embodiments of the present disclosure provide a display device in which an alignment control pattern is disposed between a first electrode and a second electrode in a non-alignment area to prevent light emitting elements from being disposed in the non-alignment area, thus, reducing the number of light emitting elements that are disposed (and lost) in the non-alignment area.

Embodiments of the present disclosure also provide a display device in which an alignment control pattern and a first bank disposed in a non-alignment area are spaced apart from each other to form an ink impact area such that a plurality of alignment areas are connected to each other, thereby making it relatively easy to control an ink impact position in an inkjet process.

However, aspects and features of the present disclosure are not restricted to those set forth herein. The above and other aspects and features of the present disclosure will become more apparent to one of ordinary skill in the art to which the present disclosure pertains by referencing the detailed description of the present disclosure given below.

According to an embodiment of the present disclosure, a display device includes a substrate and a pixel on the substrate. The pixel has an alignment area, and the alignment area has a first alignment area, a second alignment area spaced apart from the first alignment area in a first direction, and a non-alignment area extending around a periphery of the alignment area. The pixel includes: a first electrode and a second electrode extending in the first direction across the alignment area and being spaced apart from each other; a first bank in the non-alignment area and extending along a boundary of the pixel; an alignment control layer including a first alignment control pattern, the first alignment control pattern being spaced apart from the first bank in the non-alignment area between the first alignment area and the second alignment area; and a first light emitting element between the first electrode and the second electrode in the first alignment area.

The display device may further include: a first contact electrode on the first electrode in the first alignment area and contacting a first end of the first light emitting element; and a second contact electrode spaced apart from the first contact electrode. The second contact electrode may have a first area on the second electrode in the first alignment area and contacting a second end of the first light emitting element, a second area on the first electrode in the second alignment area, and a third area in the non-alignment area to connect the first area of the second contact electrode and the second area of the second contact electrode.

The display device may further include: a second light emitting element between the first electrode and the second electrode in the second alignment area; and a third contact electrode having a first area on the second electrode in the second alignment area. The third contact electrode may be spaced apart from the first and second contact electrodes, the second area of the second contact electrode may contact a first end of the second light emitting element, and the first area of the third contact electrode may contact a second end of the second light emitting element.

The first light emitting element and the second light emitting element may be connected to each other in series.

The display device may further include: a third light emitting element; and a fourth contact electrode. The alignment area may have a third alignment area spaced apart from the second alignment area in the first direction, the third light emitting element may be between the first electrode and the second electrode in the third alignment area, the fourth contact electrode may be on the second electrode in the third alignment area, and the fourth contact electrode may be spaced apart from the first through third contact electrodes.

The third contact electrode may have a second area on the first electrode in the third alignment area and a third area in the non-alignment area to connect the first area of the third contact electrode and the second area of the third contact electrode. The second area of the third contact electrode may contact a first end of the third light emitting element, and the fourth contact electrode may contact a second end of the third light emitting element.

The first through third light emitting elements may be connected to each other in series.

The alignment control layer may further include a second alignment control pattern in the non-alignment area between the second alignment area and the third alignment area. The second alignment control pattern may be spaced apart from the first bank.

A part of the third area of the second contact electrode may overlap the first alignment control pattern in a thickness direction of the substrate.

The first alignment control pattern may be between the first electrode and the second electrode.

Each of the first bank and the alignment control layer may include a hydrophobic material.

The first bank and the alignment control layer may include the same material.

According to an embodiment of the present disclosure, a display device includes: a pixel having a plurality of alignment areas spaced apart from each other in a first direction and a non-alignment area other than the alignment areas; a plurality of electrodes extending in the first direction in the pixel and being spaced apart from each other; a plurality of light emitting elements between the electrodes such that at least one end of each of the light emitting elements lies on any one of the electrodes in each of the alignment areas; a first bank in the non-alignment area along a boundary of the pixel; and a plurality of alignment control patterns spaced apart from the first bank in the non-alignment area between the alignment areas. The alignment control patterns are spaced apart from each other, and at least a part of each of the alignment control patterns overlaps an area between the electrodes in a thickness direction.

Each of the first bank and the alignment control patterns may include a hydrophobic material.

The display device may further include an insulating layer on the light emitting elements in each of the alignment areas and exposes both ends of each of the light emitting elements. The insulating layer and the alignment control patterns may be spaced apart from each other.

According to an embodiment of the present disclosure, a display device includes: a substrate; a pixel having an alignment area and a non-alignment area extending around a periphery of the alignment area, the alignment area having first and second alignment areas spaced apart from each other; a first electrode on the substrate; a second electrode on the substrate and spaced apart from the first electrode; a first bank in the non-alignment area along a boundary of the pixel; an alignment control pattern on the substrate and between the first electrode and the second electrode in the non-alignment area between the first alignment area and the second alignment area, the alignment control pattern being spaced apart from the first bank; and light emitting elements. The light emitting elements include a plurality of first light emitting elements between the first electrode and the second electrode in the first alignment area and a plurality of second light emitting elements between the first electrode and the second electrode in the second alignment area.

A height from a surface of the substrate to an upper surface of the first bank may be greater than or equal to a height from the surface of the substrate to an upper surface of the alignment control pattern.

A width of the alignment control pattern may be greater than a length of each light emitting element.

The display device may further include: a first contact electrode contacting first ends of the first light emitting elements; a second contact electrode contacting second ends of the first light emitting elements and first ends of the second light emitting elements; and a third contact electrode contacting second ends of the second light emitting elements. The first through third contact electrodes may be spaced apart from each other, and the second contact electrode may connect the first light emitting elements and the second light emitting elements to each other in series.

The second contact electrode may have a first area in the first alignment area and contacting the second ends of the first light emitting elements, a second area in the second alignment area and contacting the first ends of the second light emitting elements, and a third area in the non-alignment area between the first and second alignment areas and connecting the first area of the second contact electrode and the second area of the second contact electrode.

In a display device according to an embodiment, an alignment control pattern is arranged between a first electrode and a second electrode in a non-alignment area to prevent (or substantially prevent) light emitting elements from being aligned in the non-alignment area and, thus, to reduce the number of light emitting elements that are disposed and lost in the non-alignment area.

In a display device according to an embodiment, an alignment control pattern and a first bank in a non-alignment area are spaced apart from each other to form an ink impact area such that a plurality of alignment areas are connected to each other. This makes it relatively easy to control an ink impact position during an inkjet process, thereby increasing the manufacturing process efficiency of the inkjet process during a manufacturing process of the display device.

However, the aspects and features of the present disclosure are not restricted to those set forth herein. The above and other aspects and features of the present disclosure will become more apparent to one of ordinary skill in the art to which the present disclosure pertains by referencing the following description and the claims.

BRIEF DESCRIPTION OF THE DRAWINGS

These and/or other aspects and features of the present disclosure will become apparent and more readily appreciated from the following description of embodiments, taken in conjunction with the accompanying drawings, in which:

FIG. 5 is a cross-sectional view taken along the line V-V' of FIG. 3;

DETAILED DESCRIPTION

Figure 1:
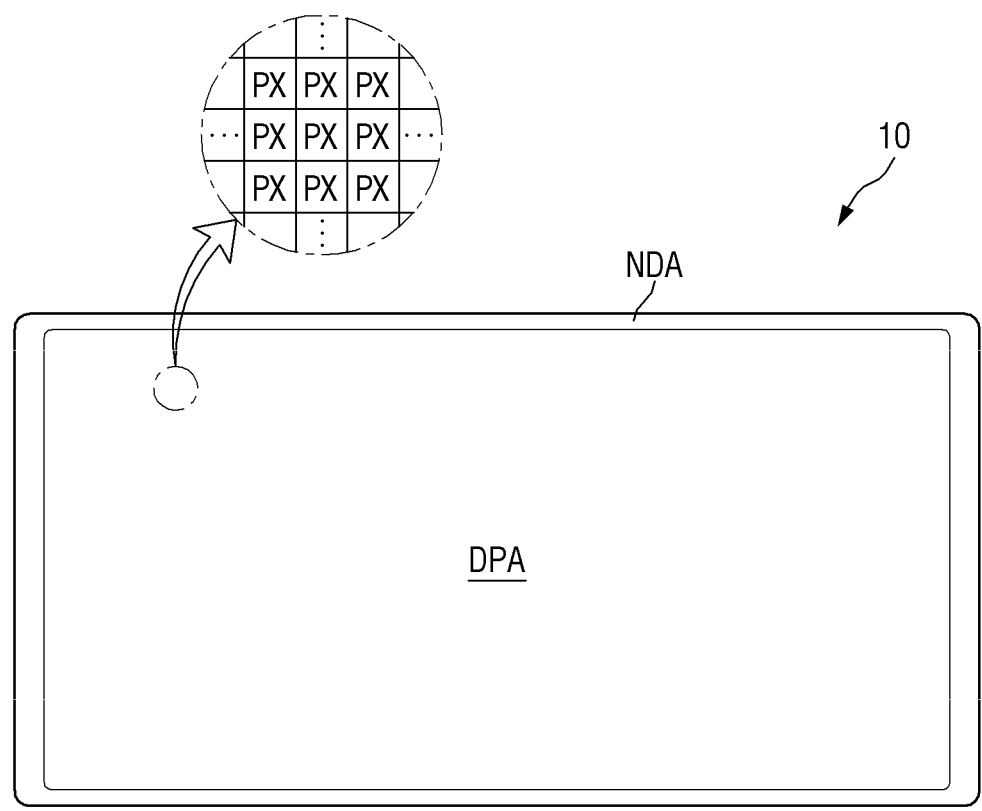
FIG. 1 is a schematic plan view of a display device according to an embodiment.

The present disclosure will now be described more fully hereinafter with reference to the accompanying drawings, in which example embodiments of the present disclosure are shown. The present disclosure may, however, be embodied in different forms and should not be construed as limited to the embodiments described herein. Rather, these embodiments are provided so that the present disclosure will be thorough and complete, and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments will be described with reference to the attached drawings.

FIG. 1 is a schematic plan view of a display device 10 according to an embodiment.

Referring to FIG. 1, the display device 10 displays (e.g., is configured to display) moving images and/or still images. The display device 10 may refer to any electronic device that includes a display screen. Examples of the display device 10 may include televisions, notebook computers, monitors, billboards, an Internet of things (IoT) device, mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, etc., each of which provides a display screen.

The display device 10 includes a display panel that includes a display screen. Examples of the display panel include an inorganic light emitting diode display panel, an organic light emitting display panel, a quantum dot light emitting display panel, a plasma display panel, and a field emission display panel. Herein, an example in which the display device 10 is an inorganic light emitting diode display panel is described below. The present disclosure, however, is not limited thereto, and other display panels can be applied as long as would be understood by one skilled in the art.

In the drawings, a first direction DR1, a second direction DR2, and a third direction DR3 are defined. The first direction DR1 and the second direction DR2 may be perpendicular to each other on a plane. The third direction DR3 may be perpendicular to (or normal to) the plane on which the first direction DR1 and the second direction DR2 lie. That is, the third direction DR3 is perpendicular to each of the first direction DR1 and the second direction DR2. As used herein, the third direction DR3 indicates a thickness direction of the display device 10.

The display device 10 may have a rectangular planar shape with long sides, which are longer in the first direction DR1 than in the second direction DR2, and short sides. Corners at where the long and short sides of the display device 10 meet may be right-angled in a plan view. However, the present disclosure is not limited thereto, and the corners may be rounded. Similarly, the display device 10 is not limited to the rectangular planar shape and may be any suitable shape. For example, the display device 10 may have other planar shapes, such as a square, a quadrangle with rounded corners (e.g., vertices), other polygons, and a circle.

A display surface of the display device 10 may be disposed on a first side thereof in the third direction DR3, which is the thickness direction. Unless otherwise mentioned, "above" as used herein indicates the first side in the third direction DR3 and a display direction and an "upper surface" indicates a surface facing the first side in the third direction DR3. In addition, "below" indicates a second side in the third direction DR3 and a direction opposite to the display direction, and a "lower surface" indicates a surface facing the second side in the third direction DR3. In addition, "left," "right," "upper," and "lower" indicate directions when the display device 10 is viewed in a plan view. For example, "right" indicates a first side in the first direction DR1, "left" indicates a second side in the first direction DR1, "upper" indicates a first side in the second direction DR2, and "lower" indicates a second side in the second direction DR2.

The display device 10 may include a display area DPA and a non-display area NDA. The display area DPA may be an area where a screen is provided (e.g., where an image is displayed), and the non-display area NDA may be an area where no screen is provided (e.g., where no image is displayed). The display area DPA may be referred to as an active area, and the non-display area NDA may be referred to as an inactive area.

The shape of the display area DPA may correspond to (e.g., may follow) the shape of the display device 10. For example, the display area DPA may have a rectangular planar shape similar to the overall shape of the display device 10. The display area DPA may generally occupy the center of the display device 10.

The display area DPA may include a plurality of pixels PX. The pixels PX may be arranged in a matrix. Each of the pixels PX may have a rectangular or square shape in a plan view. However, the present disclosure is not limited thereto, and each of the pixels PX may have a rhombic planar shape having each side inclined with respect to a direction (e.g., with respect to the first and/or second directions DR1 and DR2). The pixels PX may be alternately arranged in a stripe or Pentile® (a registered trademark of Samsung Display Co., Ltd. of the Republic of Korea) arrangement.

The non-display area NDA may be disposed around (e.g., may extend around) the display area DPA. The non-display area NDA may entirely or partially surround the display area DPA. In an exemplary embodiment, the display area DPA may be rectangular, and the non-display area NDA may be disposed adjacent to (e.g., may extend around) the four sides of the display area DPA. The non-display area NDA may form a bezel of the display device 10. In the non-display area NDA, wirings and circuit drivers included in the display device 10 and/or a pad (e.g., a pad part) on which an external device is mounted may be disposed.

Figure 2:
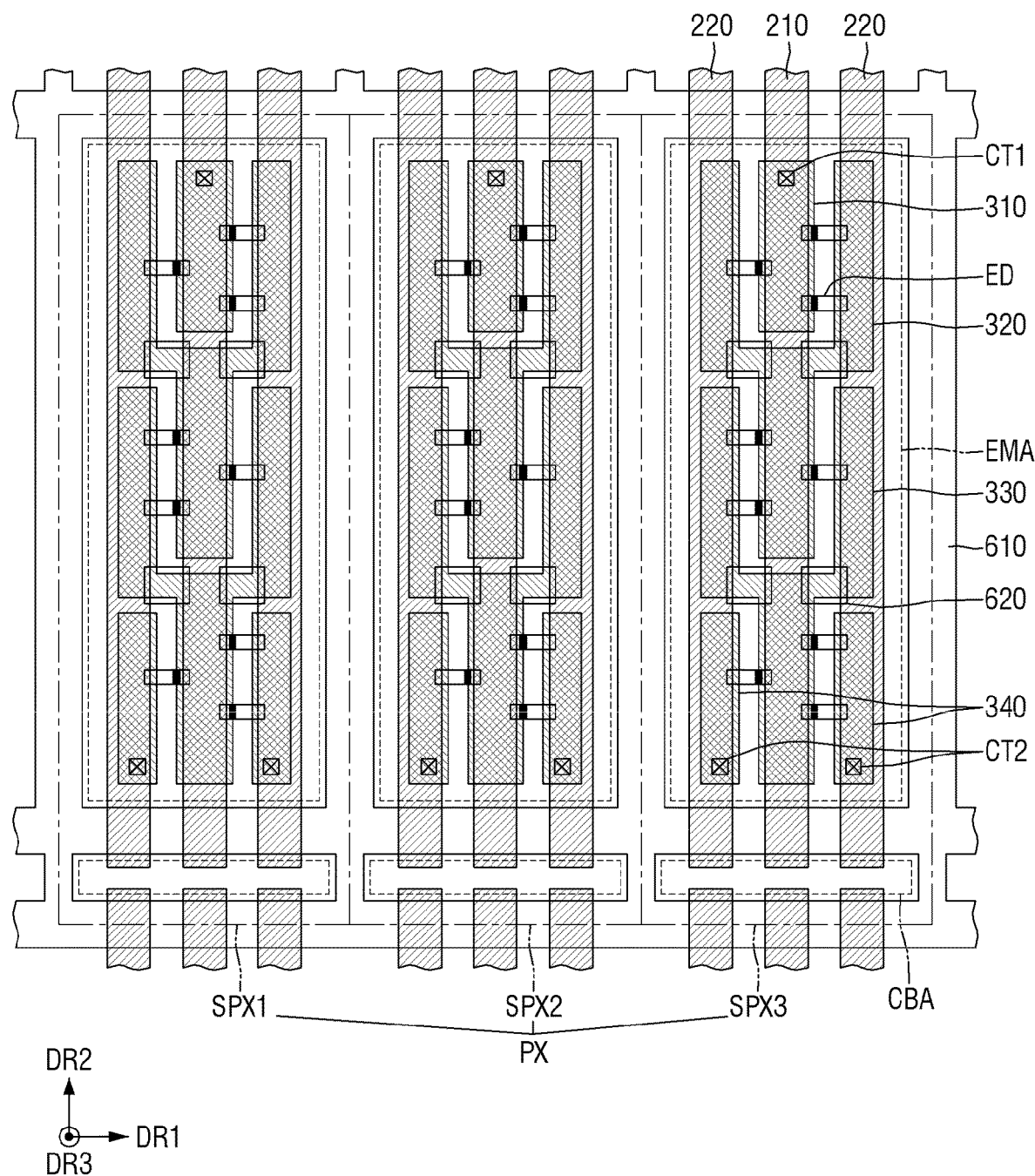
FIG. 2 is a plan layout view of a pixel of the display device shown in FIG. 1.
Figure 3:
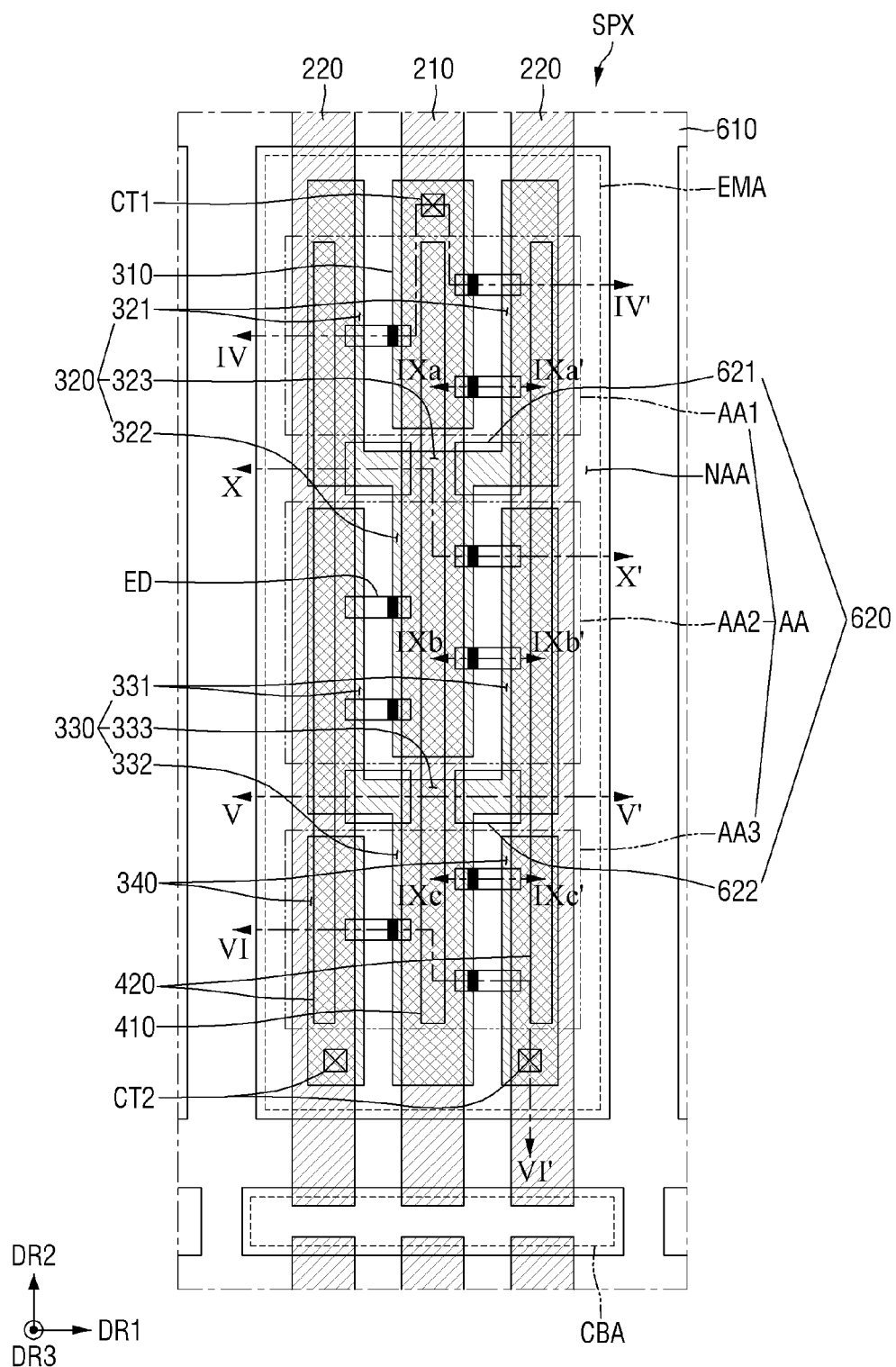
FIG. 3 is a plan layout view of a subpixel of the display device shown in FIG. 2.

FIG. 2 is a plan layout view of a pixel PX of the display device 10 according to an embodiment, and FIG. 3 is a plan layout view of a subpixel SPX of a pixel PX of the display device 10 shown in FIG. 2.

Referring to FIG. 2, a pixel PX of the display device 10 may include a plurality of subpixels SPX (e.g., SPX1, SPX2, SPX3). In an embodiment, the pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. The first color may be blue, the second color may be green, and the third color may be red. However, the present disclosure is not limited thereto, and the subpixels SPX may emit light of the same color. Although an embodiment in which one pixel PX includes three subpixels SPX (SPX1 through SPX3) is illustrated in FIG. 2, the present disclosure is not limited thereto. For example, one pixel PX may include more than three subpixels SPX.

Referring to FIGS. 2 and 3, each subpixel SPX of the display device 10 may have an emission area EMA and a non-emission area. The emission area EMA may be an area from which light of a wavelength band (e.g., light in a specific wavelength band) emitted from light emitting elements ED, described in more detail below, is output, and the non-emission area may be an area from which no light is output. The non-emission area may include a cut area CBA.

The emission area EMA may be disposed at a center of the subpixel SPX in a plan view. The subpixel SPX of the display device 10 may include a plurality of light emitting elements ED, described in more detail below, and the emission area EMA may include an area where the light emitting elements ED are disposed and where light emitted from the light emitting elements ED is output to an area adjacent to the light emitting elements ED. The emission area EMA may have an area from which light emitted from the light emitting elements ED is output in the display direction DR3 of the display device 10 after being reflected or refracted by other members. For example, the light emitting elements ED may be disposed in each subpixel SPX, and an area where the light emitting elements ED are disposed and an area adjacent to this area may form the emission area EMA.

The emission area EMA may have an alignment area AA and a non-alignment area NAA. The alignment area AA may include a plurality of alignment areas AA1, AA2, AA3 spaced apart from each other, and the non-alignment area NAA may surround (or extend around a periphery of) the alignment areas AA. For example, the non-alignment area NAA may be an area other than the alignment area AA in the emission area EMA.

The alignment area AA may be an area where the light emitting elements ED are concentrated, and the non-alignment area NAA may be an area where the distribution of the light emitting elements ED is relatively low. Light emitted from the light emitting elements ED disposed in the alignment area AA reaches the non-alignment area NAA as well as the alignment area AA. Therefore, the emission area EMA may include the alignment area AA and the non-alignment area NAA.

The alignment area AA and the non-alignment area NAA may be areas distinguished according to the number, distribution, or density of the light emitting elements ED disposed per unit area. Shapes or positions of the alignment area AA and the non-alignment area NAA may be related to shapes or arrangement of a plurality of contact electrodes 310 through 340, a first bank 610, and alignment control patterns 620, described in more detail below.

The alignment area AA may include a plurality of alignment areas AA1, AA2, AA3 spaced apart from each other. The alignment areas AA1, AA2, AA3 may be spaced apart from each other along the second direction DR2.

The alignment area AA of each subpixel SPX may include a first alignment area AA1, a second alignment area AA2, and a third alignment area AA3. The first through third alignment areas AA1 through AA3 may be arranged along the second direction DR2. The first through third alignment areas AA1 through AA3 may be spaced apart from each other. Although an embodiment in which one subpixel SPX includes three alignment areas AA (AA1 through AA3) is illustrated in FIG. 3, the present disclosure is not limited thereto. For example, in other embodiments, one subpixel SPX may include two alignment areas or more than three alignment areas.

The light emitting elements ED disposed in the alignment areas AA spaced apart from each other may be connected to each other in series. For example, the light emitting elements ED disposed in the first alignment area AA1 may be connected to the light emitting elements ED disposed in the second alignment area AA2 in series. Similarly, the light emitting elements ED disposed in the second alignment area AA2 may be connected to the light emitting elements ED disposed in the third alignment area AA3 in series. The present disclosure, however, is not limited thereto, and the light emitting elements ED disposed in the same alignment area AA may be connected to each other in parallel, and the light emitting elements ED disposed in adjacent alignment areas AA may be connected to each other in series.

The non-alignment area NAA may surround (or extend around a periphery of) the first through third alignment areas AA1 through AA3. The non-alignment area NAA may include an area located between the first alignment area AA1 and the second alignment area AA2 and an area located between the second alignment area AA2 and the third alignment area AA3. The connection (e.g., the series connection) between the light emitting elements ED disposed in adjacent alignment areas AA may occur in (e.g., may be made in) the non-alignment area NAA located between the alignment areas AA.

The non-emission area may be an area at where the light emitting elements ED are not disposed and from which no light is output because light emitted from the light emitting elements ED does not reach the area.

The non-emission area may include the cut area CBA. The cut area CBA may be disposed below (e.g., a direction opposite to the second direction DR2) the emission area EMA in a plan view. The cut area CBA may be located between the emission areas EMA of subpixels SPX neighboring each other in the second direction DR2. A length of the cut area CBA in the first direction DR1 may be greater than a length of the emission area EMA in the first direction DR1. A length of the cut area CBA in the second direction DR2 may be smaller than a length of the emission area EMA in the second direction DR2. However, the present disclosure is not limited thereto, and the cut area CBA may have a different planar shape and size, for example, according to the shape of the first bank 610, to be described in more detail below.

A plurality of emission areas EMA and a plurality of cut areas CBA may be arranged in the display area DPA of the display device 10. For example, the emission areas EMA and the cut areas CBA may be repeatedly arranged along the first direction DR1 and may be alternately arranged along the second direction DR2.

The cut area CBA may be an area at where a plurality of electrodes 210 and 220 included in each subpixel SPX are separated from their counterparts disposed in a neighboring subpixel SPX in the second direction DR2. The electrodes 210 and 220 disposed in each subpixel SPX may be partially disposed in the cut area CBA. Each electrode 210 or 220 of a subpixel SPX may be separated from its counterpart disposed in a subpixel SPX adjacent to the subpixel SPX in the second direction DR2 in the cut area CBA.

Each subpixel SPX of the display device 10 may include the electrodes 210 and 220, the first bank 610, the light emitting elements ED, the contact electrodes 310 through 340, and one or more alignment control patterns 620. The display device 10 may further include second banks (or first and second sub banks 410 and 420).

The planar arrangement and shapes of the electrodes 210 and 220, the first bank 610, the light emitting elements ED, the contact electrodes 310 through 340, and the alignment control patterns 620 included in a subpixel SPX of the display device 10 will be described in more detail below with reference to FIGS. 2 and 3. The planar position and shape of each member will be briefly described below, and the connection relationship between the members will be described in more detail below with reference to other drawings.

The electrodes 210 and 220 may include a first electrode 210 and second electrodes 220. The first electrode 210 and the second electrodes 220 may extend in the second direction DR2 in a plan view and may be spaced apart from and may face each other in the first direction DR1.

The first electrode 210 may be disposed in the center of a subpixel SPX in a plan view. The first electrode 210 may extend in the second direction DR2 in each subpixel SPX. The first electrode 210 may be disposed over (or through) the first through third alignment areas AA1 through AA3 and the non-alignment area NAA located between the first through third alignment areas AA1 through AA3.

The second electrodes 220 may be disposed on a left side and a right side of a subpixel SPX in a plan view. The second electrodes 220 may extend in the second direction DR2 in each subpixel SPX. The second electrodes 220 may be spaced apart from the first electrode 210 to face the first electrode 210 in the first direction DR1. The second electrodes 220 may be disposed over (or through) the first through third alignment areas AA1 through AA3 and the non-alignment area NAA located between first through third alignment areas AA1 through AA3.

The first and second electrodes 210 and 220 may extend in the second direction DR2 in each subpixel SPX and may be separated from the first and second electrodes 210 and 220 included in a neighboring subpixel SPX in the second direction DR2 at the cut area CBA. The shapes of the first and second electrodes 210 and 220 may be formed by cutting (e.g., separating) each electrode 210 or 220 in the cut area CBA after placing (or arranging) the light emitting elements ED during a process of manufacturing the display device 10. However, the present disclosure is not limited thereto, and some electrodes 210 and 220 may extend to (e.g., may continuously extend to) a neighboring subpixel SPX in the second direction DR2 and be integrated with their counterparts in the neighboring subpixel SPX, or any one of the first and second electrodes 210 and 220 may be separated from its counterpart in the neighboring subpixel SPX.

In the drawings, one first electrode 210 and two second electrodes 220 are disposed in each subpixel SPX, and the first electrode 210 is disposed between the second electrodes 220. However, the present disclosure is not limited thereto. In some embodiments, the number of the first and second electrodes 210 and 220 disposed in each subpixel SPX may be increased, or only one first electrode 210 and one second electrode 220 may be provided. In addition, the first and second electrodes 210 and 220 disposed in each subpixel SPX may not necessarily extend in one direction and may be have in various structures. For example, the first and second electrodes 210 and 220 may be partially curved or bent, or any one electrode may surround (or extend around a periphery of) the other electrode. The first and second electrodes 210 and 220 can may have any suitable structure or shape as long as they are at least partially spaced apart to face each other so that an area at where the light emitting elements ED are to be disposed is formed between them.

The electrodes 210 and 220 may be electrically connected to the light emitting elements ED, and a voltage (e.g., a predetermined voltage) may be applied to each of the electrodes 210 and 220 so that the light emitting elements ED can emit light (e.g., causing the light emitting elements ED to emit light). For example, the electrodes 210 and 220 may be electrically connected to the light emitting elements ED disposed in the first through third alignment areas AA1 through AA3 through a first contact electrode 310 and fourth contact electrodes 340, described in more detail below, and may transmit received electrical signals to the light emitting elements ED through the contact electrodes 310 through 340.

In addition, the electrodes 210 and 220 may be utilized to form an electric field in a subpixel SPX to align the light emitting elements ED. The light emitting elements ED may be disposed between the first and second electrodes 210 and 220 by an electric field formed by (or between) the first and second electrodes 210 and 220. As will be described in more detail below, the light emitting elements ED may be sprayed (or deposited) onto the first and second electrodes 210 and 220 through an inkjet process in a state in which they are dispersed in an ink. When the ink, which includes the dispersed light emitting elements ED, is sprayed onto the first and second electrodes 210 and 220, alignment signals are transmitted to the first and second electrodes 210 and 220 to generate an electric field. The light emitting elements ED dispersed in the ink may be aligned between the first and second electrodes 210 and 220 by an electrophoretic force caused by the electric field generated between the first and second electrodes 210 and 220.

The first bank 610 may surround (e.g., may extend around a periphery of) the boundary of each subpixel SPX. The first bank 610 may include parts (or portions) extending in the first direction DR1 and the second direction DR2 in a plan view to form a lattice pattern over the entire display area DPA. The first bank 610 may be disposed at the boundary of each subpixel SPX to separate neighboring subpixels SPX.

The first bank 610 may surround (e.g., may extend around a periphery of) the emission area EMA and the cut area CBA disposed in a subpixel SPX to separate them from each other. The first electrode 210 and the second electrodes 220 may extend in the second direction DR2 to cross parts of the first bank 610 extending in the first direction DR1. A width, in the first direction DR1, of each part of the first bank 610 extending in the second direction DR2 may be different in each area. For example, of a part of the first bank 610 extending in the second direction DR2, a segment disposed between emission areas EMA adjacent to each other in the first direction DR1 may have a greater width than a segment disposed between cut areas CBA adjacent to each other in the first direction DR1. However, the present disclosure is not limited thereto.

The first bank 610 may prevent or substantially prevent ink from overflowing to adjacent subpixels SPX during an inkjet printing process during the manufacturing process of the display device 10. The first bank 610 may separate inks in which different light emitting elements ED are dispersed for different subpixels SPX so that the inks do not mix with each other. Even when each subpixel SPX includes the same light emitting elements ED, the first bank 610 may prevent or substantially prevent ink from overflowing to adjacent subpixels SPX during the inkjet printing process during the manufacturing process of the display device 10 to maintain a uniform number of light emitting elements ED in each subpixel SPX. The first bank 610 may include a hydrophobic material. The first bank 610 may include, as an example, polyimide (PI).

The alignment control patterns 620 may be disposed in the non-alignment area NAA. The alignment control patterns 620 may be disposed in the non-alignment area NAA located between the alignment areas AA. The alignment control patterns 620 may be disposed between the first and second electrodes 210 and 220 in the non-alignment area NAA located between the alignment areas AA. The alignment control patterns 620 may be disposed in the non-alignment area NAA and may be spaced apart from the first bank 610. The alignment control patterns 620 may not be disposed in the alignment areas AA.

The alignment control patterns 620 may include first alignment control patterns 621 and second alignment control patterns 622.

The first alignment control patterns 621 may be disposed in the non-alignment area NAA located between the first alignment area AA1 and the second alignment area AA2. For example, the first alignment control patterns 621 may be disposed between the first and second electrodes 210 and 220 in the non-alignment area NAA located between the first alignment area AA1 and the second alignment area AA2. The first alignment control patterns 621 may be disposed between the first and second electrodes 210 and 220 such that at least a part of each first alignment control pattern 621 overlaps (or is at) an area between the first and second electrodes 210 and 220 in the third direction DR3. The first alignment control patterns 621 may be disposed between the first and second electrodes 210 and 220, but at least a part of each first alignment control pattern 621 may overlap the first electrode 210 and/or a second electrode 220 in the third direction DR3.

One subpixel SPX may include at least one first alignment control pattern 621. When a plurality of first electrodes 210 and/or a plurality of second electrodes 220 are disposed in one subpixel SPX, the subpixel SPX may include a plurality of first alignment control patterns 621 disposed between the first electrodes 210 and the second electrodes 220, respectively. The first alignment control patterns 621 may be spaced apart from each other. For example, the first alignment control patterns 621 may be spaced apart from each other in the first direction DR1.

In an exemplary embodiment, when one first electrode 210 and two second electrodes 220 are disposed in one subpixel SPX, the subpixel SPX may include two first alignment control patterns 621 disposed between the one first electrode 210 and the two second electrodes 220, respectively. However, the present disclosure is not limited thereto, and the number of the first alignment control patterns 621 disposed in each subpixel SPX may be increased or decreased. In some embodiments, when one subpixel SPX includes one first electrode 210 and one second electrode 220, the subpixel SPX may include one first alignment control pattern 621 disposed between the first electrode 210 and the second electrode 220. In some embodiments, when one subpixel SPX includes a plurality of first electrodes 210 and a plurality of second electrodes 220 disposed between them, the subpixel SPX may include a plurality of first alignment control patterns 621 disposed between the first electrodes 210 and the second electrodes 220.

The second alignment control patterns 622 may be disposed in the non-alignment area NAA located between the second alignment area AA2 and the third alignment area AA3. The second alignment control patterns 622 may be spaced apart from the first alignment control patterns 621. For example, the second alignment control patterns 622 may be disposed between the first and second electrodes 210 and 220 in the non-alignment area NAA located between the second alignment area AA2 and the third alignment area AA3. The second alignment control patterns 622 may be disposed between the first and second electrodes 210 and 220 such that at least a part of each second alignment control pattern 622 overlaps (or is at) the area between the first and second electrodes 210 and 220 in the third direction DR3. The second alignment control patterns 622 may be disposed between the first and second electrodes 210 and 220, but at least a part of each second alignment control pattern 622 may overlap the first electrode 210 and/or a second electrode 220 in the third direction DR3.

One subpixel SPX may include at least one second alignment control pattern 622. When a plurality of first electrodes 210 and/or a plurality of second electrodes 220 are disposed in one subpixel SPX, the subpixel SPX may include a plurality of second alignment control patterns 622 disposed between the first electrodes 210 and the second electrodes 220, respectively. The second alignment control patterns 622 may be spaced apart from each other. For example, the second alignment control patterns 622 may be spaced apart from each other in the first direction DR1.

In an exemplary embodiment, when one first electrode 210 and two second electrodes 220 are disposed in one subpixel SPX, the subpixel SPX may include two second alignment control patterns 622 disposed between the one first electrode 210 and the two second electrodes 220, respectively. However, the present disclosure is not limited thereto, and the number of the second alignment control patterns 622 disposed in each subpixel SPX may be increased or decreased as explained in the above description of the first alignment control patterns 621.

In FIGS. 2 and 3, the alignment control patterns 620 disposed in one subpixel SPX include at least one first alignment control pattern 621 and at least one second alignment control pattern 622. However, the present disclosure is not limited thereto. The number and arrangement of the alignment control patterns 620 included in one subpixel SPX may vary according to the number of the alignment areas AA and the number of the electrodes 210 and 220 included in the subpixel SPX. For example, one subpixel SPX may include more alignment areas AA. In such an embodiment, the subpixel SPX may include a plurality of alignment control patterns 620 separated from each other in the second direction DR2. In addition, as described above, one subpixel SPX may include a plurality of first electrodes 210 and/or a plurality of second electrodes 220 disposed between them. In such an embodiment, the subpixel SPX may include a plurality of alignment control patterns 620 disposed between the first electrodes 210 and the second electrodes 220.

The alignment control patterns 620 may prevent or substantially prevent the light emitting elements ED from being disposed in the non-alignment area NAA of a subpixel SPX during the inkjet printing process during the manufacturing process of the display device 10. For example, as described above, the light emitting elements ED may be disposed (e.g., arranged) between the first and second electrodes 210 and 220 by an electric field formed between the first and second electrodes 210 and 220. The alignment control patterns 620 may be disposed in the areas between the first and second electrodes 210 and 220 in the non-alignment area NAA to prevent or substantially prevent the light emitting elements ED from being aligned (or seated) in the non-alignment area NAA, thereby reducing the number of lost (or disconnected or unconnected) light emitting elements ED.

The alignment control patterns 620 may include a hydrophobic material. The alignment control patterns 620 may include the same material as the first bank 610. The alignment control patterns 620 may include, as an example, polyimide (PI).

The light emitting elements ED may be disposed in each alignment area AA (AA1, AA2 or AA3). The light emitting elements ED may be disposed between the first and second electrodes 210 and 220 in the alignment areas AA. Although the light emitting elements ED are shown as being disposed in the alignment areas AA in the drawings, at least some of the light emitting elements ED may be further disposed in the non-alignment area NAA. The light emitting elements ED may not overlap the alignment control patterns 620 in the third direction DR3.

The light emitting elements ED may extend in one direction. The light emitting elements ED may be spaced apart from each other in the second direction DR2 in which each electrode 210 or 220 extends in a plan view and may be aligned substantially parallel to each other. A gap between the light emitting elements ED is not particularly limited. In addition, the light emitting elements ED may extend in a direction, and the direction in which each electrode 210 or 220 extends and the direction in which the light emitting elements ED extend may be substantially perpendicular to each other. However, the present disclosure is not limited thereto, and the light emitting elements ED may also extend in a direction not perpendicular but oblique to the direction in which each electrode 210 or 220 extends. The shape of each light emitting element ED will be described in more detail below with reference to other drawings.

Each of the light emitting elements ED may include an active layer 36 (see, e.g., FIG. 7) to emit light of a specific wavelength band. The display device 10 may include light emitting elements ED that emit light of different wavelength bands. Accordingly, the first subpixel SPX1, the second subpixel SPX2, and the third subpixel SPX3 may emit light of the first color, light of the second color, and light of the third color, respectively. However, the present disclosure is not limited thereto, and each of the subpixels SPX may include light emitting elements ED including the same active layer 36 (e.g., the same active layer material) to emit light of substantially the same color.

The light emitting elements ED may include light emitting elements ED disposed in the first alignment area AA1 (hereinafter referred to as 'first light emitting elements'), light emitting elements ED disposed in the second alignment area AA2 (hereinafter referred to as 'second light emitting elements'), and light emitting elements ED disposed in the third alignment area AA3 (hereinafter referred to as 'third light emitting elements'). The first light emitting elements ED1, the second light emitting elements ED2, and the third light emitting elements ED3 may be respectively disposed in the first through third alignment areas AA1 through AA3 to contact the contact electrodes 310 through 340, to be described in more detail below. The first light emitting elements ED, the second light emitting elements ED, and the third light emitting elements ED may be connected to each other in series through the contact electrodes 310 through 340.

One subpixel SPX may include a plurality of contact electrodes 310 through 340 spaced apart from each other. The contact electrodes 310 through 340 may be disposed in the emission area EMA. The contact electrodes 310 through 340 may include the first contact electrode 310, a second contact electrode 320, a third contact electrode 330, and the fourth contact electrodes 340.

For ease of description, in the following description, first ends of the light emitting elements ED refer to ends disposed at a side facing the first electrode 210, and second ends of the light emitting elements ED refer to ends disposed at a side opposite the side facing the first electrode 210, that is, ends disposed at a side facing the second electrode 220.

The first contact electrode 310 may be disposed on the first electrode 210 in the first alignment area AA1. The first contact electrode 310 may extend in the second direction DR2 in the first alignment area AA1 in a plan view. The first contact electrode 310 may extend in the second direction DR2 in the first alignment area AA1 in a plan view and may end at a position spaced apart from a lower side (a lower side in the drawings) of the first alignment area AA1 so as not to extend to the second alignment area AA2. The first contact electrode 310 may extend to above (above in the drawings) the first alignment area AA1 in a plan view to extend into (e.g., to be partially in) the non-alignment area NAA as well. In the non-alignment area NAA, the first contact electrode 310 may be electrically connected to the first electrode 210 through a first opening OP1 (see, e.g., FIG. 4A) overlapping a first contact opening (e.g., a first contact hole) CT1 in the third direction DR3. This will be described in more detail below.

The first contact electrode 310 may contact the first ends of the first light emitting elements ED. For example, the first contact electrode 310 may contact the first ends of the first light emitting elements ED and the first electrode 210 to electrically connect them.

The second contact electrode 320 may include first areas 321, a second area 322, and a third area 323. The second contact electrode 320 may be disposed over the first alignment area AA1, the second alignment area AA2, and the non-alignment area NAA located between them.

The first areas 321 of the second contact electrode 320 may be disposed on the second electrodes 220 in the first alignment area AA1. The first areas 321 of the second contact electrode 320 may extend in the second direction DR2 in the first alignment area AA1 in a plan view.

The first areas 321 of the second contact electrode 320 may be spaced apart from the first contact electrode 310 to face the first contact electrode 310 in the first direction DR1 in the first alignment area AA1. The first areas 321 of the second contact electrode 320 may contact the second ends of the first light emitting elements ED in the first alignment area AA1.

The second area 322 of the second contact electrode 320 may be disposed on the first electrode 210 in the second alignment area AA2. The second area 322 of the second contact electrode 320 may extend in the second direction DR2 in the second alignment area AA2 in a plan view. The second area 322 of the second contact electrode 320 may extend in the second direction DR2 in the second alignment area AA2 in a plan view but may end at a position spaced apart from a lower side of the second alignment area AA2 so as not to extend to the third alignment area AA3.

The second area 322 of the second contact electrode 320 may be spaced apart from the first areas 321 of the second contact electrode 320. The second area 322 of the second contact electrode 320 may contact the first ends of the second light emitting elements ED in the second alignment area AA2.

The third area 323 of the second contact electrode 320 may be disposed in the non-alignment area NAA located between the first alignment area AA1 and the second alignment area AA2. The third area 323 of the second contact electrode 320 in the non-alignment area NAA may connect the first areas 321 and the second area 322 of the second contact electrode 320. The third area 323 of the second contact electrode 320 may be a connection electrode disposed in the non-alignment area NAA to connect the first light emitting elements ED disposed in the first alignment area AA1 and the second light emitting elements ED disposed in the second alignment area AA2 to each other in series.

The third area 323 of the second contact electrode 320 may extend in the first direction DR1 in the non-alignment area NAA located between the first alignment area AA1 and the second alignment area AA2 in a plan view. A part of the third area 323 of the second contact electrode 320 may overlap the first alignment control patterns 621 in the third direction DR3.

The first through third areas 321 through 323 of the second contact electrode 320 may be integrated (e.g., may be integrally formed) and may be formed over the first alignment area AA1, the non-alignment area NAA, and the second alignment area AA2. Because the second contact electrode 320 contacts the second ends of the first light emitting elements ED and the first ends of the second light emitting elements ED, the first light emitting elements ED and the second light emitting elements ED may be connected to each other in series through the second contact electrode 320. The first areas 321 and the second area 322 of the second contact electrode 320 may be contact electrodes that contact the light emitting elements ED in the alignment areas AA, and the third area 323 of the second contact electrode 320 may be a series connection electrode that electrically connects them.

The third contact electrode 330 may include first areas 331, a second area 332, and a third area 333. The third contact electrode 330 may be disposed over the second alignment area AA2, the third alignment area AA3, and the non-alignment area NAA located between them.

The first areas 331 of the third contact electrode 330 may be disposed on the second electrodes 220 in the second alignment area AA2. The first areas 331 of the third contact electrode 330 may extend in the second direction DR2 in the second alignment area AA2 in a plan view.

The first areas 331 of the third contact electrode 330 may be spaced apart from the second area 322 of the second contact electrode 320 to face the second area 322 of the second contact electrode 320 in the first direction DR1 in the second alignment area AA2. The first areas 331 of the third contact electrode 330 may contact the second ends of the second light emitting elements ED in the second alignment area AA2.

The second area 332 of the third contact electrode 330 may be disposed on the first electrode 210 in the third alignment area AA3. The second area 332 of the third contact electrode 330 may extend in the second direction DR2 in the third alignment area AA3 in a plan view. The second area 332 of the third contact electrode 330 may extend to below (e.g., below in the drawings) the third alignment area AA3 in a plan view to lie in (or to extend into) a part of the non-alignment area NAA. Even in this embodiment, however, the second area 332 of the third contact electrode 330 may end at a position spaced apart from a lower side of the emission area EMA so as to lie within the emission area EMA.

The second area 332 of the third contact electrode 330 may be spaced apart from the first areas 331 of the third contact electrode 330. The second area 332 of the third contact electrode 330 may contact the first ends of the third light emitting elements ED in the third alignment area AA3.

The third area 333 of the third contact electrode 330 may be disposed in the non-alignment area NAA located between the second alignment area AA2 and the third alignment area AA3. The third area 333 of the third contact electrode 330 in the non-alignment area NAA may connect the first areas 331 and the second area 332 of the third contact electrode 330 to each other. For example, the third area 333 of the third contact electrode 330 may be a connection electrode disposed in the non-alignment area NAA to connect the second light emitting elements ED disposed in the second alignment area AA2 and the third light emitting elements ED disposed in the third alignment area AA3 to each other in series.

The third area 333 of the third contact electrode 330 may extend in the first direction DR1 in the non-alignment area NAA located between the second alignment area AA2 and the third alignment area AA3 in a plan view. A part of the third area 333 of the third contact electrode 330 may overlap the second alignment control patterns 622 in the third direction DR3.

The first through third areas 331 through 333 of the third contact electrode 330 may be integrated (e.g., may be integrally formed) and may be formed over the second alignment area AA2, the non-alignment area NAA, and the third alignment area AA3. Because the third contact electrode 330 contacts the second ends of the second light emitting elements ED and the first ends of the third light emitting elements ED, the second light emitting elements ED and the third light emitting elements ED may be connected to each other in series through the third contact electrode 330. The first areas 331 and the second area 332 of the third contact electrode 330 may be contact electrodes that contact the light emitting elements ED in the alignment areas AA, and the third area 333 of the third contact electrode 330 may be a series connection electrode that electrically connects them.

The fourth contact electrodes 340 may be disposed on the second electrodes 220 in the third alignment area AA3. The fourth contact electrodes 340 may extend in the second direction DR2 in the third alignment area AA3 in a plan view. The fourth contact electrodes 340 may extend in the second direction DR2 in the third alignment area AA3 in a plan view but may end at a position spaced apart from an upper side (e.g., an upper side in the drawings) of the third alignment area AA3 so as not to extend to the second alignment area AA2. The fourth contact electrodes 340 may extend to below (e.g., below in the drawings) the third alignment area AA3 in a plan view to lie in a part of (e.g., to lie partially in) the non-alignment area NAA as well. In the non-alignment area NAA, the fourth contact electrodes 340 may be electrically connected to the second electrodes 220 through second openings OP2 (see, e.g., FIG. 6A) overlapping second contact openings (e.g., second contact holes) CT2 in the third direction DR3. This will be described in more detail below.

The fourth contact electrodes 340 may contact the second ends of the third light emitting elements ED. For example, the fourth contact electrodes 340 may contact the second ends of the third light emitting elements ED and the second electrodes 220 to electrically connect them.

In an exemplary embodiment in which one subpixel SPX includes one first electrode 210 and two second electrodes 220, contact electrodes disposed on the first electrode 210 in the alignment areas AA1 through AA3, for example, the first contact electrode 310, the second area 322 of the second contact electrode 320, and the second area 332 of the third contact electrode 330 may each include one contact electrode. In addition, contact electrodes disposed on the second electrodes 220 in the alignment areas AA1 through AA3, for example, the first areas 321 of the second contact electrode 320, the first areas 331 of the third contact electrode 330, and the fourth contact electrodes 340 may each include two separate contact electrodes.

In the illustrated embodiment, series connection electrodes for serially connecting the first through third light emitting elements ED respectively disposed in the first through third alignment areas AA1 through AA3 may be disposed in the non-alignment area NAA located between the first through third alignment areas AA1 through AA3. The series connection electrodes may include the third area 323 of the second contact electrode 320 and the third area 333 of the third contact electrode 330. The third area 323 of the second contact electrode 320 and the third area 333 of the third contact electrode 330 may extend along the first direction DR1 in the non-alignment area NAA located between the first through third alignment areas AA1 through AA3. Therefore, when the light emitting elements ED are disposed in an area between the first and second electrodes 210 and 220, which overlaps the non-alignment area NAA between the first through third alignment areas AA1 through AA3 in the third direction DR3, they may not emit light because both (or opposite) ends of the light emitting elements ED do not contact different contact electrodes (e.g., contact electrodes having different polarities from each other). Therefore, the alignment control patterns 620 may be disposed in the area between the first and second electrodes 210 and 220 which overlaps the non-alignment area NAA in the third direction DR3 to prevent the light emitting elements ED from being aligned (or seated) in the area between the first and second electrodes 210 and 220 disposed in the non-alignment area NAA. Thus, the number of the light emitting elements ED disposed in the non-alignment area NAA and, thus, lost may be reduced, thereby increasing the manufacturing efficiency and reducing the material cost of the light emitting elements ED.

Figure 4A:
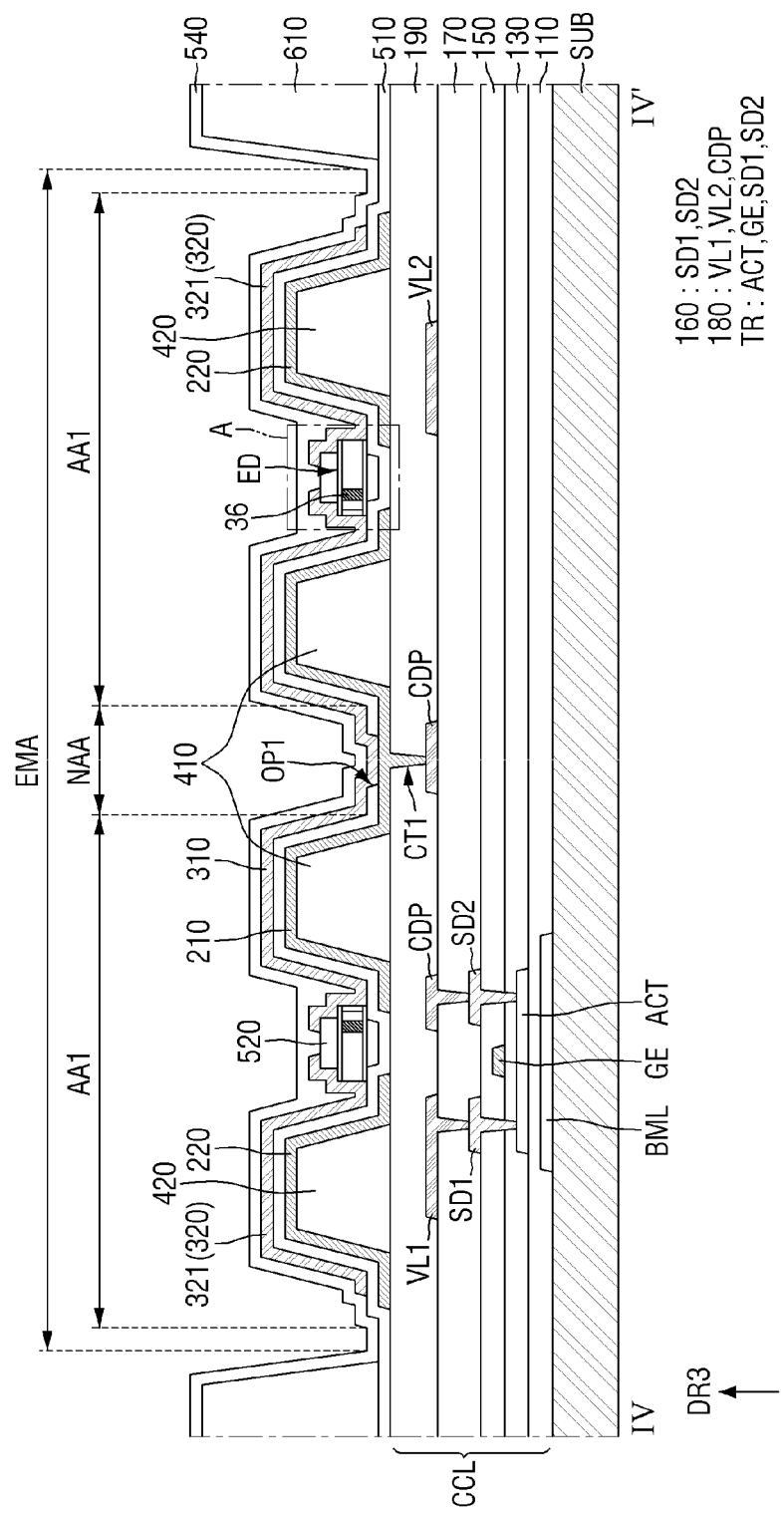
FIG. 4A is a cross-sectional view taken along the line IV-IV' of FIG. 3.
Figure 4B:
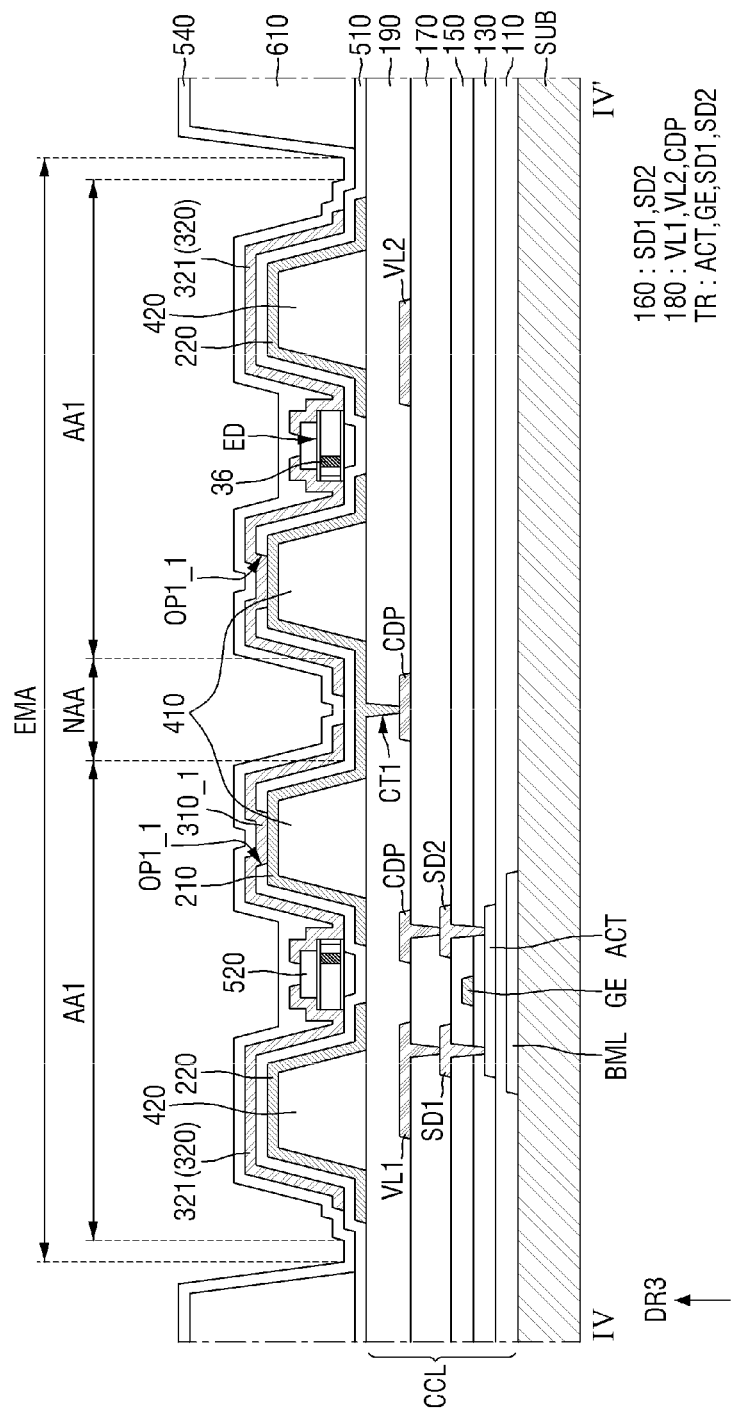
FIG. 4B is a cross-sectional view taken along the line IV-IV' of FIG. 3 according to another embodiment.
Figure 6A:
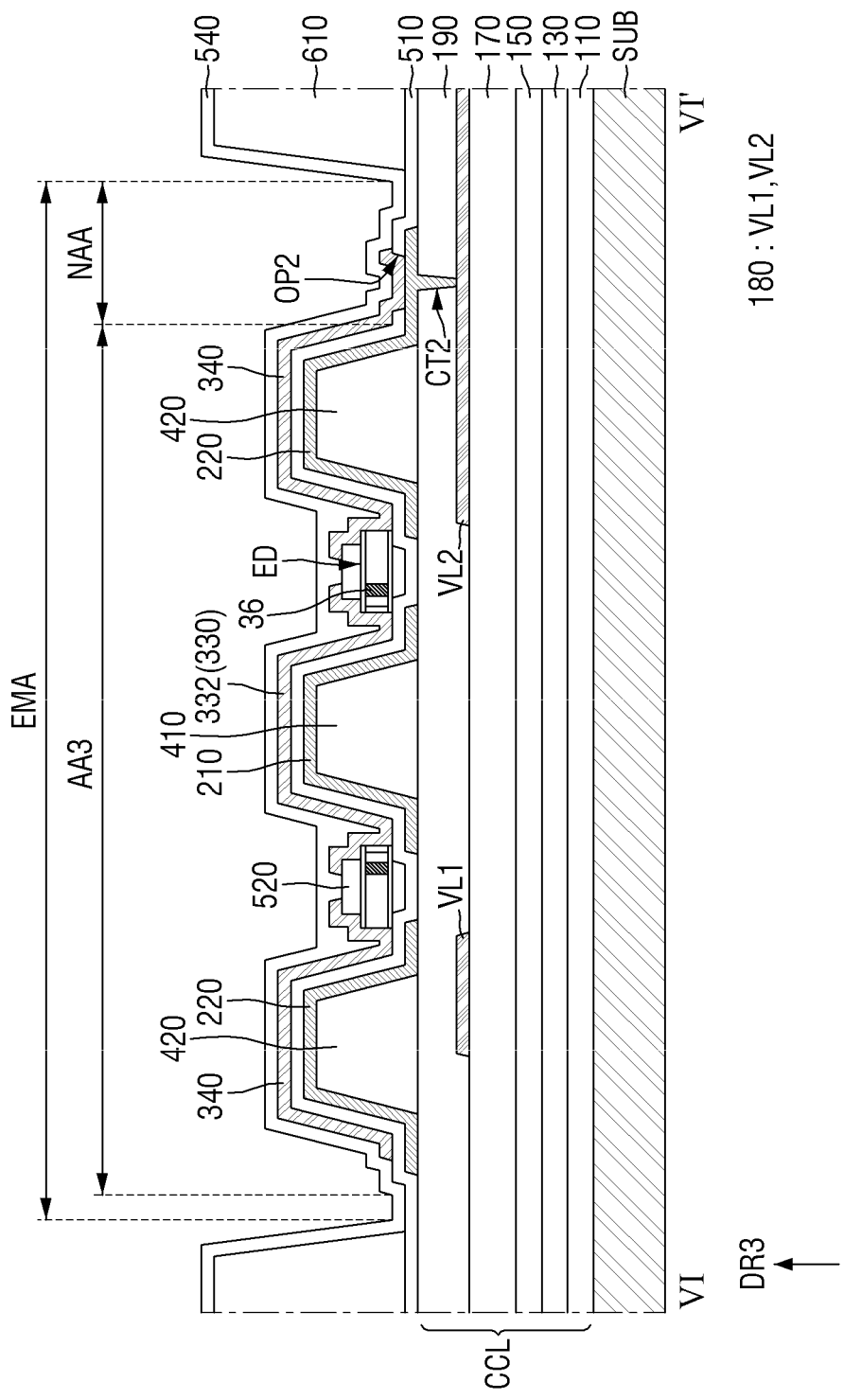
FIG. 6A is a cross-sectional view taken along the line VI-VI' of FIG. 3.
Figure 6B:
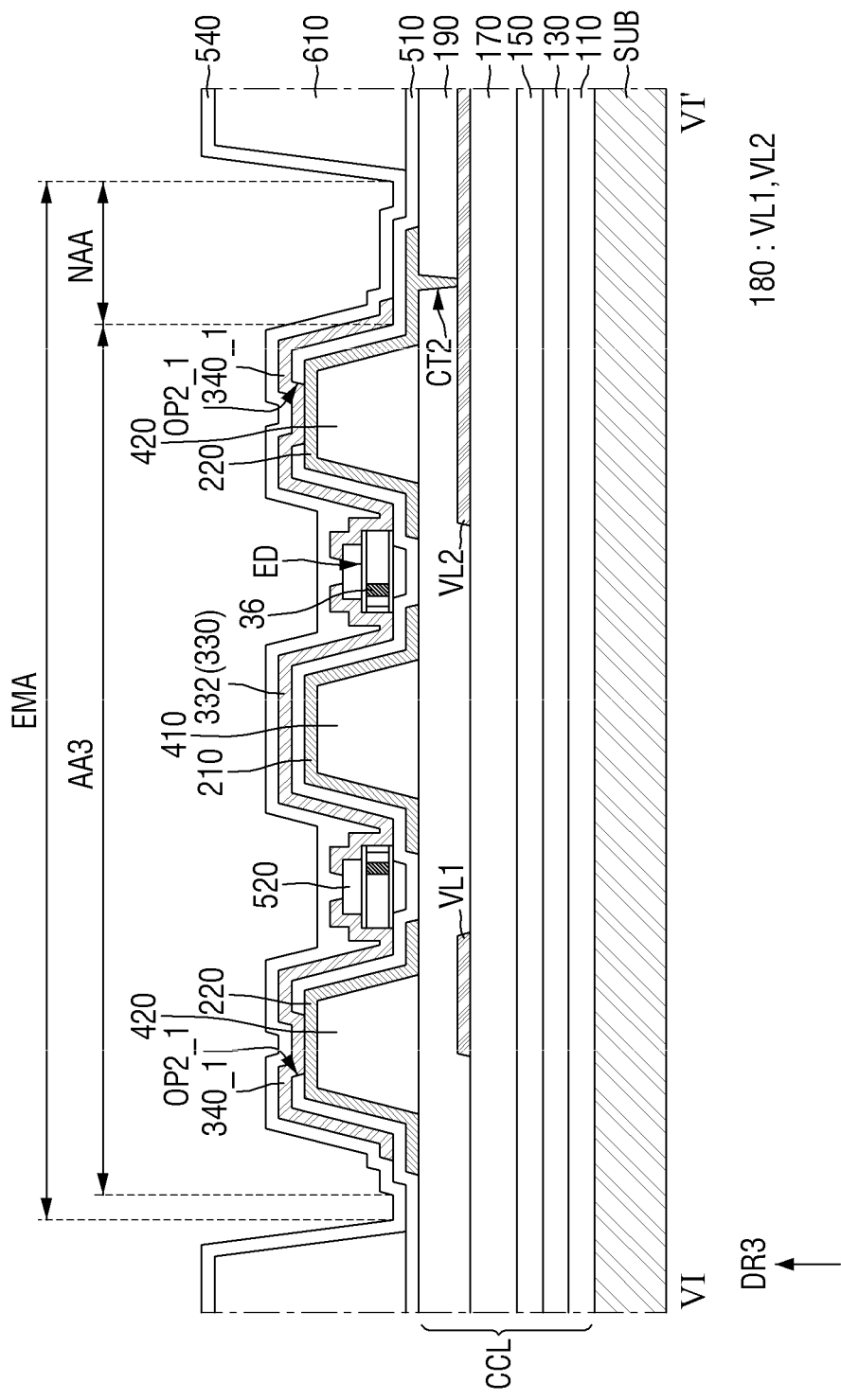
FIG. 6B is a cross-sectional view taken along the line VI-VI' of FIG. 3 according to another embodiment.

FIG. 4A is a cross-sectional view taken along the line IV-IV' of FIG. 3, and FIG. 4B is a cross-sectional view taken along the line IV-IV' of FIG. 3 according to another embodiment. FIGS. 4A and 4B illustrate only the first alignment area AA1 and the non-alignment area NAA adjacent to the first alignment area AA1 disposed in the subpixel SPX shown in FIG. 3. FIG. 5 is a cross-sectional view taken along the line V-V' of FIG. 3. FIG. 6A is a cross-sectional view taken along the line VI-VI' of FIG. 3, and FIG. 6B is a cross-sectional view taken along the line VI-VI' of FIG. 3 according to another embodiment.

Referring to FIGS. 4A, 5, and 6A, in conjunction with FIG. 3, the display device 10 may include a substrate SUB, a circuit element layer CCL disposed on the substrate SUB, and a light emitting layer disposed on the circuit element layer CCL.

The circuit element layer CCL may include a buffer layer 110, a lower metal layer BML, a semiconductor layer, a plurality of conductive layers, a plurality of insulating films, and a via layer 190 disposed on the substrate SUB. The light emitting layer may be disposed on the via layer 190 of the circuit element layer CCL and may include the electrodes 210 and 220, the first bank 610, the second banks 410 and 420, the light emitting elements ED, a plurality of insulating layers 510, 520, and 540, and the alignment control patterns 620.

The substrate SUB may be an insulating substrate. The substrate SUB may include (or may be made of) an insulating material, such as glass, quartz, or polymer resin. In addition, the substrate SUB may be a rigid substrate or may be a flexible substrate that can be bent, folded, and rolled.

The lower metal layer BML may be disposed on the substrate SUB. The lower metal layer BML may be a light blocking layer that protects an active material layer ACT of the semiconductor layer from external light. The lower metal layer BML may include a light blocking material. For example, the lower metal layer BML may include (or may be made of) an opaque metal material that blocks the transmission of light.

The lower metal layer BML has a patterned shape. The lower metal layer BML may be disposed under the active material layer ACT of a transistor TR of the display device 10 to cover at least a channel region of the active material layer ACT and, by extension, to cover the entire active material layer ACT of the transistor TR. However, the present disclosure is not limited thereto, and the lower metal layer BML may be omitted.

The buffer layer 110 may be disposed on the lower metal layer BML. The buffer layer 110 may cover the entire surface of the substrate SUB on which the lower metal layer BML is disposed (e.g., the buffer layer 110 may cover the lower metal layer BML). The buffer layer 110 may protect the transistor TR from moisture introduced through the substrate SUB, which is vulnerable to moisture penetration. The buffer layer 110 may include (or may be composed of) a plurality of inorganic layers alternately stacked on each other. For example, the buffer layer 110 may have a multilayer structure in which inorganic layers including at least one of silicon oxide ($SiO_x$), silicon nitride ($SiN_x$), and silicon oxynitride ($SiO_xN_y$) are stacked alternately on each other.

The semiconductor layer is disposed on the buffer layer 110. The semiconductor layer may include the active material layer ACT of the transistor TR. The active material layer ACT may overlap the lower metal layer BML.

The semiconductor layer may include polycrystalline silicon, an oxide semiconductor, or the like. In an exemplary embodiment, when the semiconductor layer includes polycrystalline silicon, it may be formed by crystallizing amorphous silicon. In an embodiment, the semiconductor layer may include an oxide semiconductor. The oxide semiconductor may include (or may be), for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), or indium gallium zinc tin oxide (IGZTO).

A gate insulating film 130 may be disposed on the active material layer ACT. The gate insulating film 130 may be disposed on the buffer layer 110 on which the active material layer ACT is disposed. The gate insulating film 130 may function (or act) as a gate insulating film of the transistor TR. The gate insulating film 130 may be an inorganic layer including an inorganic material, such as silicon oxide ($SiO_x$), silicon nitride ($SiN_x$), or silicon oxynitride ($SiO_xN_y$) or may have a structure in which the one or more of the above materials are stacked on each other.

A gate conductive layer may be disposed on the gate insulating film 130. The gate conductive layer may include a gate electrode GE of the transistor TR. The gate electrode GE may overlap the channel region of the active material layer ACT in the thickness direction.

The gate conductive layer may be, but is not limited to, a single layer or may have a multilayer structure including (or made of) one or more of any of molybdenum (Mo), aluminum (Al), chromium (Cr), gold (Au), titanium (Ti), nickel (Ni), neodymium (Nd), copper (Cu), and alloys thereof.

An interlayer insulating film 150 is disposed on the gate conductive layer. The interlayer insulating film 150 may be disposed on the gate insulating film 130 on which the gate conductive layer is formed. The interlayer insulating film 150 may include an inorganic insulating material, such as silicon oxide ($SiO_x$), silicon nitride ($SiN_x$), or silicon oxynitride ($SiO_xN_y$).

A first data conductive layer 160 is disposed on the interlayer insulating film 150. The first data conductive layer 160 may include a first source/drain electrode SD1 and a second source/drain electrode SD2 of the transistor TR. The first data conductive layer 160 may further include a data line.

The first and second source/drain electrodes SD1 and SD2 may be respectively electrically connected to both end regions (e.g., doping regions) of the active material layer ACT through contact openings (e.g., contact holes) penetrating the interlayer insulating film 150 and the gate insulating film 130.

The first data conductive layer 160 may be, but is not limited to, a single layer or may have a multilayer structure including (or made of) one or more of any of molybdenum (Mo), aluminum (Al), chromium (Cr), gold (Au), titanium (Ti), nickel (Ni), neodymium (Nd), copper (Cu), and alloys thereof.

A passivation layer 170 is disposed on the first data conductive layer 160. The passivation layer 170 protects the first data conductive layer 160 by covering the first data conductive layer 160. The passivation layer 170 may include an inorganic insulating material, such as silicon oxide ($SiO_x$), silicon nitride ($SiN_x$), or silicon oxynitride ($SiO_xN_y$).

A second data conductive layer 180 is disposed on the passivation layer 170. The second data conductive layer 180 may include a first voltage wiring VL1, a second voltage wiring VL2, and a first conductive pattern CDP.

A high potential voltage (e.g., a first power supply voltage) may be supplied to the first voltage wiring VL1, and a low potential voltage (e.g., a second power supply voltage) lower than the high potential voltage (the first power supply voltage) of the first voltage wiring VL1 may be supplied to the second voltage wiring VL2. The second voltage wiring VL2 may be electrically connected to each second electrode 220 to supply the low potential voltage (the second power supply voltage) to the second electrode 220. In addition, an alignment signal used to align the light emitting elements ED may be transmitted to the second voltage wiring VL2 during the manufacturing process of the display device 10.

The first conductive pattern CDP may be electrically connected to the second source/drain electrode SD2 of the transistor TR through a contact opening (e.g., a contact hole) penetrating the passivation layer 170. The first conductive pattern CDP may be electrically connected to the first electrode 210 through the first contact opening CT1 formed in the non-alignment area NAA to transmit the first power supply voltage received from the first voltage wiring VL1 to the first electrode 210.

The second data conductive layer 180 may be, but is not limited to, a single layer or may have a multilayer structure including (or made of) one or more of any of molybdenum (Mo), aluminum (Al), chromium (Cr), gold (Au), titanium (Ti), nickel (Ni), neodymium (Nd), copper (Cu), and alloys thereof.

The via layer 190 is disposed on the second data conductive layer 180. The via layer 190 may be disposed on the first passivation layer 170, on which the second data conductive layer 180 is disposed. The via layer 190 may planarize the surface (e.g., the via layer 190 may provide a planar upper surface). The via layer 190 may include an organic insulating material, for example, an organic material, such as polyimide (PI).

An example of the cross-sectional structure of the light emitting layer disposed on the via layer 190 will be described in more detail with reference to FIGS. 4A, 5 and 6A, in conjunction with FIG. 3.

The second banks 410 and 420 may be disposed on the via layer 190. The second banks 410 and 420 may extend in the second direction DR2 in each subpixel SPX in a plan view. The second banks 410 and 420 may end at positions spaced apart from boundaries of other subpixels SPX adjacent in the second direction DR2 so as not to extend to the neighboring subpixels SPX in the second direction DR2.

In an embodiment, the second banks 410 and 420 included in each subpixel SPX may include the first sub bank 410 and the second sub banks 420. The first sub bank 410 and the second sub banks 420 may be spaced apart to face each other in the first direction DR1 in the emission area EMA. A space between the first and second sub banks 410 and 420, which are spaced apart from each other, may provide an area at where the light emitting elements ED are disposed. Although each subpixel SPX includes one first sub bank 410 and two second sub banks 420 in the drawings, the present disclosure is not limited thereto. The number of the second banks 410 and 420 included in each subpixel SPX may be increased depending on the shapes or arrangement of the first and second electrodes 210 and 220.

The second banks 410 and 420 may be directly disposed on the via layer 190. At least a part of each second bank 410 or 420 may protrude from (e.g., may protrude above) an upper surface of the via layer 190. The protruding part (or the protruding portion) of each second bank 410 or 420 may have inclined side surfaces. The second banks 410 and 420 including the inclined side surfaces may change the direction of light (e.g., may reflect the light) emitted from the light emitting elements ED that travels toward the side surfaces of the second banks 410 and 420 to an upward direction (e.g., the display direction). For example, each second bank 410 or 420 may act as a reflective barrier that changes the direction of incident light emitted from the light emitting elements ED to the display direction while providing a space at where the light emitting elements ED are disposed as described above. Although the side surfaces of the second banks 410 and 420 are inclined in a linear shape (e.g., the inclined side surfaces are linear in shape) in the drawings, the present disclosure is not limited thereto. For example, the side surfaces (or outer surfaces) of the second banks 410 and 420 may have a curved semi-circular or semi-elliptical shape. In an exemplary embodiment, the second banks 410 and 420 may include an organic insulating material, such as polyimide (PI), but the present disclosure is not limited thereto.

The electrodes 210 and 220 may be disposed on the second banks 410 and 420 and the via layer 190 exposed by the second banks 410 and 420. The first electrode 210 may be disposed on the first sub bank 410, and the second electrodes 220 may be disposed on the second sub banks 420. The first and second electrodes 210 and 220 may have substantially similar planar shapes as the first and second sub banks 410 and 420 but may have larger areas (e.g., may have greater surface areas).

Referring to FIGS. 3 and 4A, the first electrode 210 may contact the first conductive pattern CDP through the first contact opening CT1. The first contact opening CT1 may be located in the non-alignment area NAA disposed above the first alignment area AA1 in the emission area EMA defined by the first bank 610 in a plan view. The first electrode 210 may contact the first conductive pattern CDP through the first contact opening CT1, which penetrates the via layer 190. The first electrode 210 may be electrically connected to the transistor TR through the first conductive pattern CDP. The first electrode 210 may be electrically connected to the second source/drain electrode SD2 of the transistor TR through the first conductive pattern CDP.

Referring to FIGS. 3 and 6A, each second electrode 220 may contact the second voltage wiring VL2 through a second contact opening (e.g., a second contact hole) CT2. The second contact opening CT2 may be located in the non-alignment area NAA disposed below the third alignment area AA3 in the emission area EMA defined by the first bank 610 in a plan view. The second power supply voltage may be applied to each second electrode 220 through the second voltage wiring VL2.

Referring again to FIGS. 3, 4A, 5, and 6A, the first electrode 210 may be disposed on the first sub bank 410 to cover the outer surface of the first sub bank 410. The first electrode 210 may extend outwardly from the side surfaces of the first sub bank 410 so that a part of the first electrode 210 is disposed on the upper surface of the via layer 190 exposed by (e.g., exposed between) the first and second sub banks 410 and 420.

The second electrodes 220 may be disposed on the second sub banks 420 to cover the outer surfaces of the second sub banks 420. The second electrodes 220 may extend outwardly from the side surfaces of the second sub banks 420 so that a part of each second electrode 220 is disposed on the upper surface of the via layer 190 exposed by (e.g., exposed between) the first and second sub banks 410 and 420. The first and second electrodes 210 and 220 may be spaced apart from each other in the first direction DR1 to expose at least a part of the via layer 190 in an area between the first and second sub banks 410 and 420.

The first and second electrodes 210 and 220 may be electrically connected to the light emitting elements ED, and a voltage (e.g., a predetermined voltage) may be applied to each of the first and second electrodes 210 and 220 so that the light emitting elements ED emit light. For example, the electrodes 210 and 220 may be electrically connected to the light emitting elements ED disposed between the first and second electrodes 210 and 220 through the first through fourth contact electrodes 310 through 340 and may transmit received electrical signals to the light emitting elements ED through the first through fourth contact electrodes 310 through 340.

Each of the electrodes 210 and 220 may include a transparent conductive material. For example, each of the electrodes 210 and 220 may include a material, such as indium tin oxide (ITO), indium zinc oxide (IZO) or indium tin zinc oxide (ITZO), but the present disclosure is not limited thereto. In some embodiments, each of the electrodes 210 and 220 may include a conductive material having high reflectivity (e.g., a highly reflective conductive material). For example, each of the electrodes 210 and 220 may include a metal, such as silver (Ag), copper (Cu), or aluminum (Al) as a highly reflective material. However, the present disclosure is not limited thereto, and each of the electrodes 210 and 220 may also have a structure in which a transparent conductive material and a metal layer having high reflectivity are stacked in one or more layers or may be formed as a single layer including the transparent conductive material and the metal layer. In an exemplary embodiment, each of the electrodes 210 and 220 may have a stacked structure including ITO/Ag/ITO, ITO/Ag/IZO, or ITO/Ag/ITZO/IZO or may be an alloy including aluminum (Al), nickel (Ni), and/or lanthanum (La).

A first insulating layer 510 may be disposed on the electrodes 210 and 220. The first insulating layer 510 is disposed on the via layer 190, the first electrode 210 and the second electrodes 220 but exposes at least a part of an upper surface of each of the first and second electrodes 210 and 220.

The first insulating layer 510 may be entirely disposed on the first and second electrodes 210 and 220 disposed on the first and second sub banks 410 and 420 as well as on the area between the first and second electrodes 210 and 220.

As illustrated in FIG. 4A, the first insulating layer 510 may have the first opening OP1 that exposes a part of the upper surface of the first electrode 210 in an area overlapping the first contact opening CT1 in the third direction DR3. The first contact electrode 310 and the first electrode 210 may contact each other through the first opening OP1. Because the first contact electrode 310 and the first electrode 210 contact each other through the first opening OP1, the first electrode 210 may be electrically connected to the first light emitting elements ED disposed in the first alignment area AA1 through the first contact electrode 310.

As illustrated in FIG. 6A, the first insulating layer 510 may have the second openings OP2 that partially expose the upper surfaces of the second electrodes 220 in areas overlapping the second contact openings CT2 in the third direction DR3. The fourth contact electrodes 340 and the second electrodes 220 may contact each other through the second openings OP2. Because the fourth contact electrodes 340 and the second electrodes 220 contact each other through the second openings OP2, the second electrodes 220 may be electrically connected to the third light emitting elements ED disposed in the third alignment area AA3 through the fourth contact electrodes 340.

The first insulating layer 510 may be interposed between the second and third contact electrodes 320 and 330 and the first and second electrodes 210 and 220. Because the first insulating layer 510 is interposed between the second and third contact electrodes 320 and 330 and the first and second electrodes 210 and 220, the second and third contact electrodes 320 and 330 may not contact the first and second electrodes 210 and 220. The second and third contact electrodes 320 and 330 may not be directly connected to the first and second electrodes 210 and 220 but may be electrically connected to the first and second electrodes 210 and 220 through the light emitting elements ED. This will be described in more detail below with reference to FIG. 9.

The first insulating layer 510 may be stepped such that a part of an upper surface of the first insulating layer 510 is recessed between the first and second electrodes 210 and 220. A part of the upper surface of the first insulating layer 510 may be recessed by a step formed by a member (e.g., the first electrode 210 and/or the second electrodes 220) disposed under the first insulating layer 510. In some embodiments, an empty space may be formed between each light emitting element ED and the upper surface of the first insulating layer 510 that is stepped and partially recessed between the first and second electrodes 210 and 220. The empty space between the first insulating layer 510 and each light emitting element ED may be filled with a material that forms a second insulating layer 520, to be described in more detail. However, the present disclosure is not limited thereto, and the first insulating layer 510 may also not be stepped between the first and second electrodes 210 and 220. For example, the first insulating layer 510 may include a flat upper surface so that the light emitting elements ED are disposed between the first and second electrodes 210 and 220.

The first insulating layer 510 may protect the first and second electrodes 210 and 220 while insulating them from each other. In addition, the first insulating layer 510 may prevent the light emitting elements ED disposed on the first insulating layer 510 from directly contacting other members and, thus, being damaged. In addition, the first insulating layer 510 may prevent the second and third contact electrodes 320 and 330 from contacting the first and second electrodes 210 and 220 as described above, so that the first through third light emitting elements ED respectively disposed in the first through third alignment areas AA1 through AA3 are connected to each other in series through the second and third contact electrodes 320 and 330.

The first insulating layer 510 may include an inorganic insulating material or an organic insulating material. In an exemplary embodiment, the first insulating layer 510 may include an inorganic insulating material, such as silicon oxide ($SiO_x$), silicon nitride ($SiN_x$), silicon oxynitride ($SiO_xN_y$), aluminum oxide ($Al_2O_3$), or aluminum nitride (AlN).

The first bank 610 and the alignment control patterns 620 may be disposed on the first insulating layer 510.

The first bank 610 may be disposed at the boundary of each subpixel SPX to separate neighboring subpixels SPX. In addition, according to an embodiment, the first bank 610 may have a greater height than the second banks 410 and 420.

The alignment control patterns 620 may be disposed between the first and second electrodes 210 and 220 disposed in the non-alignment area NAA located between the first through third alignment areas AA1 through AA3. The alignment control patterns 620 may be disposed between the first and second sub banks 410 and 420 in the non-alignment area NAA. The alignment control patterns 620 may be disposed between the first and second sub banks 410 and 420 in the non-alignment area NAA to prevent (or substantially prevent) the light emitting elements ED from being aligned (or seated) between the first and second sub banks 410 and 420 in the non-alignment area NAA. In the non-alignment area NAA, the third areas 323 and 333 of the second and third contact electrodes 320 and 330 may be disposed on the first and second sub banks 410 and 420. Thus, the light emitting elements ED may not emit light even if they are disposed in the non-alignment area NAA. Therefore, because the alignment control patterns 620 are disposed between the first and second sub banks 410 and 420 in the non-alignment area NAA, the number of the light emitting elements ED that may be lost between the first and second sub banks 410 and 420 can be reduced.

The light emitting elements ED may be disposed in the first through third alignment areas AA1 through AA3. The light emitting elements ED may be disposed on the first insulating layer 510 between the first and second electrodes 210 and 220.

The second insulating layer 520 may be partially disposed on the light emitting elements ED disposed between the first and second electrodes 210 and 220 in the first through third alignment areas AA1 through AA3. The second insulating layer 520 may partially cover outer surfaces of the light emitting elements ED. The second insulating layer 520 may be disposed on the light emitting elements ED but may expose the first and second ends (e.g., the opposite ends) of the light emitting elements ED. A part of the second insulating layer 520 disposed on the light emitting elements ED may extend in the second direction DR2 between the first and second electrodes 210 and 220 in a plan view.

The second insulating layer 520 may not be disposed in the non-alignment area NAA. The second insulating layer 520 may be spaced apart from the alignment control patterns 620. For example, the second insulating layer 520 may form a linear or island-shaped pattern in each alignment area AA1, AA2, or AA3. Although not illustrated in the drawings, the material that forms the second insulating layer 520 may be disposed between the first and second electrodes 210 and 220 and may fill the empty space between the recessed first insulating layer 510 and each light emitting element ED as described above.

The contact electrodes 310 through 340 may be disposed on the second insulating layer 520. The first contact electrode 310 may be electrically connected to the first electrode 210 by contacting the upper surface of the first electrode 210 through the first opening OP1 as described above. Therefore, the first contact electrode 310 may contact the first ends of the first light emitting elements ED and the first electrode 210, thereby electrically connecting the first ends of the first light emitting elements ED and the first electrode 210. Because the second contact electrode 320 is disposed over the first and second alignment areas AA1 and AA2 and the third contact electrode 330 is disposed over the second and third alignment areas AA2 and AA3, the first through third light emitting elements ED may be connected to each other in series by the second and third contact electrodes 320 and 330. The fourth contact electrodes 340 may be electrically connected to the second electrodes 220 by contacting the upper surfaces of the second electrodes 220 through the second openings OP2 as described above. Therefore, the fourth contact electrodes 340 may contact the second ends of the third light emitting elements ED and the second electrodes 220, thereby electrically connecting the second ends of the third light emitting elements ED and the second electrodes 220.

The second insulating layer 520 may include an inorganic insulating material or an organic insulating material. In an exemplary embodiment, the second insulating layer 520 may include an inorganic insulating material. When the second insulating layer 520 includes an inorganic insulating material, it may include silicon oxide (SiO$_x$), silicon nitride (SiN$_x$), silicon oxynitride (SiO$_x$N$_y$), aluminum oxide (Al$_2$O$_3$), or aluminum nitride (AlN). In some embodiments, the second insulating layer 520 may include an organic insulating material. When the second insulating layer 520 includes an organic insulating material, it may include an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited thereto.

Referring to FIGS. 3 and 5, the third areas 323 and 333 of the second and third contact electrodes 320 and 330 may be disposed on the alignment control patterns 620 disposed in the non-alignment area NAA. The third areas 323 and 333 of the second and third contact electrodes 320 and 330 may be entirely disposed on the alignment control patterns 620 and the first insulating layer 510 exposed by the alignment control patterns 620 in the non-alignment area NAA located between the alignment areas AA1 through AA3. In the illustrated embodiment, the third areas 323 and 333 of the second and third contact electrodes 320 and 330 may be disposed to completely (or entirely) cover side and upper surfaces of the alignment control patterns 620. For example, the alignment control patterns 620 may at least partially overlap areas at where series connection electrodes connecting the light emitting elements ED disposed in the first through third alignment areas AA1 through AA3 in series are disposed.

The contact electrodes 310 through 340 may include a conductive material, such as ITO, IZO, ITZO, or aluminum (Al). For example, the contact electrodes 310 through 340 may include a transparent conductive material, but the present disclosure is not limited thereto.

A third insulating layer 540 may be disposed on the entire substrate SUB. The third insulating layer 540 may protect members disposed on the substrate SUB from the external environment. The third insulating layer 540 may include an inorganic insulating material or an organic insulating material. For example, the third insulating layer 540 may include materials listed above as materials that can be included in the second insulating layer 520.

A cross-sectional structure of the display device 10 taken along the line IV-IV' and the line VI-VI' of FIG. 3 according to another embodiment will now be described with reference to FIGS. 4B and 6B. In the description of FIGS. 4B and 6B, a redundant description of the same elements as those described above may be omitted or only given briefly, and differences therebetween will be primarily described.

Referring to FIGS. 4B and 6B, the illustrated embodiment is different from the embodiment shown in FIGS. 4A and 6A in that a first opening OP1_1 and second openings OP2_1 are formed in the first insulating layer 510 on the first sub bank 410 and the second sub banks 420 without overlapping the first contact opening CT1 and second contact openings CT2 in the third direction DR3.

The first opening OP1_1 may be disposed in a first alignment area AA1 to expose a first electrode 210 disposed on an upper surface of the first sub bank 410. Therefore, a first contact electrode 310_1 may contact the first electrode 210 through the first opening OP1_1 in the first alignment area AA1. The first opening OP1_1 may not overlap the first contact opening CT1 disposed in a non-alignment area NAA in the third direction DR3.

Similarly, the second openings OP2_1 may be disposed in a third alignment area AA3 to expose second electrodes 220 disposed on upper surfaces of the second sub banks 420. Therefore, fourth contact electrodes 340_1 may contact the second electrodes 220 through the second openings OP2_1 in the third alignment area AA3. The second openings OP2_1 may not overlap the second contact openings CT2 disposed in the non-alignment area NAA in the third direction DR3.

Figure 7:
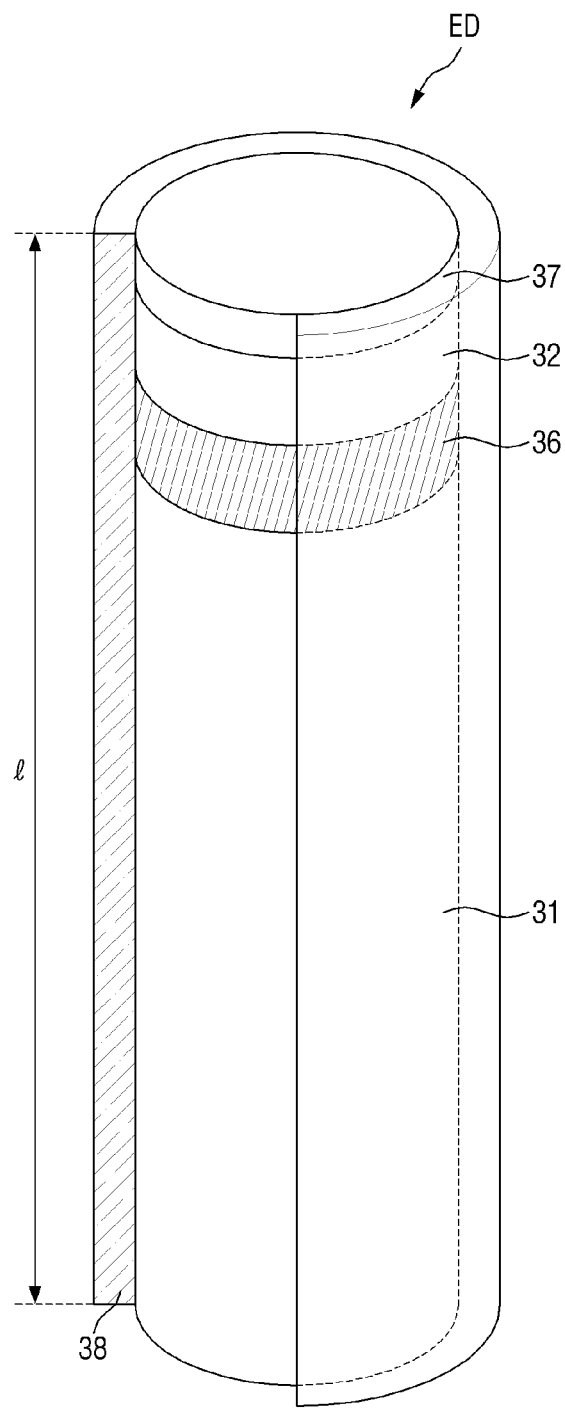
FIG. 7 is a schematic view of a light emitting element according to an embodiment.

FIG. 7 is a schematic view of a light emitting element ED according to an embodiment.

The light emitting element ED may be a light emitting diode. For example, the light emitting element ED may be an inorganic light emitting diode having a size of micrometers or nanometers and including (or made of) an inorganic material. The inorganic light emitting diode may be aligned by forming an electric field between a plurality of electrodes that face each other. For example, the inorganic light emitting diode may be aligned between two adjacent electrodes by forming an electric field in a direction (e.g., in a specific direction) to have polarity between the electrodes.

The light emitting element ED according to the embodiment may extend in (e.g., may primarily extend in) one direction. The light emitting element ED may have a rod, wire, tube, etc. shape. In an exemplary embodiment, the light emitting element ED may have a cylinder- or a rod-like shape. However, the shape of the light emitting element ED is not limited thereto, and the light emitting element ED may also have various shapes including polygonal prisms, such as a cube, a rectangular parallelepiped, a hexagonal prism, and a shape extending in a direction and having a partially inclined outer surface. A plurality of semiconductors included in the light emitting element ED may be sequentially disposed or stacked along the one direction in which the light emitting element ED extends.

The light emitting element ED may include a semiconductor layer doped with impurities of any conductivity type (e.g., a p type or an n type). The semiconductor layer may receive an electrical signal from an external power source and emit light of a wavelength band (e.g., of a specific wavelength band).

Referring to FIG. 7, the light emitting element ED may include a first semiconductor layer 31, a second semiconductor layer 32, the active layer 36, an element electrode layer 37, and an element insulating film 38.

The first semiconductor layer 31 may be an n-type semiconductor. For example, when the light emitting element ED emits light in a blue wavelength band, the first semiconductor layer 31 may include a semiconductor material having a chemical formula of $Al_xGa_yIn_{1-x-y}N$ ($0 \le x \le 1$, $0 \le y \le 1$, $0 \le x+y \le 1$). The semiconductor material included in the first semiconductor layer 31 may be, for example, one or more of any of n-type doped AlGaInN, GaN, AlGaN, InGaN, AlN, and InN. The first semiconductor layer 31 may be doped with an n-type dopant, and the n-type dopant may be, for example, Si, Ge, or Sn. In an exemplary embodiment, the first semiconductor layer 31 may be n-GaN doped with n-type Si.

The second semiconductor layer 32 may be spaced apart from the first semiconductor layer 31 in the one direction in which the light emitting element ED extends. The second semiconductor layer 32 may be a p-type semiconductor. For example, when the light emitting element ED emits light in a blue or green wavelength band, the second semiconductor layer 32 may include a semiconductor material having a chemical formula of $Al_xGa_yIn_{1-x-y}N$ ($0 \le x \le 1$, $0 \le y \le 1$, $0 \le x+y \le 1$). The semiconductor material included in the second semiconductor layer 32 may be, for example, one or more of any of p-type doped AlGaInN, GaN, AlGaN, InGaN, AlN, and InN. The second semiconductor layer 32 may be doped with a p-type dopant, and the p-type dopant may be, for example, Mg, Zn, Ca, Se, or Ba. In an exemplary embodiment, the second semiconductor layer 32 may be p-GaN doped with p-type Mg. A length of the second semiconductor layer 32 in the one direction may be in the range of, but is not limited to, about 0.05 to about 0.10 μm.

Although each of the first semiconductor layer 31 and the second semiconductor layer 32 is shown as being composed of one layer, the present disclosure is not limited thereto. According to other embodiments, each of the first semiconductor layer 31 and the second semiconductor layer 32 may include more layers, for example, may further include a clad layer or a tensile strain barrier reducing (TSBR) layer depending on the material of the active layer 36.

The active layer 36 is disposed between the first semiconductor layer 31 and the second semiconductor layer 32.

The active layer 36 may include a material having a single or multiple quantum well structure. When the active layer 36 includes a material having a multiple quantum well structure, it may have a structure in which a plurality of quantum layers and a plurality of well layers are alternately stacked on each other. The active layer 36 may emit light through combination of electron-hole pairs according to electrical signals received through the first semiconductor layer 31 and the second semiconductor layer 32. For example, when the active layer 36 emits light in the blue wavelength band, it may include a material, such as AlGaN or AlGaInN. When the active layer 36 has a multiple quantum well structure in which a quantum layer and a well layer are alternately stacked on each other, the quantum layer may include a material, such as AlGaN or AlGaInN, and the well layer may include a material, such as GaN or AlInN. In an exemplary embodiment, the active layer 36 may include AlGaInN as a quantum layer and AlInN as a well layer to emit blue light having a central wavelength band in a range of about 450 nm to about 495 nm as described above.

However, the present disclosure is not limited thereto, and the active layer 36 may also have a structure in which a semiconductor material having a large band gap energy and a semiconductor material having a small band gap energy are alternately stacked on each other or may include different group 3 to 5 semiconductor materials depending on the wavelength band of light that it emits. Light emitted from the active layer 36 is not limited to light in the blue wavelength band. In some embodiments, the active layer 36 may emit light in a red or green wavelength band. A length of the active layer 36 in the one direction may be in a range of, but is not limited to, about 0.05 μm to about 0.10 μm.

Light emitted from the active layer 36 may be radiated not only to outer surfaces of both ends of the light emitting element ED in a longitudinal direction but also to the side surface. That is, the direction of light emitted from the active layer 36 is not limited to one direction.

The element electrode layer 37 may be disposed on the second semiconductor layer 32. The element electrode layer 37 may be an ohmic contact electrode. However, the present disclosure is not limited thereto, and the element electrode layer 37 may also be a Schottky contact electrode. The light emitting element ED may include at least one element electrode layer 37. Although the light emitting element ED shown in FIG. 7 includes one element electrode layer 37, the present disclosure is not limited thereto. In some embodiments, the light emitting element ED may include more element electrode layers 37.

When the light emitting element ED is electrically connected to an electrode or a contact electrode in the display device 10 according to the embodiment, the element electrode layer 37 may reduce the resistance between the light emitting element ED and the electrode or the contact electrode. The element electrode layer 37 may include a conductive metal. For example, the element electrode layer 37 may include at least one of any of aluminum (Al), titanium (Ti), indium (In), gold (Au), silver (Ag), indium tin oxide (ITO), indium zinc oxide (IZO), and indium tin zinc oxide (ITZO). In addition, the element electrode layer 37 may include an n-type or p-type doped semiconductor material. The element electrode layer 37 may include the same material or different materials, but the present disclosure is not limited thereto.

In an embodiment, the element electrode layer 37 may include a transparent conductive material so that light emitted from the active layer 36 can be smoothly emitted to both ends of the light emitting element ED. For example, the element electrode layer 37 may include ITO. A thickness of the element electrode layer 37 in the one direction may be in a range of, but is not limited to, about 0.09 µm to about 0.14 µm. The one direction may be the direction in which the light emitting element ED extends.

The element insulating film 38 surrounds side surfaces of the semiconductor layers 31 and 32 and the element electrode layer 37. In an exemplary embodiment, the element insulating film 38 may surround the side surface of at least the active layer 36 and extend in the one direction in which the light emitting element ED extends. The element insulating film 38 may protect the first semiconductor layer 31, the second semiconductor layer 32, the active layer 36, and the element electrode layer 37. For example, the element insulating film 38 may surround the side surfaces of the first semiconductor layer 31, the second semiconductor layer 32, the active layer 36, and the element electrode layer 37 but may expose both ends (e.g., opposite ends) of the light emitting element ED in the longitudinal direction.

In the drawing, the element insulating film 38 extends in the longitudinal direction of the light emitting element ED to completely cover the side surfaces of the first semiconductor layer 31 to the side surfaces of the element electrode layer 37. However, the present disclosure is not limited thereto, and the element insulating film 38 may cover the side surfaces of only some semiconductor layers as well as the active layer 36 or may only partially cover the side surfaces of the element electrode layer 37 to partially expose the side surfaces of the element electrode layer 37. In addition, an upper surface of the element insulating film 38 may be rounded in a cross-sectional view in an area adjacent to at least one end of the light emitting element ED.

A thickness of the element insulating film 38 may be in a range of, but is not limited to, about 10 nm to about 1.0 µm. In one embodiment, the thickness of the element insulating film 38 may be about 40 nm.

The element insulating film 38 may include a material having insulating properties, such as silicon oxide ($SiO_x$), silicon nitride ($SiN_x$), silicon oxynitride ($SiO_xN_y$), aluminum nitride (AlN), or aluminum oxide ($Al_2O_3$). Accordingly, the element insulating film 38 can prevent (or substantially prevent) an electrical short circuit that may occur when the active layer 36 directly contacts an electrode that transmits an electrical signal to the light emitting element ED. In addition, because the element insulating film 38 protects the outer surface of the light emitting element ED including the active layer 36, the luminous efficiency may not be reduced (or may not be substantially reduced).

In some embodiments, an outer surface of the element insulating film 38 may be treated. The light emitting elements ED dispersed in an ink may be sprayed onto electrodes and then aligned. The surface of the element insulating film 38 may be hydrophobic or hydrophilic-treated so that the light emitting element ED is kept separate in the ink without being agglomerated with other adjacent light emitting elements ED (e.g., so that the light emitting elements ED do not coalesce in the ink).

A length l of the light emitting element ED may be in a range of about 1 µm to about 10 µm or about 2 µm to about 6 µm and, in some embodiments, may be in a range of about 3 µm to about 5 µm. In addition, a diameter of the light emitting element ED may be in the range of about 30 nm to about 700 nm, and an aspect ratio of the light emitting element ED may be about 1.2 to about 100. However, the present disclosure is not limited thereto, and a plurality of light emitting elements ED included in the display device 10 may also have different diameters according to a difference in the composition of the active layer 36. In one embodiment, the diameter of the light emitting element ED may be about 500 nm.

Figure 8:
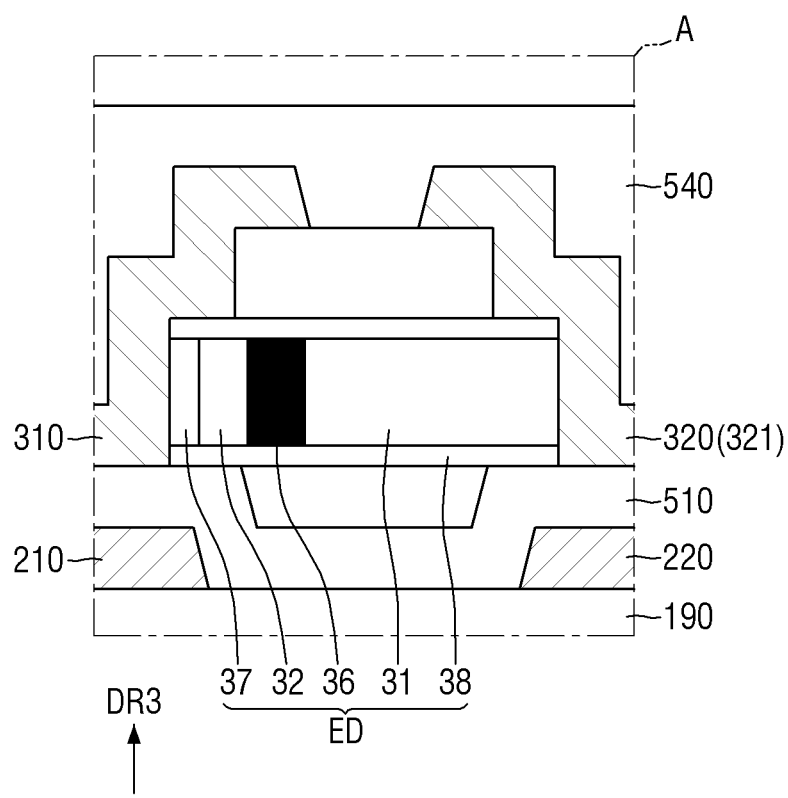
FIG. 8 is an enlarged cross-sectional view of the area A of FIG. 4A.

FIG. 8 is an enlarged cross-sectional view of the area A of FIG. 4A.

Referring to FIG. 8, both ends of a first light emitting element ED may contact at least one of the contact electrodes 310 through 340. A plurality of layers included in the first light emitting element ED disposed in the first alignment area AA1 and the first contact electrode 310 and the second contact electrode 320 contacting both ends of the first light emitting element ED will now be described in more detail.

The first contact electrode 310 may contact the first end of the first light emitting element ED disposed in the first alignment area AA1. In an exemplary embodiment, the element electrode layer 37 may be located at the first end of the first light emitting element ED, and the first semiconductor layer 31 may be disposed at the second end of the first light emitting element ED. The element insulating film 38 may be disposed on the outer surface of the first light emitting element ED. The element electrode layer 37 located at the first end of the first light emitting element ED and the first semiconductor layer 31 located at the second end of the first light emitting element ED may be surfaces exposed without being covered by the element insulating film 38. Therefore, the first contact electrode 310 may contact the element electrode layer 37 of the first light emitting element ED, and the second contact electrode 320 (e.g., a first area 321 of the second contact electrode 320) may contact the first semiconductor layer 31 of the first light emitting element ED.

The first contact electrode 310 and the second electrode 320 (e.g., the first area 321 of the second contact electrode 320) disposed on the first insulating layer 510 may be spaced apart from each other on the first insulating layer 510.

Figure 9:
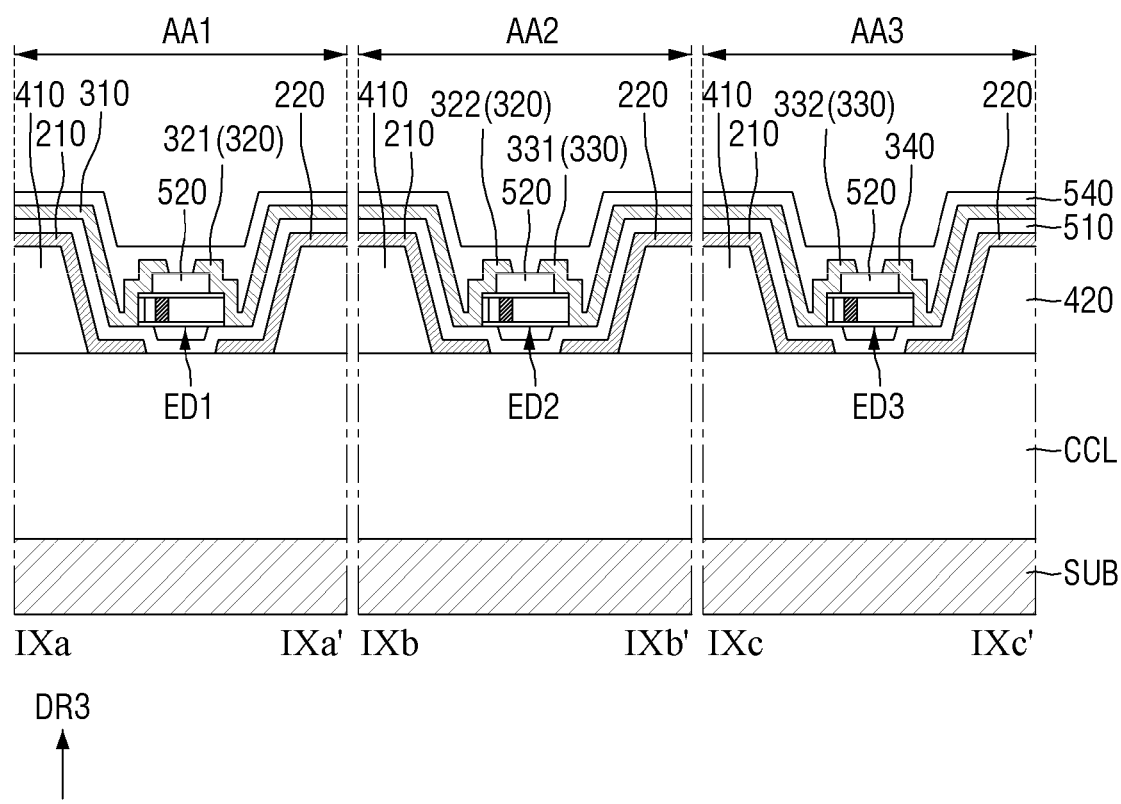
FIG. 9 is a cross-sectional view taken along the lines IXa-IXa', IXb-IXb', and IXc-IXc' of FIG. 3.

FIG. 9 is a cross-sectional view taken along the line IXa-IXa', the line IXb-IXb', and the line IXc-IXc' of FIG. 3. In the following cross-sectional views of the display device, a detailed structure of the circuit element layer CCL is omitted for ease of description.

The series connection of the first through third light emitting elements ED1 through ED3 respectively disposed in the first through third alignment areas AA1 through AA3 will now be described in more detail with reference to FIG. 9, in conjunction with FIG. 3. For ease of description, in FIG. 9, the first through third light emitting elements ED1 through ED3 respectively disposed in the first through third alignment areas AA1 through AA3 are indicated by reference characters ED1 through ED3, respectively.

The first contact electrode 310 may contact the first end of the first light emitting element ED1 in the first alignment area AA1. The first contact electrode 310 may contact the first electrode 210 through the first opening OP1. For example, the first contact electrode 310 may contact the first electrode 210 and the first end of the first light emitting element ED1.

The second contact electrode 320 may contact the second end of the first light emitting element ED1 and the first end of the second light emitting element ED2 in the first and second alignment areas AA1 and AA2, respectively. For example, in the first alignment area AA1, the first area 321 of the second contact electrode 320 may contact the second end of the first light emitting element ED1. In the second alignment area AA2, the second area 322 of the second contact electrode 320 may contact the first end of the second light emitting element ED2. The first area 321 and the second area 322 of the second contact electrode 320 may be electrically connected to each other by the third area 323 of the second contact electrode 320 disposed in the non-alignment area NAA located between the first and second alignment areas AA1 and AA2.

The third contact electrode 330 may contact the second end of the second light emitting element ED2 and the first end of the third light emitting element ED3 in the second and third alignment areas AA2 and AA3, respectively. For example, in the second alignment area AA2, the first area 331 of the third contact electrode 330 may contact the second end of the second light emitting element ED2. In the third alignment area AA3, the second area 332 of the third contact electrode 330 may contact the first end of the third light emitting element ED3. The first area 331 and the second area 332 of the third contact electrode 330 may be electrically connected to each other by the third area 333 of the third contact electrode 330 disposed in the non-alignment area NAA located between the second and third alignment areas AA2 and AA3.

In the third alignment area AA3, the fourth contact electrode 340 may contact the second end of the third light emitting element ED3. The fourth contact electrode 340 may contact the second electrode 220 through the second opening OP2. For example, the fourth contact electrode 340 may contact the second electrode 220 and the second end of the third light emitting element ED3.

The first power supply voltage applied from the first voltage wiring VL1 may be transmitted to the first end of the first light emitting element ED1 through the first contact electrode 310, and the second electrode 220 to which the second power supply voltage is applied through the second voltage wiring VL2 may transmit the second power supply voltage to the second end of the third light emitting element ED3 through the fourth contact electrode 340. Therefore, an electrical signal transmitted to the first light emitting element ED1 through the first contact electrode 310 by a difference between the first power supply voltage and the second power supply voltage may be transmitted along the first light emitting element ED1, the second contact electrode 320, the second light emitting element ED2, the third contact electrode 330, the third light emitting element ED3, and the fourth contact electrode 340.

According to an embodiment, the light emitting elements ED (ED1 through ED3) disposed in the alignment areas AA of each subpixel SPX may be connected to each other in series through the contact electrodes 310 through 340.

When any one of a plurality of light emitting elements ED disposed in the same alignment area AA short-circuits due to a defect, a current flows through the defective light emitting element ED in the alignment area AA including the defective light emitting element ED. Therefore, normal (e.g., operable) light emitting elements ED may not emit light because no electrical signal is transmitted to the normal light emitting elements ED. For example, when any one of the first light emitting elements ED1 disposed in the first light emitting area AA1 short-circuits, other normal first light emitting elements ED1 disposed in the first alignment area AA1 may not emit light because no current flows through the normal first light emitting elements ED1. However, even in this case, electrical signals may be transmitted to the second and third light emitting elements ED2 and ED3 disposed in the second and third alignment area AA2 and AA3 and connected to each other in series. Therefore, the second and third light emitting elements ED2 and ED3 disposed in the second alignment area AA2 and the third alignment area AA3 may emit light.

For example, when the light emitting elements ED disposed in a plurality of alignment areas AA (AA1 through AA3) of one subpixel SPX are connected to each other in series, even if a defective light emitting element ED is disposed in any one of the alignment areas AA, light may be emitted by the light emitting elements ED disposed in the other alignment areas AA. In addition, because the first through third light emitting elements ED1 through ED3 respectively disposed in the first through third alignment areas AA1 through AA3 are connected to each other in series, the luminous efficiency can be further improved.

Figure 10:
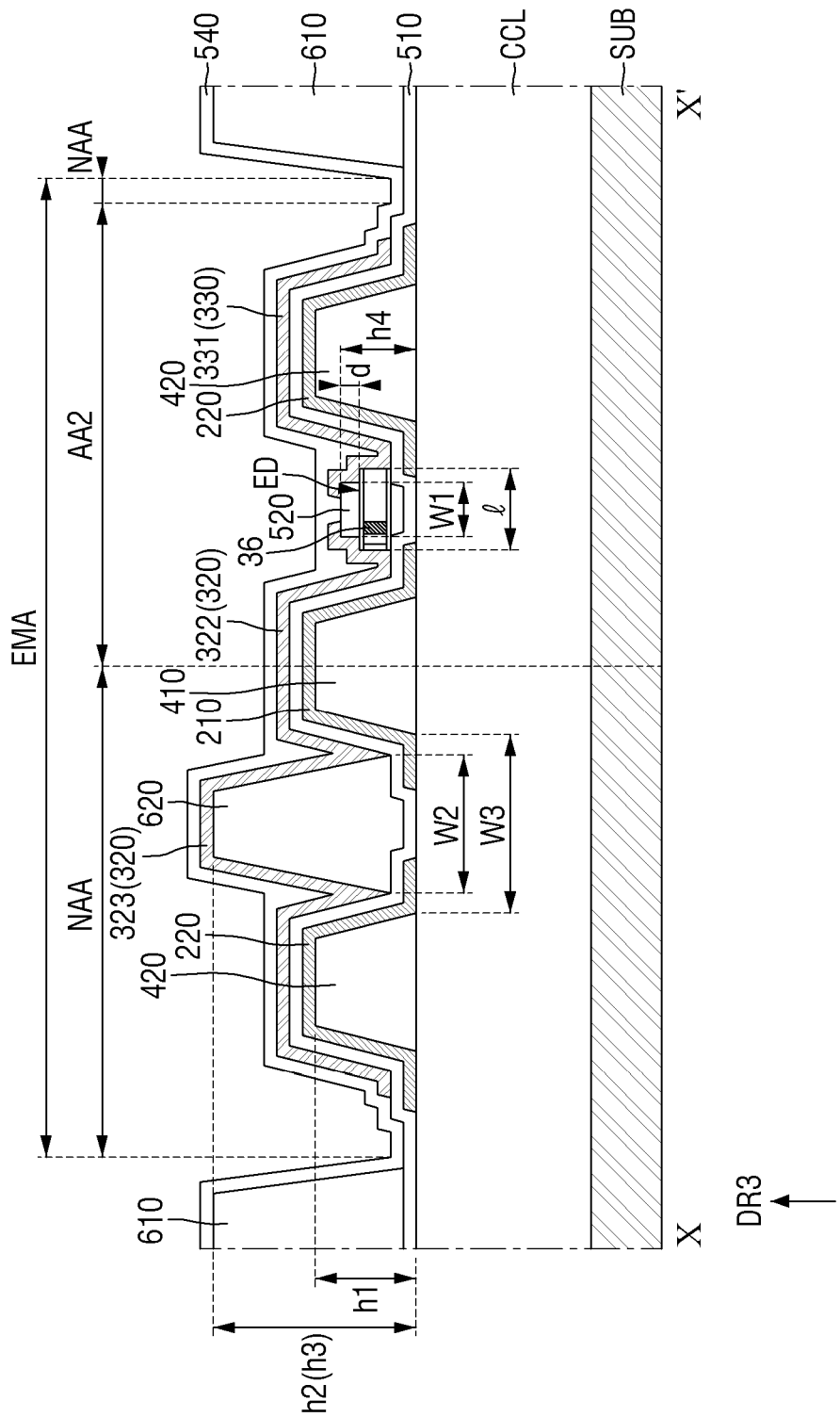
FIG. 10 is a cross-sectional view taken along the line X-X' of FIG. 3.

FIG. 10 is a cross-sectional view taken along the line X-X' of FIG. 3.

The relationship between heights (or thicknesses) and widths of the first bank 610, the second banks 410 and 420, and the second insulating layer 520 will now be described in more detail with reference to FIG. 10. In FIG. 10, the circuit element layer CCL disposed on the substrate SUB is illustrated and described as the circuit element layer CCL with some of the above-described layers omitted for ease of description. The relative heights of the first bank 610, the second banks 410 and 420, and the second insulating layer 520 may be compared based on a distance measured in the third direction DR3 from a flat reference surface that doesn't have an underlying stepped structure (e.g., the upper surface of the via layer 190 of the circuit element layer CCL or an upper surface of the substrate SUB) to an upper surface of each member.

A height h2 of the first bank 610 may be greater than a height h1 of each second bank 410 or 420. The height h2 of the first bank 610 may be greater than a height h4 of the second insulating layer 520. The height h2 of the first bank 610 may be greater than or equal to a height h3 of each alignment control pattern 620. Because the height h2 of the first bank 610 is greater than those other members, it is possible to prevent (or substantially prevent) an ink I (see, e.g., FIG. 13) from overflowing from one subpixel SPX to adjacent subpixels SPX during an inkjet process to be described in more details below.

Because the height h2 of the first bank 610 and the height h3 of each alignment control pattern 620 are greater than the height h1 of each second bank 410 or 420, the light emitting elements ED may be efficiently prevented from being disposed between the second banks 410 and 420 in the non-alignment area NAA.

Without being limited to the following examples, the height h1 of each second bank 410 or 420 may be in a range of about 1.8 μm to about 2 μm, and the height h2 of the first bank 610 may be greater than the height h1 of each second bank 410 or 420 within the range of about 2 μm to about 3 μm. In an exemplary embodiment in which the second insulating layer 520 includes an inorganic insulating material, a thickness d of the second insulating layer 520 may be in a range of about 0.3 μm to about 0.5 μm, and the height h4 of the second insulating layer 520 may be equal to or greater than the sum of the thickness d of the second insulating layer 520 and a diameter of each light emitting element ED or may be equal to or smaller than the height h1 of each second bank 410 or 420.

A width W1 of the second insulating layer 520 in the first direction DR1 may be smaller than the length l of each light emitting element ED. Because the width W1 of the second insulating layer 520 in the first direction DR1 is smaller than the length l of each light emitting element ED, both ends of each light emitting element ED may be exposed by the second insulating layer 520.

A width W2 of each alignment control pattern 620 in the first direction DR1 may be smaller than a gap W3 in the first direction DR1 between the first and second sub banks 410 and 420 disposed adjacent to each other. The width W2 of each alignment control pattern 620 in the first direction DR1 may be greater than the length I of each light emitting element ED. Therefore, the width W2 of each alignment control pattern 620 in the first direction DR1 may be greater than the width W1 of the second insulating layer 520 disposed on the light emitting elements ED.

Because the width W2 of each alignment control pattern 620 in the first direction DR1 is smaller than the gap W3 between the first and second sub banks 410 and 420 in the first direction DR1, each alignment control pattern 620 may not overlap the first and second sub banks 410 and 420 in the third direction DR3. However, even in such an embodiment, each alignment control pattern 620 may be disposed between the first and second sub banks 410 and 420 to overlap the first insulating layer 510 exposed by the first and second sub banks 410 and 420 in the third direction DR3, thereby preventing (or substantially preventing) the light emitting elements ED from being aligned (or seated) between the second banks 410 and 420.

A process of manufacturing the display device 10 according to an embodiment will now be described with reference to FIGS. 11 through 17.

Figure 11:
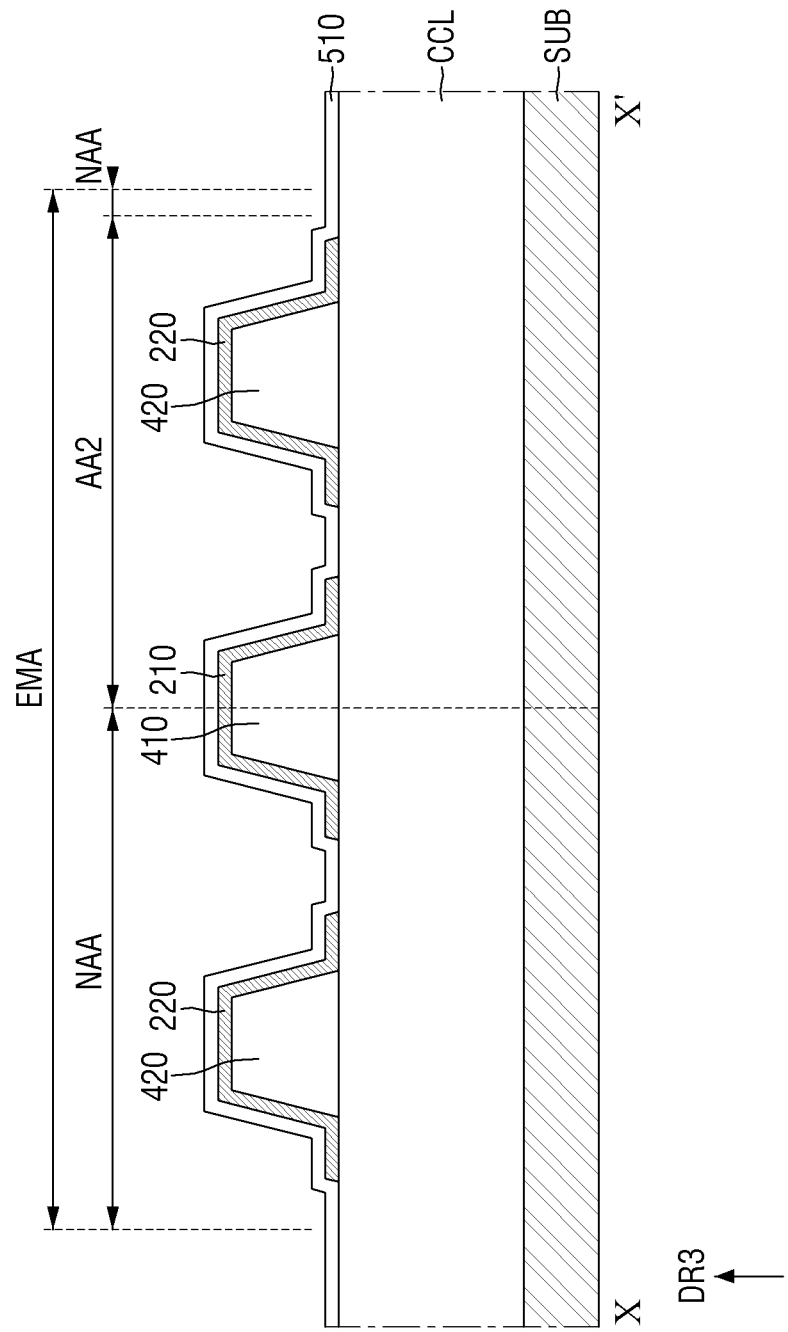
FIGS. 11 through 13 are cross-sectional views illustrating some steps of a process of manufacturing a display device according to an embodiment.
Figure 12:
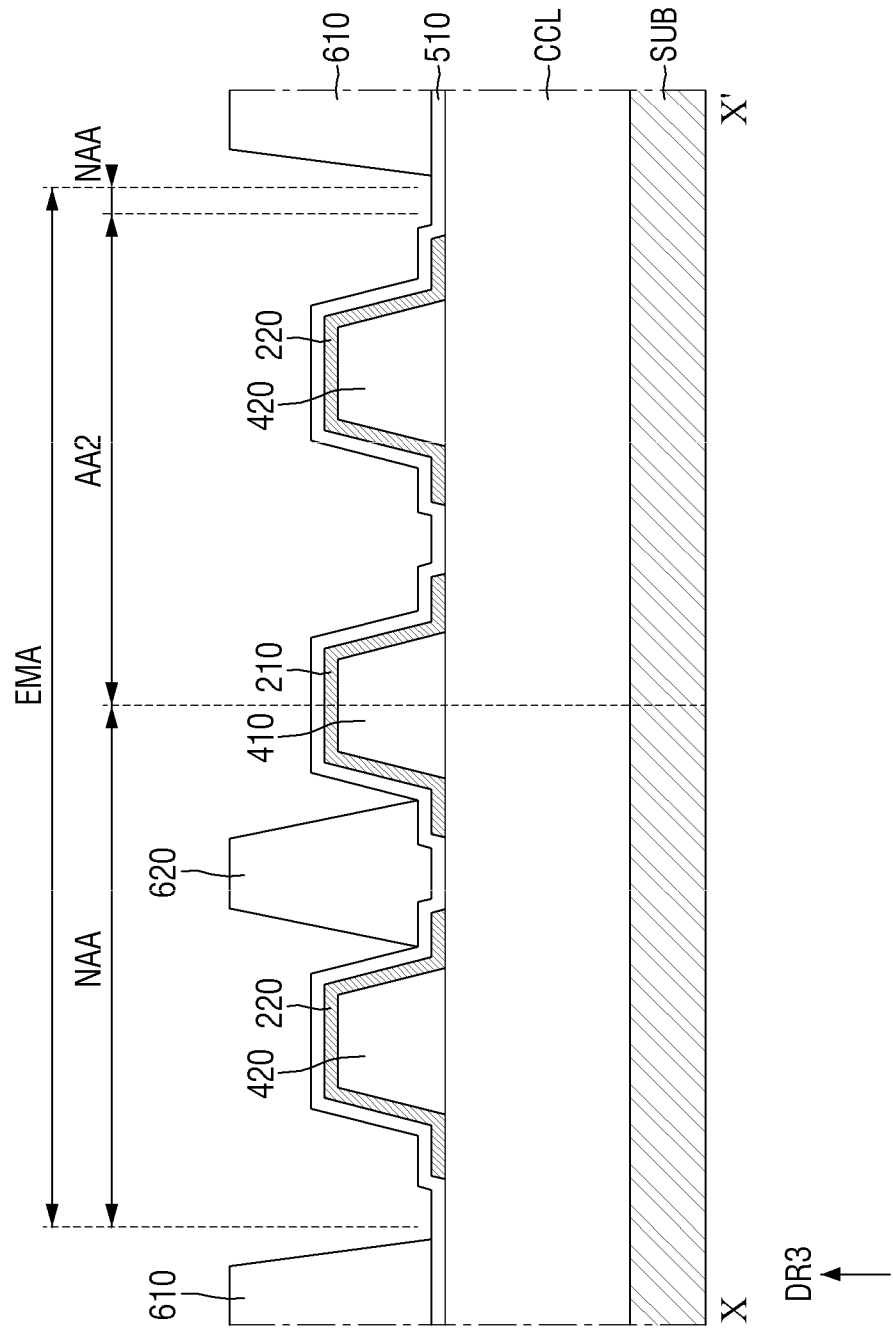
Figure 13:
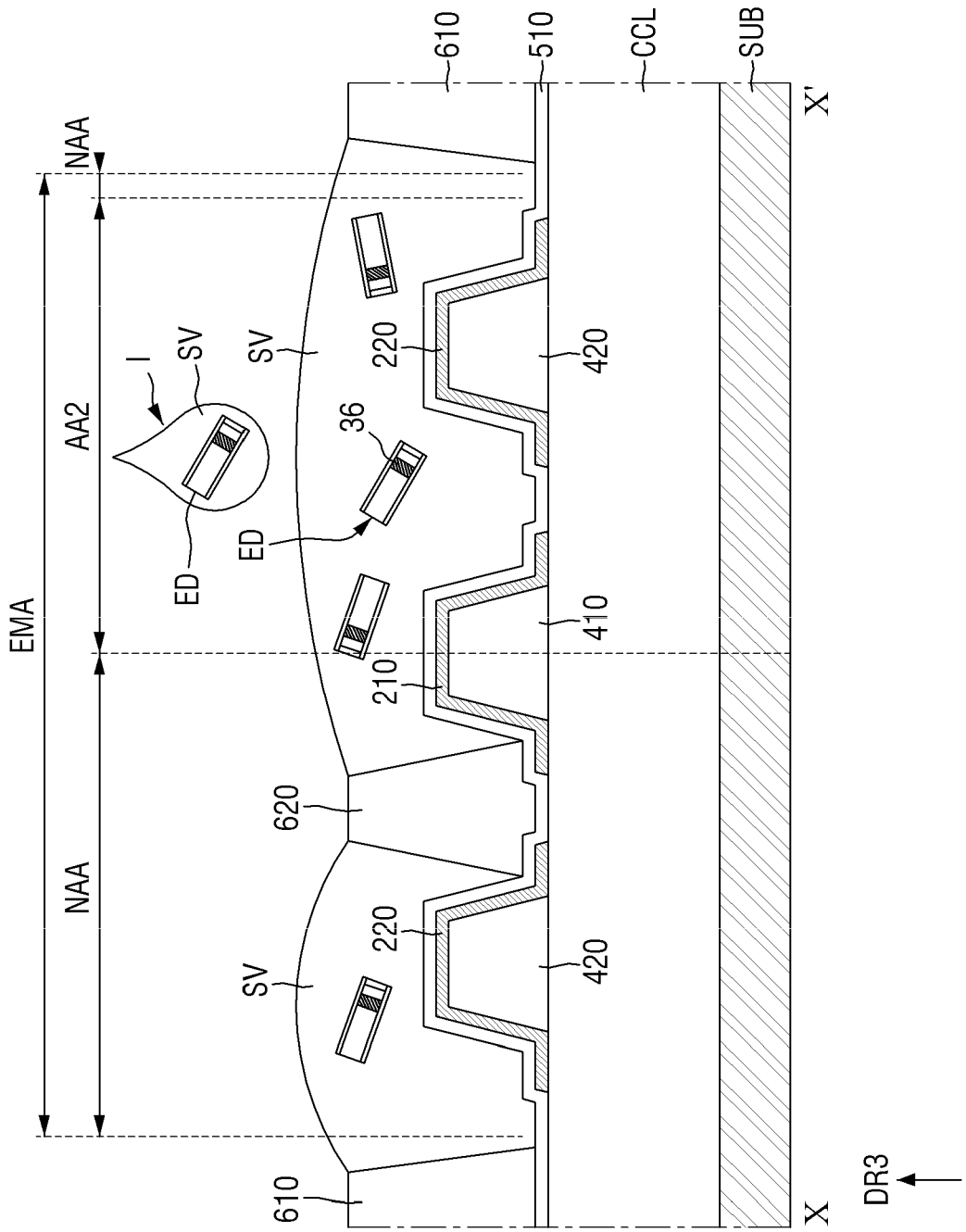
Figure 14:
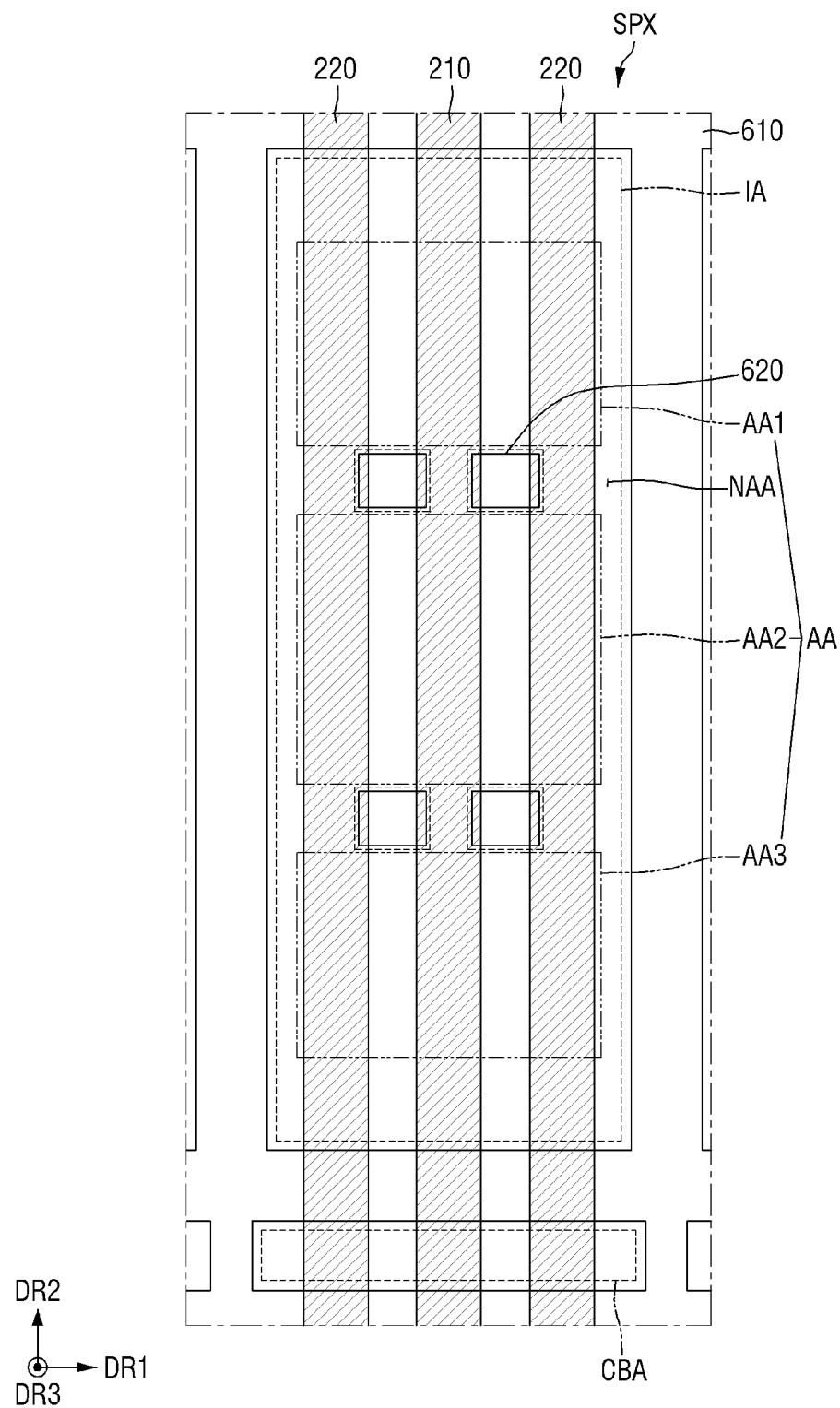
FIG. 14 is a plan layout view of a subpixel shown in FIG. 13.
Figure 15:
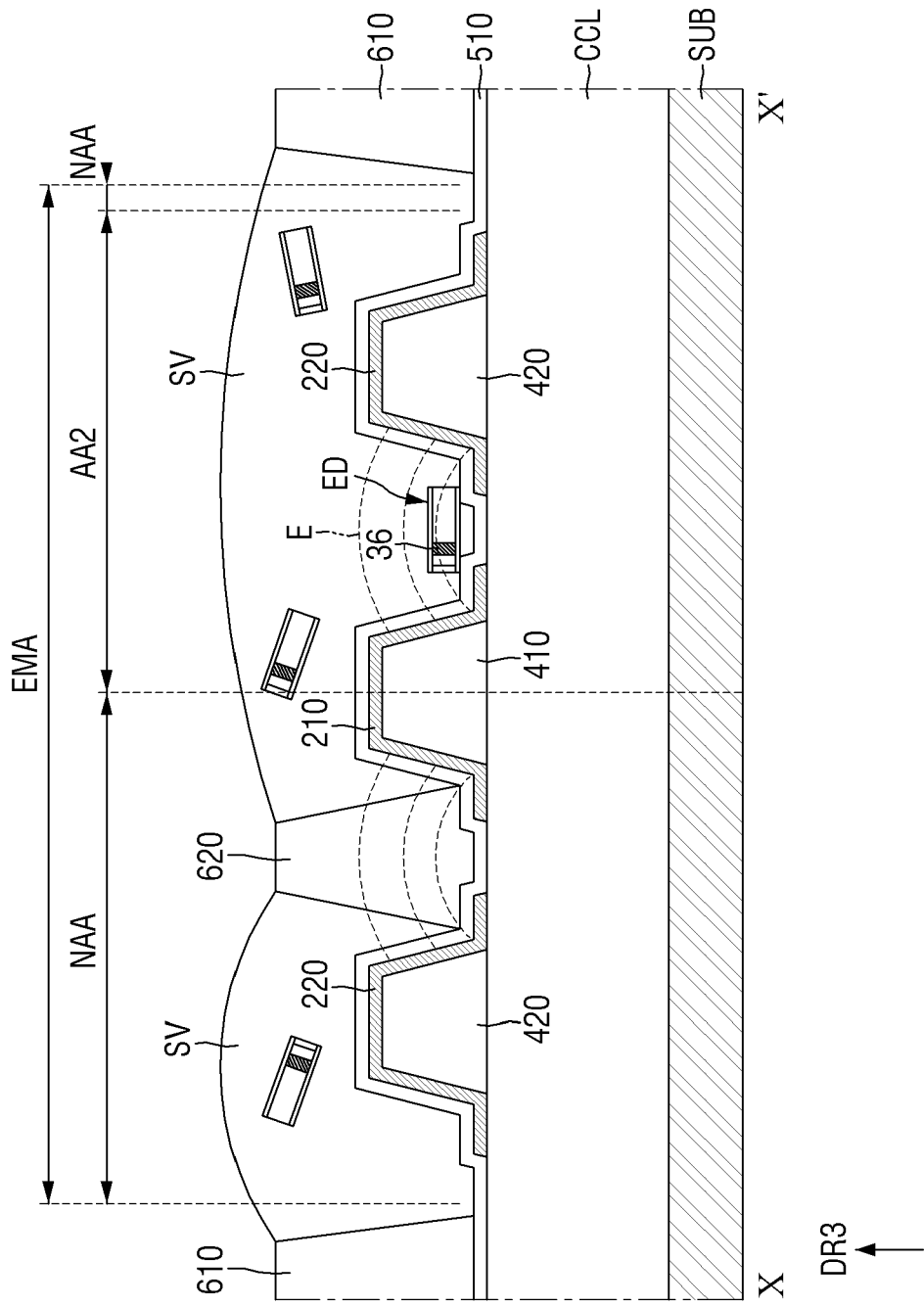
FIGS. 15 through 17 are cross-sectional views illustrating some steps of the process of manufacturing a display device according to an embodiment.
Figure 16:
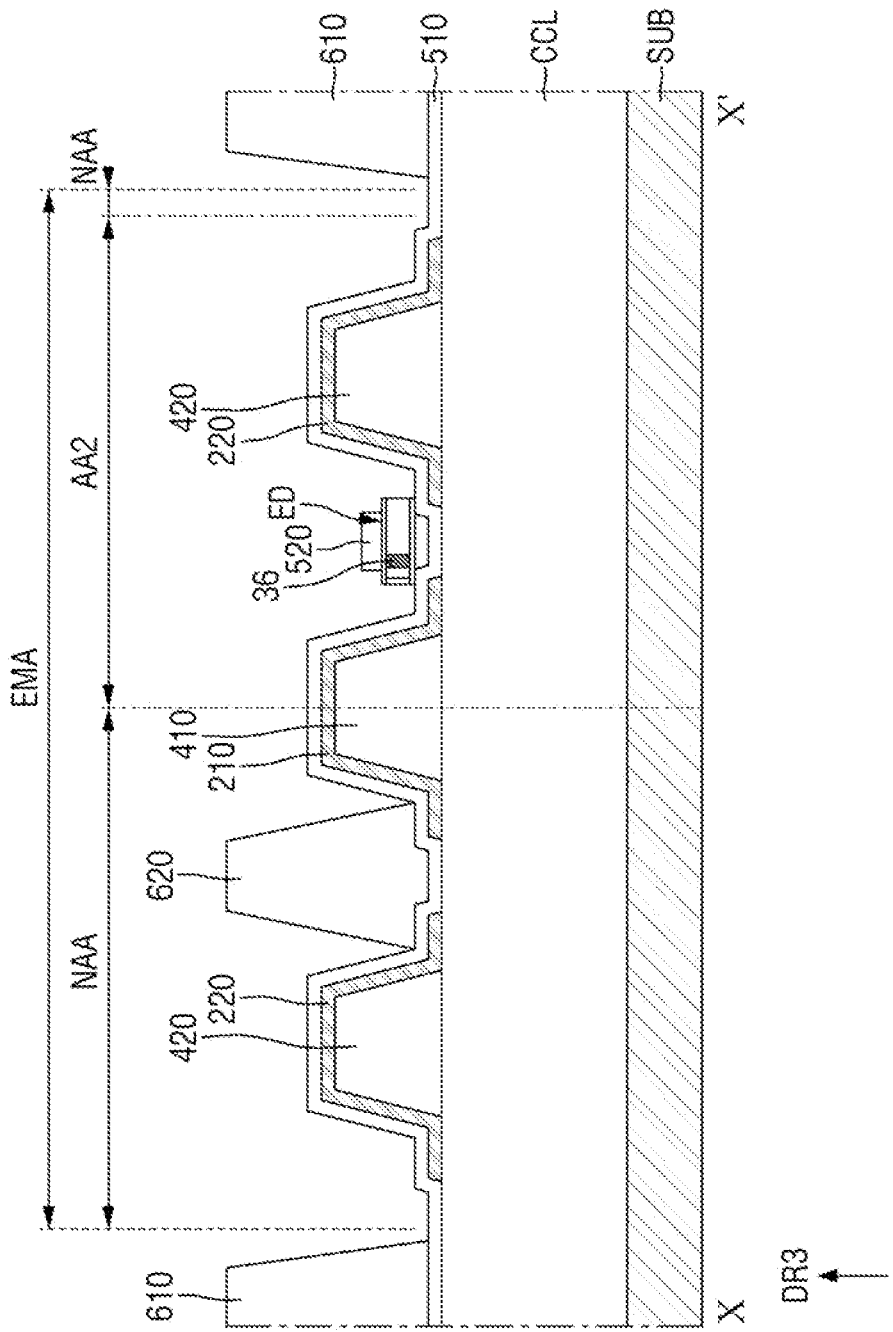
Figure 17:
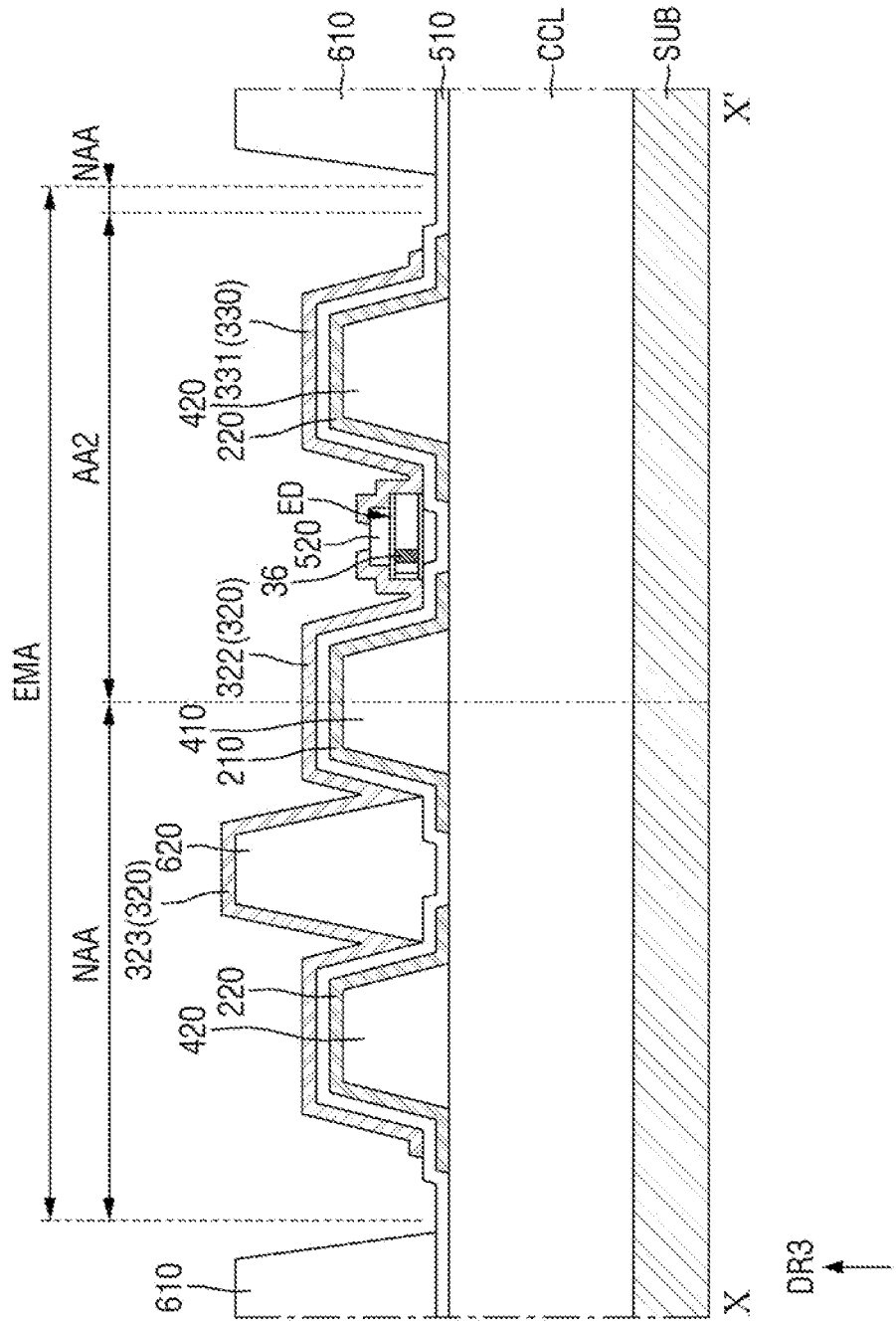

FIGS. 11 through 13 are cross-sectional views illustrating some steps of a process of manufacturing a display device according to an embodiment. FIG. 14 is a plan layout view of a subpixel SPX in the manufacturing process shown in FIG. 13. FIGS. 15 through 17 are cross-sectional views illustrating some steps of the process of manufacturing a display device according to an embodiment.

First, referring to FIG. 11, a substrate SUB is prepared, and a plurality of electrodes 210 and 220 are formed on the substrate SUB.

The electrodes 210 and 220 may include a first electrode 210 and second electrodes 220 spaced apart and facing each other. A plurality of second banks 410 and 420 disposed between the first and second electrodes 210 and 220 and the substrate SUB may be further disposed on the substrate SUB. The second banks 410 and 420 may include a first sub bank 410 disposed between the first electrode 210 and the substrate SUB and second sub banks 420 disposed between the second electrodes 220 and the substrate SUB.

The circuit element layer CCL disposed on the substrate SUB may include a plurality of conductive layers and a plurality of insulating layers as described above. For ease of description, the circuit element layer CCL is schematically illustrated and described as the circuit element layer CCL without showing the individual layers thereof.

Next, a first insulating layer 510 may be formed on the electrodes 210 and 220. The first insulating layer 510 may be formed on the entire substrate SUB to cover all of the electrodes 210 and 220 and then may be partially removed before a process of forming a plurality of contact electrodes 310 through 340. For example, the first insulating layer 510 may be patterned in a subsequent process to form first and second openings OP1 and OP2 exposing upper surfaces of the electrodes 210 and 220 in areas overlapping first and second contact openings CT1 and CT2 disposed in a non-alignment area NAA in the third direction DR3. Thus, the first insulating layer 510 may partially expose the upper surfaces of the first and second electrodes 210 and 220. The patterning of the first insulating layer 510 may result in the structures of FIGS. 4A through 6B. The arrangement and structure of each member are the same as those described above, and thus, the formation order of each member will not be described again.

Next, referring to FIG. 12, a first bank 610 and alignment control patterns 620 spaced apart from the first bank 610 are formed on the first insulating layer 510. The first bank 610 and the alignment control patterns 620 may be disposed on the first insulating layer 510 in the non-alignment area NAA. The first bank 610 and the alignment control patterns 620 may be formed through the same mask process. The first bank 610 and the alignment control patterns 620 may include the same material. For example, the first bank 610 and the alignment control patterns 620 may include, but are not limited to, polyimide (PI).

For example, the first bank 610 and the alignment control patterns 620 may be formed by coating an organic material layer on the substrate SUB and then exposing and developing the organic material layer to form an opening that exposes an area excluding a boundary area of a subpixel SPX and an area between the first and second electrodes 210 and 220 disposed in the non-alignment area NAA located between alignment areas AA1 through AA3.

Next, referring to FIGS. 13 and 14, an ink I, in which light emitting elements ED are dispersed, is sprayed to an ink impact area IA on the substrate SUB. The ink I may include a solvent SV and a plurality of light emitting elements ED included in the solvent SV. For example, the ink I including the solvent SV and the light emitting elements ED dispersed in the solvent SV may be sprayed onto the ink impact area IA on the substrate SUB by using, for example, an inkjet printing device.

The ink impact area IA may be an area excluding areas (e.g., areas other than) where the alignment control patterns 620 are disposed in an area surrounded by the first bank 610. The ink impact area IA may include a first alignment area AA1, a second alignment area AA2, a third alignment area AA3, and areas connecting them (or between them) in the second direction DR2. The areas connecting the first through third alignment areas AA1 through AA3 may include an area between the first bank 610 and each alignment control pattern 620 and an area between the alignment control patterns 620.

The ink I sprayed into the ink impact area IA on the substrate SUB in a printing process by using, for example, the inkjet printing device may be evenly spread in the ink impact area IA. Even if the ink I sprayed to the ink impact area IA impacts on any one of the first through third alignment areas AA1 through AA3, it may move to other alignment areas due to the fluidity of the solvent SV included in the ink I.

According to an embodiment, the first bank 610 and the alignment control patterns 620 disposed in each subpixel SPX may induce the ink I in which the light emitting elements ED are dispersed to move to or settle in the first through third alignment areas AA1 through AA3. The solvent SV of the ink I may be hydrophilic, and the first bank 610 and/or the alignment control patterns 620 may include a hydrophobic material. Because the hydrophilic solvent is sprayed onto the first bank 610 and the alignment control patterns 620 including the hydrophobic material, the ink I may move to or settle in the ink impact area IA defined by the first bank 610 and the alignment control patterns 620.

In the illustrated embodiment, even if the ink I is not sprayed to each of the first through third alignment areas AA1 through AA3, because the ink impact area IA is formed such that the first through third alignment areas AA1 through AA3 are connected by the first bank 610 and the patterned alignment control patterns 620, the impact of the ink I may be easily controlled. For example, even if the ink I is sprayed (or impacted) to any area in the ink impact area IA, the ink I may move to within the ink impact area IA and to the first through third alignment areas AA1 through AA3. Therefore, an impact position of the ink I on the substrate SUB may be easily controlled, thereby increasing the manufacturing process efficiency of the inkjet process during the manufacturing process of the display device 10.

In addition, because the first bank 610 is formed having a height h2 that is greater than a height h1 of each second bank 410 or 420, the first bank 610 may prevent (or substantially prevent) the ink I from overflowing to neighboring subpixels SPX.

Next, referring to FIG. 15, alignment signals are transmitted to the electrodes 210 and 220 to align the light emitting elements ED on the electrodes 210 and 220. For example, the light emitting elements ED are aligned between the first and second electrodes 210 and 220 disposed in the first through third alignment areas AA1 through AA3.

When the alignment signals are transmitted to the electrodes 210 and 220, an electric field E may be generated in the ink I sprayed onto the first and second electrodes 210 and 220 in the area between the first and second electrodes 210 and 220. When the electric field E is generated between the first and second electrodes 210 and 220 in the area between the first and second electrodes 210 and 220, the light emitting elements ED dispersed in the ink I may be subjected to a dielectrophoretic force due to the electric field E. The light emitting elements ED subjected to the dielectrophoretic force may be seated (or aligned) between the first and second electrodes 210 and 220 while their orientation direction and position are changed from their deposited orientation.

In the illustrated embodiment, when the light emitting elements ED are aligned (or seated) between the first and second electrodes 210 and 220 by the dielectrophoretic force due to the electric field E, they may be disposed between the first and second electrodes 210 and 220 disposed in the first through third alignment areas AA1 through AA3 but may not be disposed in the non-alignment area NAA. For example, the alignment control patterns 620 may be disposed between the first and second electrodes 210 and 220 disposed in the non-alignment area NAA, and the light emitting elements ED may be disposed between the first and second electrodes 210 and 220 but may not be disposed in the non-alignment area NAA due to the alignment control patterns 620.

Because the alignment control patterns 620 are disposed between the first and second electrodes 210 and 220 disposed in the non-alignment area NAA, the light emitting elements ED are not aligned (or seated) in the non-alignment area NAA. Therefore, the number of the light emitting elements ED that are lost (e.g., the number of light emitting elements ED that are not connected to the first and second electrodes 210 and 220) can be reduced. As described above, only series connection electrodes (e.g., the third areas 323 and 333 of the second and third contact electrodes 320 and 330) may be disposed in the non-alignment area NAA located between the alignment areas AA1 through AA3. Thus, the light emitting elements ED may not emit light even if they are disposed in the non-alignment area NAA. Hence, the alignment control patterns 620 may be disposed between the alignment areas AA1 through AA3 to prevent (or substantially prevent) the light emitting elements ED from being aligned (or seated) in the non-alignment area NAA. This can reduce or minimize the number of the light emitting elements ED that are lost without being electrically connected.

After the light emitting elements ED are aligned between the electrodes 210 and 220, a process of cutting (or separating) each electrode 210 or 220 in a cut area CBA disposed between subpixels SPX neighboring in the second direction DR2 may be performed. Through the process of cutting each electrode 210 or 220, each electrode 210 or 220 extending to neighboring subpixels SPX as illustrated in FIG. 14 may be split as illustrated in FIG. 3.

Next, referring to FIG. 16, after the solvent SV of the ink I is removed (or evaporated), a second insulating layer 520 is formed. The process of removing the solvent SV may be performed through a conventional heat treatment or light irradiation process. The heat treatment or light irradiation process may be performed within a range in which the solvent SV (e.g., only the solvent SV) is removed without damaging the light emitting elements ED.

The second insulating layer 520 may fix the light emitting elements ED that are aligned between the first and second electrodes 210 and 220. That is, the initial positions of the light emitting elements ED when the second insulating layer 520 is formed thereof may not change in a subsequent process. The second insulating layer 520 may not be formed in the non-alignment area NAA located between the alignment areas AA1 through AA3. The second insulating layer 520 may not be disposed on the alignment control patterns 620.

Next, referring to FIG. 17, a plurality of contact electrodes 310 through 340 are formed on the second insulating layer 520. The contact electrodes 310 through 340 may be formed through the same (or substantially the same) process. In some embodiments, before the process of forming the contact electrodes 310 through 340, the upper surfaces of the first and second electrodes 210 and 220 may be exposed as illustrated in FIGS. 4A and 6A through the process of forming the first opening OP1 overlapping the first contact opening CT1 and the second openings OP2 overlapping the second contact openings CT2 in the first insulating layer 510 as described above. In some embodiments, the upper surfaces of the first and second electrodes 210 and 220 may be exposed as illustrated in FIGS. 4B and 6B through the process of forming, in the first insulating layer 510, a first opening OP1_1 exposing at least a part of an upper surface of the first sub bank 410 disposed in the first alignment area AA1 and a second opening OP2_1 exposing at least a part of an upper surface of each second sub bank 420 disposed in the third alignment area AA3.

Figure 18:
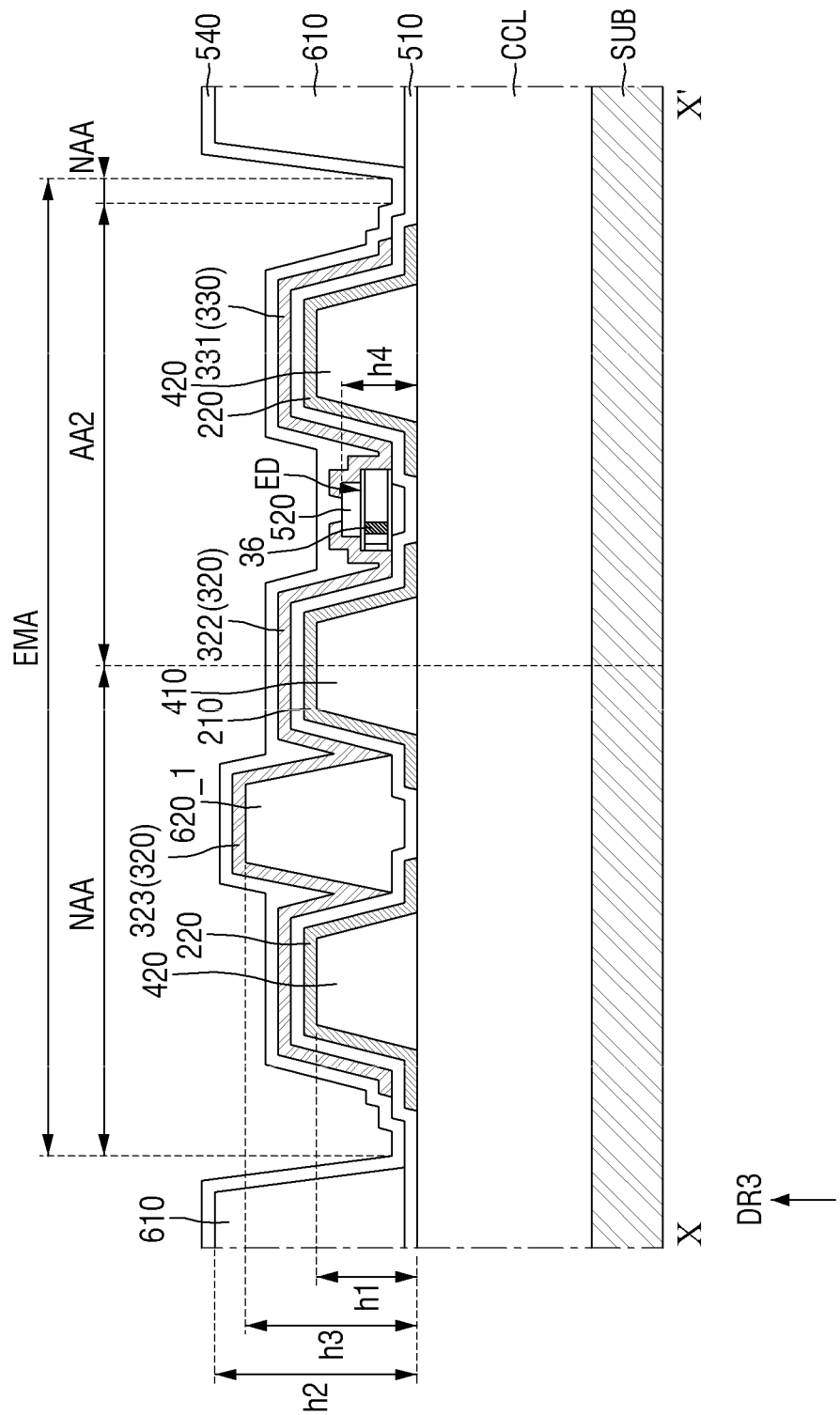
FIG. 18 is a cross-sectional view taken along the line X-X' of FIG. 3 according to another embodiment.

Next, a third insulating layer 540 may be formed on the entire surface of the substrate SUB to manufacture the display device 10 illustrated in FIG. 10 (see, e.g., FIG. 18).

Embodiments of the display device 10 will now be described with reference to other drawings. In the following embodiments, a redundant description of the same or substantially similar elements as those described above may be omitted or given briefly, and differences therebetween will be primarily described.

FIG. 18 is a cross-sectional view taken along the line X-X' of FIG. 3 according to another embodiment.

The display device 10 shown in FIG. 18 is different from the embodiment shown in FIG. 10 in that a height h2 of a first bank 610 included in a subpixel SPX is different from a height h3 of each alignment control pattern 620_1.

For example, the height h3 of each alignment control pattern 620_1 may be greater than a height h1 of each second bank 410 or 420 and smaller than the height h2 of the first bank 610.

Because the height h3 of each alignment control pattern 620_1 is greater than the height h1 of each second bank 410 or 420, light emitting elements ED may not be disposed between first and second sub banks 410 and 420 in the non-alignment area NAA.

Also, referring to FIG. 18 in conjunction with FIG. 3, because the height h3 of each alignment control pattern 620_1 is smaller than the height h2 of the first bank 610, steps (e.g., step height differences) of second and third contact electrodes 320 and 330 formed on the alignment control patterns 620_1 may be reduced. The steps of the second and third contact electrodes 320 and 330 formed on the alignment control patterns 620_1 may be reduced by a reduction in the height h3 of each alignment control pattern 620_1, thereby reducing defects in series connection electrodes which may be caused by the height h3 of each alignment control pattern 620_1 in the process of forming the contact electrodes 310 through 340 on the alignment control patterns 620_1. For example, it is possible to reduce the steps of the second and third contact electrodes 320 and 330 disposed in the non-alignment area NAA, that is, the steps of third areas 323 and 333 of the second and third contact electrodes 320 and 330, which are generated by the height h3 of each alignment control pattern 620_1 in the process of forming the second and third contact electrodes 320 and 330. By reducing steps of the third areas 323 and 333 of the second and third contact electrodes 320 and 330, defects of the contact electrodes may be reduced and a series connection defect between first through third light emitting elements ED may be prevented.

In the illustrated embodiment, the first bank 610 and the alignment control patterns 620_1 having different heights may be formed by the same mask process. For example, the first bank 610 and the alignment control patterns 620_1 may be formed by coating an organic material on a substrate SUB on which a first insulating layer 510 is formed and then exposing and developing the organic material. The first bank 610 and the alignment control patterns 620_1 having different heights may be formed using a halftone mask, a multi-tone mask, or a slit mask. However, the present disclosure is not limited thereto, and the first bank 610 and the alignment control patterns 620_1 may be sequentially formed using different masks.

In the illustrated embodiment, because the height h3 of each alignment control pattern 620_1 is greater than the height h1 of each second bank 410 or 420 and smaller than the height h2 of the first bank 610, the light emitting elements ED may not be aligned (or seated) in the non-alignment area NAA. This reduces the number of the light emitting elements ED that are lost while reducing defects of the series connection electrodes disposed on the alignment control patterns 620_1 to connect the respective light emitting elements ED of alignment areas AA (AA1 through AA3) to each other in series. Accordingly, the reliability of the display device 10 can be improved.

Figure 19:
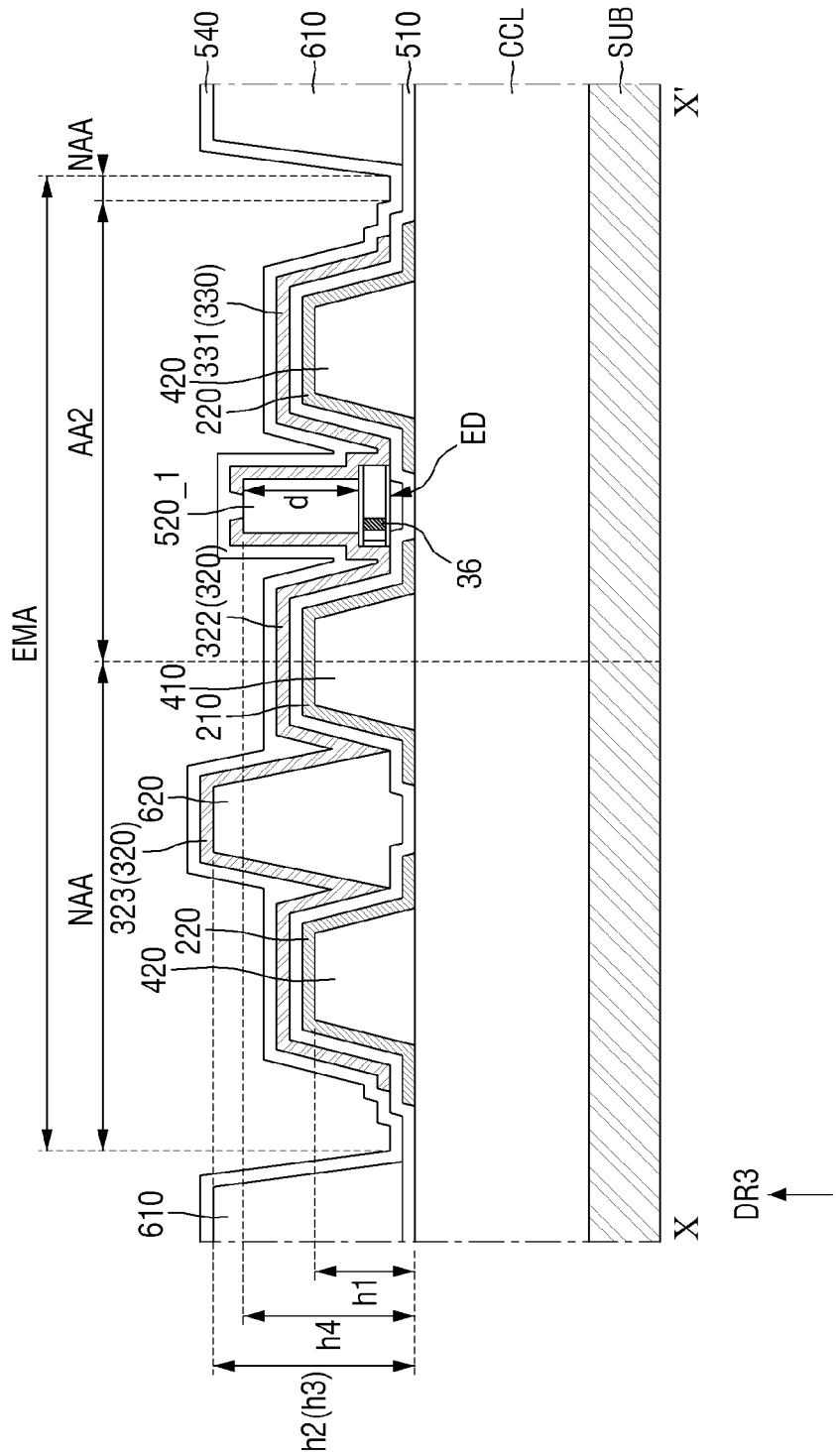
FIG. 19 is a cross-sectional view taken along the line X-X' of FIG. 3 according to another embodiment.

FIG. 19 is a cross-sectional view taken along the line X-X' of FIG. 3 according to another embodiment.

A display device 10 shown in FIG. 19 is different from the embodiment shown in FIG. 10 in that a height h4 of a second insulating layer 520_1 included in a subpixel SPX is greater than a height h1 of each second bank 410 or 420.

In the illustrated embodiment, the second insulating layer 520_1 disposed on light emitting elements ED may include an organic insulating material. For example, the second insulating layer 520_1 may include, but is not limited to, an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin.

When the second insulating layer 520_1 includes an organic insulating material, a thickness d of the second insulating layer 520_1 may be greater than the thickness d of the second insulating layer 520 (see, e.g., FIG. 10) including an inorganic insulating material in FIG. 10. Therefore, the height h4 of the second insulating layer 520_1 may be greater than the height h1 of each second bank 410 or 420 and smaller than heights h2 and h3 of a first bank 610 and each alignment control pattern 620. Although the present disclosure is not limited to this embodiment, when the second insulating layer 520_1 includes an organic insulating material, the thickness d of the second insulating layer 520_1 may be in the range of 1 μm to 2 μm.

Figure 20:
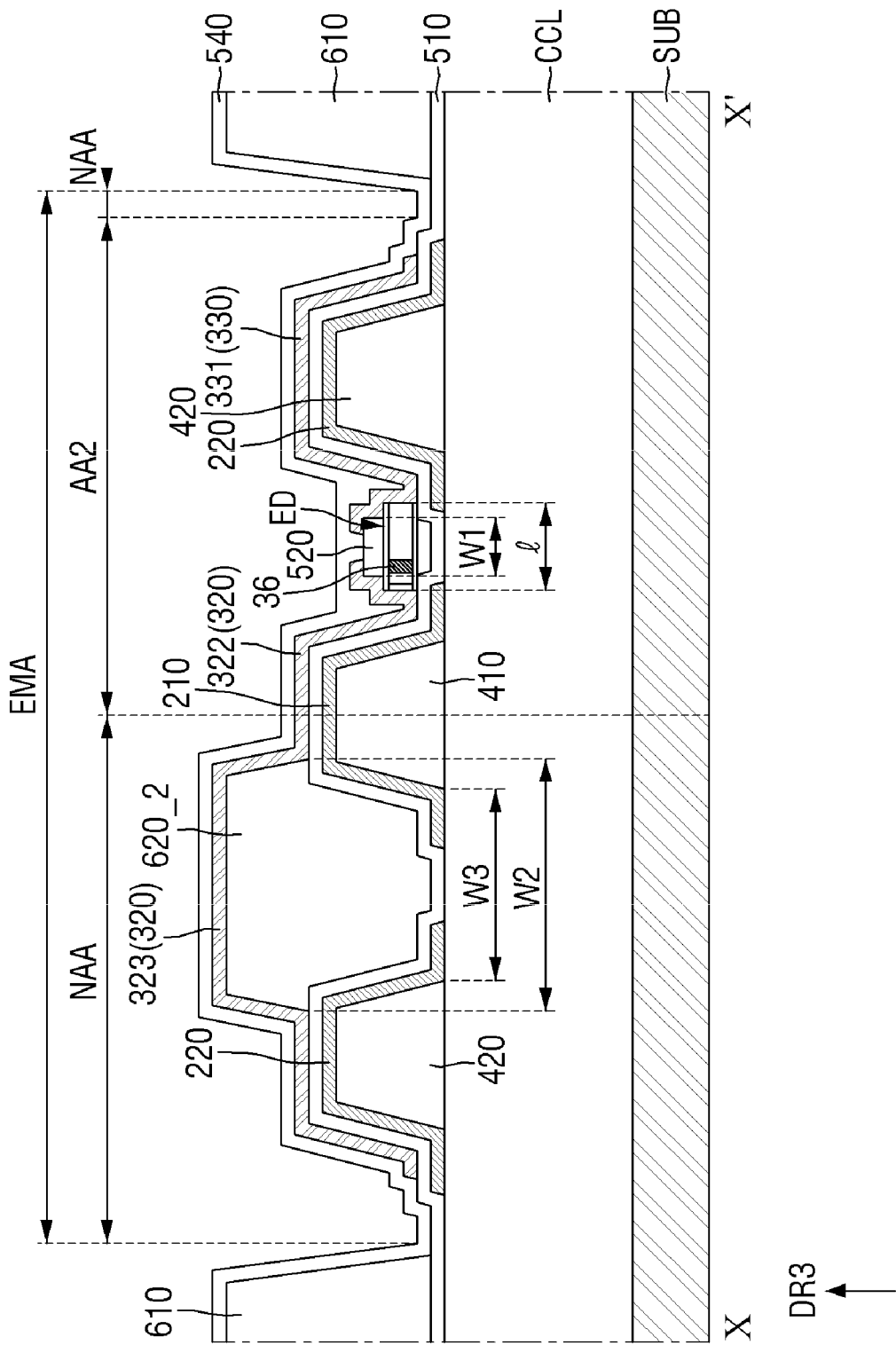
FIG. 20 is a cross-sectional view taken along the line X-X' of FIG. 3 according to another embodiment.

FIG. 20 is a cross-sectional view taken along the line X-X' of FIG. 3 according to another embodiment.

A display device 10 shown in FIG. 20, in conjunction with FIG. 3, is different from the embodiment shown in FIG. 10 in that a width W2 in a direction DR1 of each alignment control pattern 620_2 included in a subpixel SPX is greater than a gap W3 between second banks 410 and 420.

For example, the width W2 of each alignment control pattern 620_2 in the first direction DR1 may be greater than the gap W3 in the first direction DR1 between a first sub bank 410 and each second sub bank 420 disposed adjacent to each other. Because the width W2 of each alignment control pattern 620_2 is greater than the gap W3 between the first and second sub banks 410 and 420, each alignment control pattern 620_2 may completely cover side surfaces of the first and second sub banks 410 and 420 disposed in a non-alignment area NAA and may also be disposed on a part of each of upper surfaces of the first and second sub banks 410 and 420. For example, each alignment control pattern 620_2 may overlap the side surfaces and at least a part of each of the upper surfaces of the first and second sub banks 410 and 420 disposed in the non-alignment area NAA.

In the illustrated embodiment, because each alignment control pattern 620_2 is disposed not only on the side surfaces of the first and second sub banks 410 and 420 disposed in the non-alignment area NAA but also on at least a part of each of the upper surfaces of the first and second sub banks 410 and 420, steps (e.g., step height differences) of second and third contact electrodes 320 and 330 formed on the alignment control patterns 620_2 may be reduced. For example, because each alignment control pattern 620_2 is also disposed on the upper surfaces of the second banks 410 and 420, the steps of the second and third contact electrodes 320 and 330 formed on the alignment control patterns 620_2 may be reduced to a difference (h3−h1) between a height h3 of each alignment control pattern 620_2 and a height h1 of each second bank 410 or 420. Therefore, the reduced steps of third areas 323 and 333 of the second and third electrodes 320 and 330 may reduce defects in the contact electrodes and may prevent a series connection defect between first through third light emitting elements ED.

Figure 21:
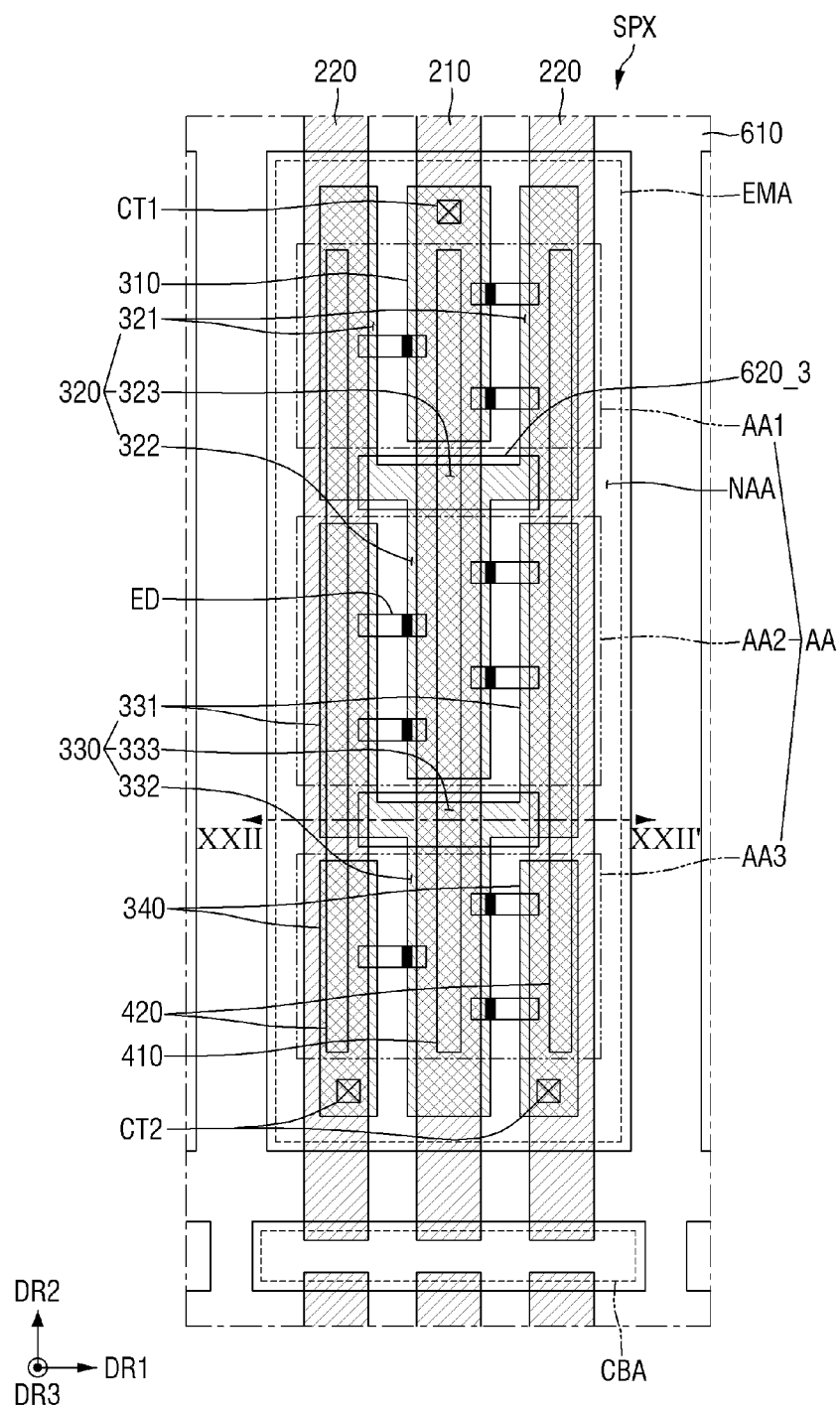
FIG. 21 is a plan layout view of a subpixel of a display device according to an embodiment.
Figure 22:
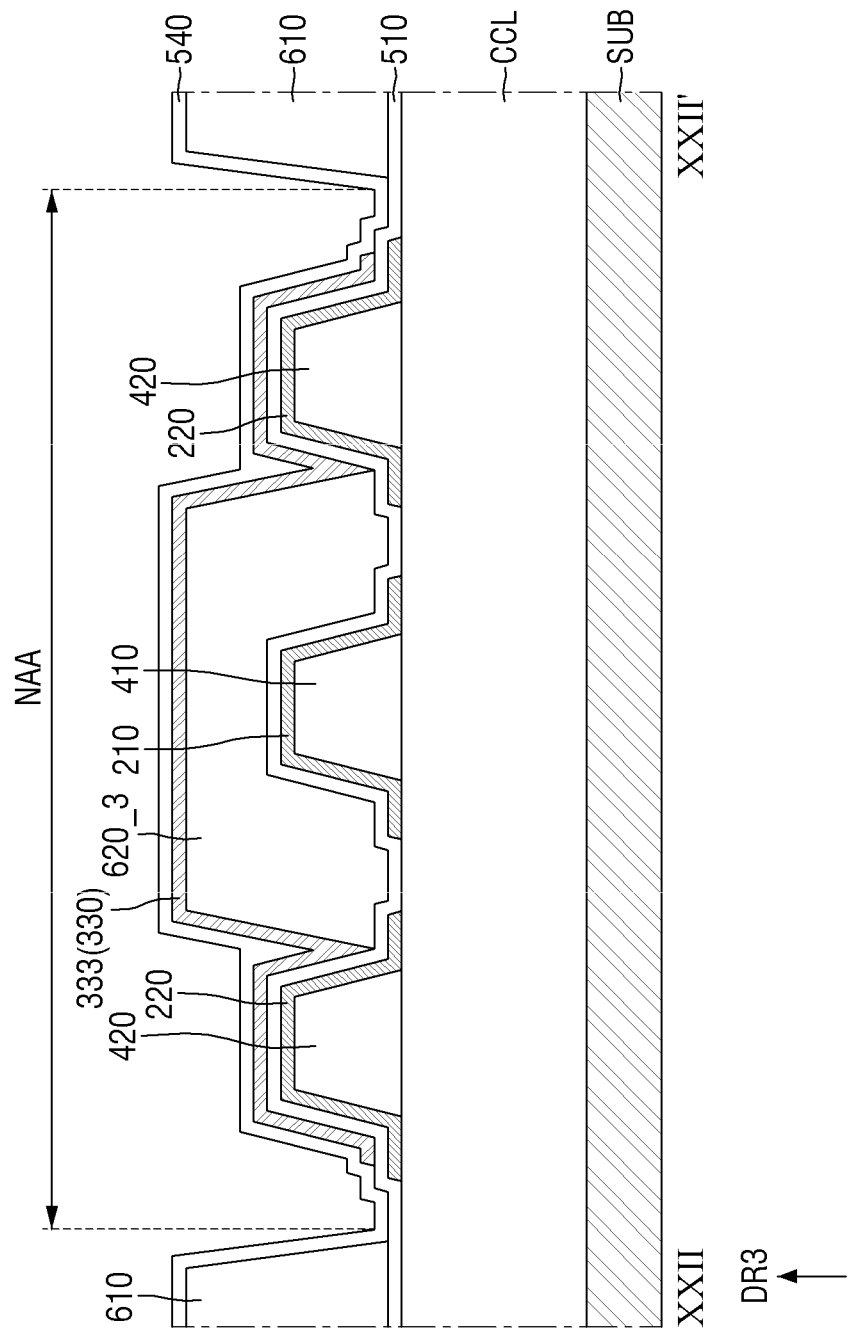
FIG. 22 is a cross-sectional view taken along the line XXII-XXII' of FIG. 21.

FIG. 21 is a plan layout view of a subpixel SPX of a display device 10 according to an embodiment. FIG. 22 is a cross-sectional view taken along the line XXII-XXII' of FIG. 21.

The display device 10 illustrated in FIGS. 21 and 22 is different from the embodiment shown in FIG. 10 in that a plurality of alignment control patterns 620_3 disposed between alignment areas AA (AA1 through AA3) of a subpixel SPX are integrated with each other in the first direction DR1 to form one alignment control pattern 620_3.

For example, the alignment control pattern 620_3 disposed between a first alignment area AA1 and a second alignment area AA2 and between the second alignment area AA2 and a third alignment area AA3 may extend in the first direction DR1. The alignment control pattern 620_3 may extend in the first direction DR1 to cover all areas between a first sub bank 410 and second sub banks 420 disposed on right and left sides of the first sub bank 410. The alignment control pattern 620_3 may completely cover both side surfaces and an upper surface of the first sub bank 410 disposed in a non-alignment area NAA. An upper surface of the alignment control pattern 620_3 may have the same height in each area. Thus, the alignment control pattern 620_3 may not have a stepped structure.

In the illustrated embodiment, because a plurality of alignment control patterns 620_3 are integrated with each other in the first direction DR1 to form one alignment control pattern 620_3 that covers the area between the first and second sub banks 410 and 420 and the first sub bank 410 in the non-alignment area NAA, the upper surface of the alignment control pattern 620_3 may lie in the same plane along the first direction DR1. Therefore, each contact electrode 320 or 330 formed on the alignment control pattern 620_3 may not have a step in an area overlapping the first sub bank 410 in the third direction DR3. Accordingly, as described above, defects in third areas 323 and 333 of second and third contact electrodes 320 and 330 may be reduced, and a series connection defect between first through third light emitting elements ED may be prevented.

Figure 23:
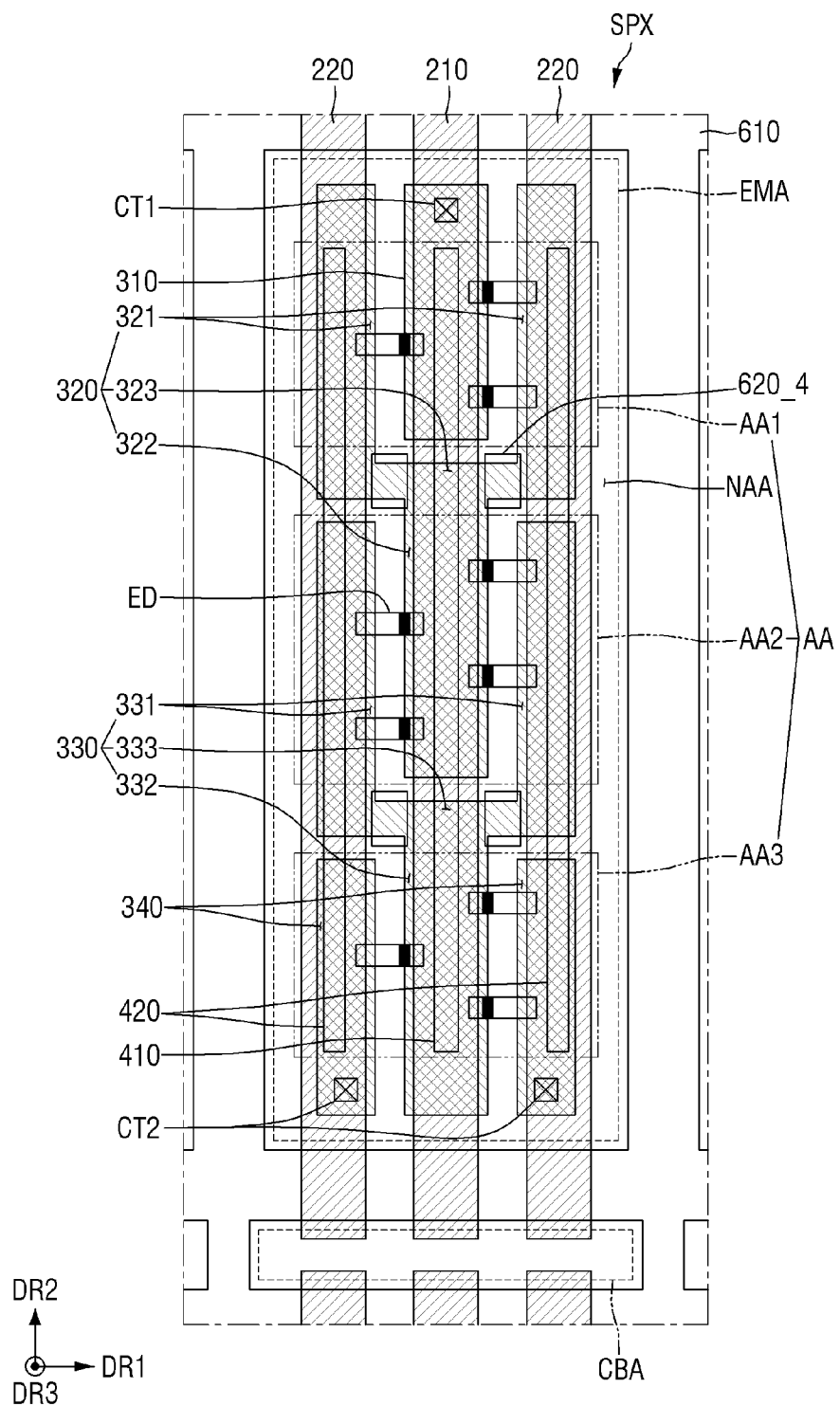
FIG. 23 is a plan layout view of a subpixel of a display device according to an embodiment.
Figure 24:
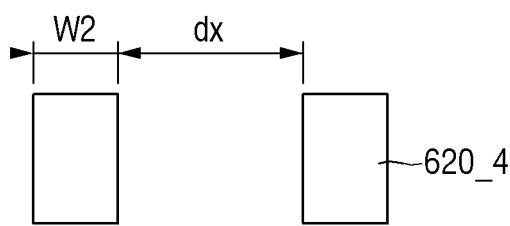
FIG. 24 is a plan view illustrating an arrangement relationship of alignment control patterns in FIG. 23.
Figure 25:
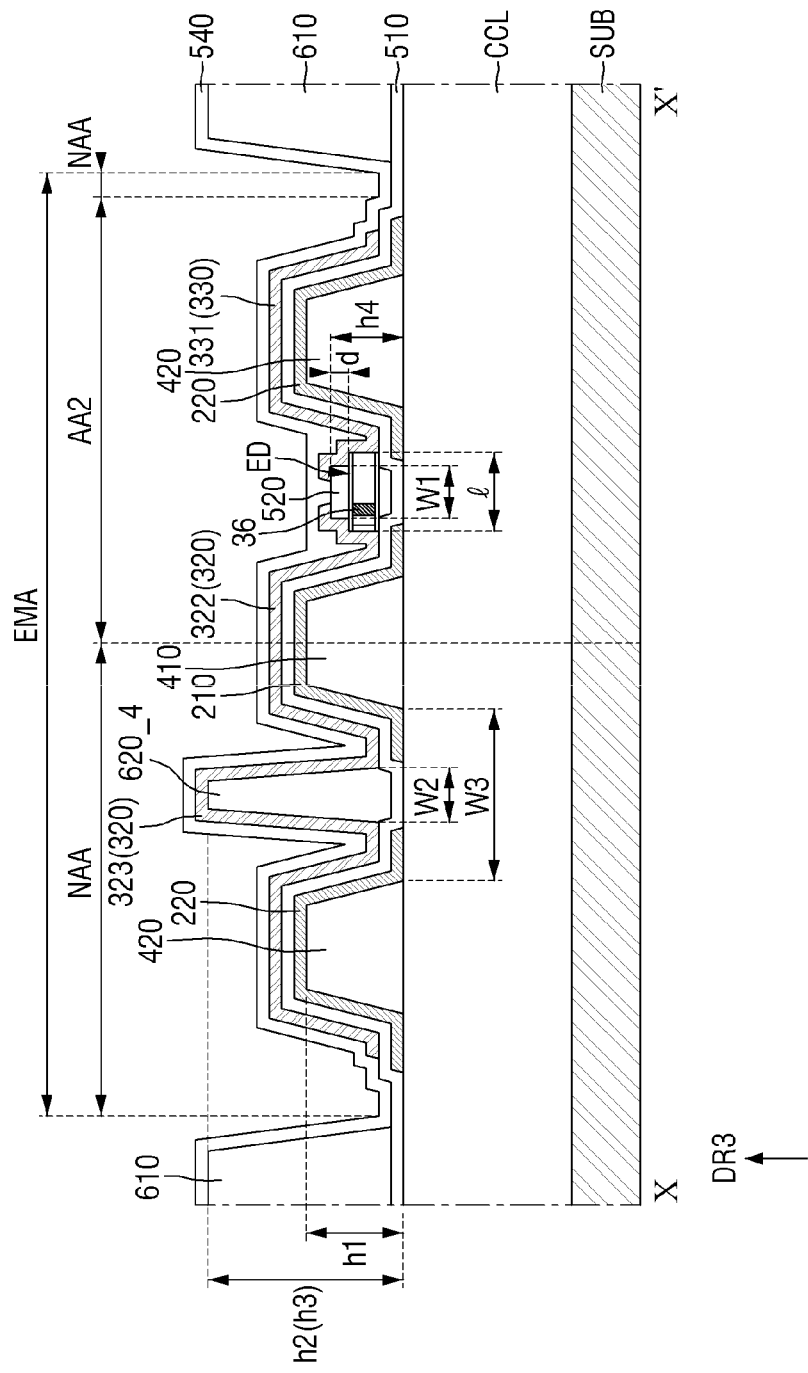
FIG. 25 is a cross-sectional view of the display device shown in FIG. 23.

FIG. 23 is a plan layout view of a subpixel SPX of a display device 10 according to an embodiment. FIG. 24 is a plan view illustrating the arrangement relationship of alignment control patterns 620_4 disposed in FIG. 23. FIG. 25 is a cross-sectional view of an example of the display device 10 shown in FIG. 23.

The display device 10 illustrated in FIGS. 23 through 25 is different from the embodiment shown in FIG. 10 in that a width W2 in a direction DR1 of each alignment control pattern 620_4 included in a subpixel SPX is smaller than a length I of each light emitting element ED.

For example, the width W2 of each alignment control pattern 620_4 in the first direction DR1 may be smaller than a gap W3 in the first direction DR1 between first and second sub banks 410 and 420 disposed adjacent to each other. The width W2 of each alignment control pattern 620_4 in the first direction DR1 may be smaller than the length I of each light emitting element ED. The width W2 of each alignment control pattern 620_4 in the first direction DR1 may be equal to a width W1 of a second insulating layer 520 disposed on the light emitting elements ED. However, the present disclosure is not limited thereto.

A gap dx in the first direction DR1 between the alignment control patterns 620_4 spaced apart from each other in the first direction DR1 may be greater than the length I of each light emitting element ED. In the illustrated embodiment, because the width W2 of each alignment control pattern 620_4 is small and the gap dx between the alignment control patterns 620_4 adjacent to each other in the first direction DR1 is greater than the length I of each light emitting element ED, the proportion of the planar area of the alignment control patterns 620_4 in the planar area of an emission area EMA in a plan view may be reduced. Accordingly, the volume (or area) of a space in which an ink I in which the light emitting elements ED are dispersed can be sprayed in an inkjet process for spraying the ink I during a manufacturing process of the display device 10 as described above may be increased. Therefore, the area that can be impacted may increase, thus making it easy to control an impact position of the ink I. Accordingly, the manufacturing process efficiency of the inkjet process during the manufacturing process of the display device 10 can be increased.

Even if the ink I in which the light emitting elements ED are dispersed is sprayed to an area excluding areas where the alignment control patterns 620_4 are disposed in the emission area EMA, the ink I may flow between the alignment control patterns 620_4 and/or between a first bank 610 and each alignment control pattern 620_4 due to the fluidity of the ink I. Therefore, even if the ink I in which the light emitting elements ED are dispersed is sprayed onto the area excluding the areas where the alignment control patterns 620_4 are disposed in the emission area EMA, first through third alignment areas AA1 through AA3 may be coated with the ink I. In addition, because the gap dx between the alignment control patterns 620_4 adjacent to each other in the first direction DR1 is greater than the length I of each light emitting element ED, the light emitting elements ED dispersed in the ink I may easily move from one alignment area AA to another alignment area AA by passing between the alignment control patterns 620_4 and/or between the first bank 610 and each alignment control pattern 620_4.

Figure 26:
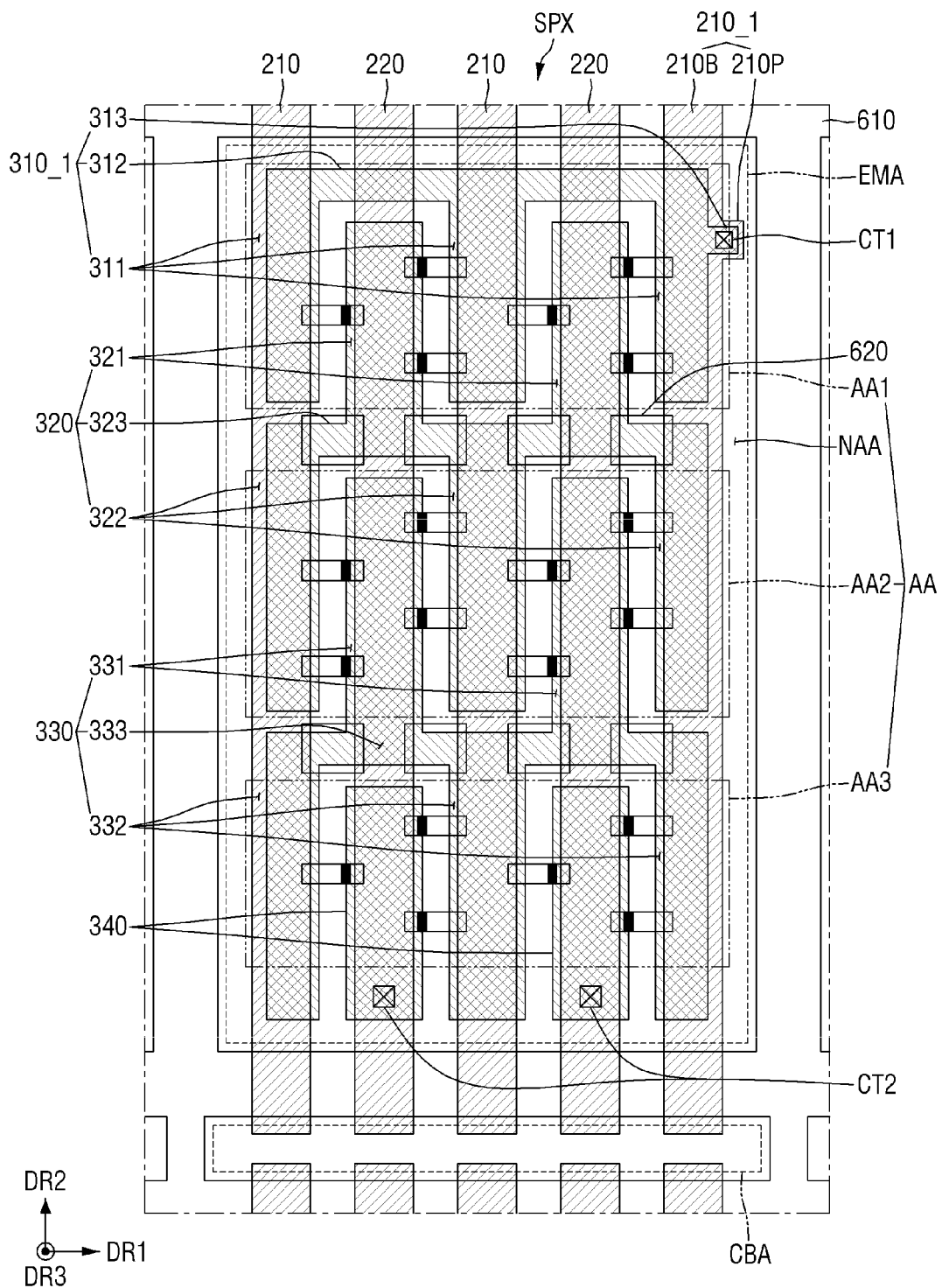
FIG. 26 is a plan layout view of a subpixel of a display device according to an embodiment.

FIG. 26 is a plan layout view of a subpixel SPX of a display device according to an embodiment.

The embodiment illustrated in FIG. 26 is different from the embodiment shown in FIG. 3 in that a plurality of first electrodes 210 spaced apart from each other in the first direction DR1 are included.

For example, three first electrodes 210 spaced apart from each other in the first direction DR1 may be included. Each second electrode 220 may be disposed between the first electrodes 210 spaced apart from each other. In the illustrated embodiment, a first electrode 210_1 disposed on a right side in an emission area EMA from among the first electrodes 210 may include an extending part 2106 and a protruding part 210P protruding from a portion of the extending part 2106. A first contact opening (e.g., a first contact hole) CT1 disposed on the right side in the emission area EMA may overlap the protruding part 210P in the third direction DR3. The protruding part 210P of the first electrode 210_1 may receive a first power supply voltage from a first voltage wiring VL1 through the first contact opening CT1.

A first contact electrode 310_1 may have first areas 311, a second area 312, and a protruding part 313.

The first areas 311 of the first contact electrode 310_1 may be disposed on the first electrodes 210 disposed in a first alignment area AA1 to contact first ends of first light emitting elements ED. The first areas 311 of the first contact electrode 310_1 may be spaced apart from each other in the first direction DR1.

The second area 312 of the first contact electrode 310_1 may connect the first areas 311 of the first contact electrode 310_1, which are spaced apart from each other. The second area 312 of the first contact electrode 310_1 may be disposed on upper sides of the first areas 311 of the first contact electrode 310_1 to extend in the first direction DR1.

The protruding part 313 of the first contact electrode 310_1 may overlap the protruding part 210P of the first electrode 210_1 in the third direction DR3. The protruding part 313 of the first contact electrode 310_1 may contact the protruding part 210P of the first electrode 210_1. Because the protruding part 313 of the first contact electrode 310_1 and the protruding part 210P of the first electrode 210_1 contact each other, the first power supply voltage applied from the first voltage wiring VL1 through the first contact opening CT1 may be transmitted to the first light emitting elements ED through the first contact electrode 310_1.

A second contact electrode 320 and a third contact electrode 330 may respectively include second areas 322 and 332 disposed on the first electrodes 210 in second and third alignment areas AA2 and AA3, and the second areas 322 and 332 may include a plurality of contact electrodes spaced apart from each other. For example, each of the second contact electrode 320 and the third contact electrode 330 may include three second areas 322 or 332 spaced apart from each other in the first direction DR1.

In the illustrated embodiment, four alignment control patterns 620 spaced apart from each other along the first direction DR1 may be disposed in a non-alignment area NAA between the alignment areas AA1 through AA3.

Those skilled in the art will appreciate that many variations and modifications can be made to the embodiments described herein without substantially departing from the present disclosure. Therefore, the disclosed embodiments of the present disclosure are to be understood in a generic and descriptive sense and not for purposes of limitation.

What is claimed is:

1. A display device comprising:
a substrate; and
a pixel on the substrate and having an alignment area, the alignment area having a first alignment area, a second alignment area spaced apart from the first alignment area in a first direction, and a non-alignment area extending around a periphery of the alignment area, the pixel comprising:
a first electrode and a second electrode extending in the first direction across the first alignment area, the non-alignment area between the first alignment area and the second alignment area, and the second alignment area and being spaced apart from each other;
a first bank in the non-alignment area and extending along a boundary of the pixel;
an alignment control layer comprising a first alignment control pattern, the first alignment control pattern being spaced apart from the first bank in the non-alignment area between the first alignment area and the second alignment area;
a first light emitting element between the first electrode and the second electrode in the first alignment area;
a first contact electrode on the first electrode in the first alignment area and contacting a first end of the first light emitting element; and
a second contact electrode extending across the first alignment area, the non-alignment area between the first alignment area and the second alignment area, and the second alignment area and being spaced apart from the first contact electrode.

2. The display device of claim 1,
wherein the second contact electrode has a first area on the second electrode in the first alignment area and contacting a second end of the first light emitting element, a second area on the first electrode in the second alignment area, and a third area in the non-alignment area to connect the first area of the second contact electrode and the second area of the second contact electrode.

3. The display device of claim 2, further comprising:
a second light emitting element between the first electrode and the second electrode in the second alignment area; and
a third contact electrode having a first area on the second electrode in the second alignment area,
wherein the third contact electrode is spaced apart from the first and second contact electrodes, the second area of the second contact electrode contacts a first end of the second light emitting element, and the first area of the third contact electrode contacts a second end of the second light emitting element.

4. The display device of claim 3, wherein the first light emitting element and the second light emitting element are connected to each other in series.

5. The display device of claim 3, further comprising:
a third light emitting element; and
a fourth contact electrode,
wherein the alignment area has a third alignment area spaced apart from the second alignment area in the first direction,
wherein the third light emitting element is between the first electrode and the second electrode in the third alignment area,
wherein the fourth contact electrode is on the second electrode in the third alignment area, and
wherein the fourth contact electrode is spaced apart from the first through third contact electrodes.

6. The display device of claim 5, wherein the third contact electrode has a second area on the first electrode in the third alignment area and a third area in the non-alignment area to connect the first area of the third contact electrode and the second area of the third contact electrode,
wherein the second area of the third contact electrode contacts a first end of the third light emitting element, and the fourth contact electrode contacts a second end of the third light emitting element.

7. The display device of claim 6, wherein the first through third light emitting elements are connected to each other in series.

8. The display device of claim 6, wherein the alignment control layer further comprises a second alignment control pattern in the non-alignment area between the second alignment area and the third alignment area, and
wherein the second alignment control pattern is spaced apart from the first bank.

9. The display device of claim 2, wherein a part of the third area of the second contact electrode overlaps the first alignment control pattern in a thickness direction of the substrate.

10. The display device of claim 1, wherein the first alignment control pattern is between the first electrode and the second electrode.

11. The display device of claim 1, wherein each of the first bank and the alignment control layer comprises a hydrophobic material.

12. The display device of claim 1, wherein the first bank and the alignment control layer comprise the same material.

13. A display device comprising:
a pixel having a plurality of alignment areas spaced apart from each other in a first direction and a non-alignment area other than the alignment areas;
a plurality of electrodes extending in the first direction in the pixel and being spaced apart from each other in a second direction perpendicular to the first direction;
a plurality of light emitting elements between the electrodes in each of the alignment areas, at least one end of each of the light emitting elements lying on any one of the electrodes in the respective one of the alignment areas;
a first bank in the non-alignment area along a boundary of the pixel; and
a plurality of alignment control patterns spaced apart from the first bank in the non-alignment area between the alignment areas,
wherein the alignment control patterns are spaced apart from each other in the second direction, and each of the alignment control patterns overlaps, in a thickness direction, an area between the electrodes and overlaps, in the thickness direction, only a portion of two adjacent ones of the electrodes in the second direction.

14. The display device of claim 13, wherein each of the first bank and the alignment control patterns comprises a hydrophobic material.

15. The display device of claim 13, further comprising an insulating layer on the light emitting elements in each of the alignment areas and exposes both ends of each of the light emitting elements,
wherein the insulating layer and the alignment control patterns are spaced apart from each other.

16. A display device comprising:
a substrate;
a pixel having an alignment area and a non-alignment area extending around a periphery of the alignment area, the alignment area having first and second alignment areas spaced apart from each other;
a first electrode on the substrate;
a second electrode on the substrate and spaced apart from the first electrode;
a first bank in the non-alignment area along a boundary of the pixel;
an alignment control pattern on the substrate and between the first electrode and the second electrode in the non-alignment area between the first alignment area and the second alignment area, the alignment control pattern being spaced apart from the first bank;
light emitting elements comprising a plurality of first light emitting elements between the first electrode and the second electrode in the first alignment area and a plurality of second light emitting elements between the first electrode and the second electrode in the second alignment area;
a first contact electrode contacting first ends of the first light emitting elements; and
a second contact electrode contacting second ends of the first light emitting elements and first ends of the second light emitting elements.

17. The display device of claim 16, wherein a height from a surface of the substrate to an upper surface of the first bank is greater than or equal to a height from the surface of the substrate to an upper surface of the alignment control pattern.

18. The display device of claim 16, wherein a width of the alignment control pattern is greater than a length of each light emitting element.

19. The display device of claim 16, further comprising
a third contact electrode contacting second ends of the second light emitting elements,
wherein the first through third contact electrodes are spaced apart from each other, and the second contact electrode connects the first light emitting elements and the second light emitting elements to each other in series.

20. The display device of claim 19, wherein the second contact electrode has a first area in the first alignment area and contacting the second ends of the first light emitting elements, a second area in the second alignment area and contacting the first ends of the second light emitting elements, and a third area in the non-alignment area between the first and second alignment areas and connecting the first area of the second contact electrode and the second area of the second contact electrode.

* * * * *